US009085751B2

(12) United States Patent
Hori et al.

(10) Patent No.: US 9,085,751 B2
(45) Date of Patent: Jul. 21, 2015

(54) LIQUID CONCENTRATE FOR CLEANING COMPOSITION, CLEANING COMPOSITION AND CLEANING METHOD

(75) Inventors: Shigeo Hori, Osaka (JP); Hiroki Nakatsukasa, Shiga (JP); Yuki Akamatsu, Shiga (JP)

(73) Assignee: KAKEN TECH CO., LTD., Osaka (JP)

( * ) Notice: Subject to any disclaimer, the term of this patent is extended or adjusted under 35 U.S.C. 154(b) by 194 days.

(21) Appl. No.: 13/805,735

(22) PCT Filed: May 31, 2011

(86) PCT No.: PCT/JP2011/062431
§ 371 (c)(1),
(2), (4) Date: Dec. 20, 2012

(87) PCT Pub. No.: WO2012/005068
PCT Pub. Date: Jan. 12, 2012

(65) Prior Publication Data

US 2013/0096044 A1 Apr. 18, 2013

(30) Foreign Application Priority Data

Jul. 9, 2010 (JP) ................................ 2010-156451

(51) Int. Cl.
*C11D 7/50* (2006.01)
*B23K 35/36* (2006.01)
*B23K 35/362* (2006.01)
(Continued)

(52) U.S. Cl.
CPC ............ *C11D 7/5013* (2013.01); *B23K 35/362* (2013.01); *B23K 35/3612* (2013.01); *C11D 7/5022* (2013.01); *C11D 7/5027* (2013.01); *C23G 5/06* (2013.01); *H05K 3/22* (2013.01); *C11D 7/24* (2013.01); *C11D 7/247* (2013.01); *C11D 7/261* (2013.01); *C11D 7/263* (2013.01); *C11D 7/264* (2013.01);
(Continued)

(58) Field of Classification Search
CPC .............................. C11D 11/0047; C11D 3/43
USPC ................................................. 510/175, 176
See application file for complete search history.

(56) References Cited

U.S. PATENT DOCUMENTS 3,954,648 A * 5/1976 Belcak et al. ................. 510/212
5,183,534 A * 2/1993 Fjare et al. ...................... 216/83
(Continued)

FOREIGN PATENT DOCUMENTS

JP 10-114899 5/1998
JP 11-170270 6/1999
(Continued)

*Primary Examiner* — Gregory Webb
(74) *Attorney, Agent, or Firm* — Fitch Even Tabin & Flannery

(57) ABSTRACT

Provided is a liquid concentrate for cleaning composition which could exhibit excellent environmental safety etc. by adding afterward a predetermined amount of water, and also has excellent regeneration efficiency, and provided are a cleaning composition and a cleaning method thereof. Disclosed is a liquid concentrate for cleaning composition which is used as a mixture with water and is intended for cleaning an object to be cleaned in a clouded state, with a predetermined amount of water having been added thereto, the liquid concentrate for cleaning composition including, a first organic solvent which is a predetermined hydrophobic glycol ether compound or the like, and a second organic solvent which is a predetermined hydrophilic amine compound.

10 Claims, 7 Drawing Sheets

(51) Int. Cl.

| | |
|---|---|
| ***C23G 5/06*** | (2006.01) |
| ***H05K 3/22*** | (2006.01) |
| *C11D 11/00* | (2006.01) |
| *C11D 7/24* | (2006.01) |
| *C11D 7/26* | (2006.01) |

(52) U.S. Cl.
CPC ... *C11D 11/0047* (2013.01); *H05K 2203/0783* (2013.01); *H05K 2203/122* (2013.01)

(56) References Cited

U.S. PATENT DOCUMENTS

| | | | | |
|---|---|---|---|---|
| 5,628,833 | A * | 5/1997 | McCormack et al. | 134/26 |
| 8,828,917 | B2 * | 9/2014 | Rieth et al. | 510/138 |
| 2004/0259753 | A1 * | 12/2004 | Wilson et al. | 510/421 |
| 2005/0003977 | A1 * | 1/2005 | Itano et al. | 510/175 |
| 2005/0054549 | A1 * | 3/2005 | Kezuka et al. | 510/407 |
| 2005/0096245 | A1 * | 5/2005 | Hei et al. | 510/383 |
| 2006/0089281 | A1 * | 4/2006 | Gibson | 510/201 |
| 2006/0223732 | A1 * | 10/2006 | Hori et al. | 510/175 |
| 2006/0234890 | A1 * | 10/2006 | Griese et al. | 510/214 |
| 2006/0293201 | A1 * | 12/2006 | Simon et al. | 510/235 |
| 2008/0010772 | A1 * | 1/2008 | Kong et al. | 15/209.1 |
| 2009/0029895 | A1 * | 1/2009 | Scialla et al. | 510/180 |
| 2011/0009309 | A1 * | 1/2011 | Mertens et al. | 510/400 |
| 2011/0094545 | A1 * | 4/2011 | Tanaka et al. | 134/104.4 |
| 2011/0245123 | A1 * | 10/2011 | Cox et al. | 510/122 |
| 2012/0149623 | A1 * | 6/2012 | Li et al. | 510/214 |

FOREIGN PATENT DOCUMENTS

| | | |
|---|---|---|
| JP | 2005-120389 | 5/2005 |
| JP | 2007-224165 | 9/2007 |
| JP | 2010-189635 | 9/2010 |

* cited by examiner

LIQUID CONCENTRATE FOR CLEANING COMPOSITION, CLEANING COMPOSITION AND CLEANING METHOD

BACKGROUND OF THE INVENTION

1. Field of the Invention

The present invention relates to a liquid concentrate for a cleaning composition, the cleaning composition and a cleaning method thereof. More particularly, the present invention relates to a liquid concentrate for a cleaning composition which could exhibit excellent environmental safety and excellent cleaning properties by adding afterward a predetermined amount of water, and also give excellent regeneration efficiency, a cleaning composition using the liquid concentrate for the cleaning composition and a cleaning method thereof.

2. Description of the Related Art

Cleaning compositions which are obtained by blending a glycol compound with water or an ester compound have been hitherto disclosed, since these cleaning compositions exhibit relatively superior environmental safety against the cleaning of flux residues, solder pastes, ink, or the like (for example, Patent Document 1).

That is, Patent Document 1 discloses a cleaning composition which includes acetoacetic acid ester and glycol diester, or any one of the ester compounds, propylene glycol monomethyl ether, and the like.

However, the cleaning composition disclosed in Patent Document 1 has a problem that the water content is relatively small, and the environmental safety is insufficient.

Furthermore, there is no intention of making it possible to enhance the cleaning properties effectively, even in the case where a relatively large water content is employed, by bringing the cleaning composition to a clouded state (emulsion state).

Not only that, there is also a problem that when it is attempted to regenerate a cleaning composition that has been used, by fractional distillation, the ester compound which is an essential component undergoes hydrolysis, and a decrease occurs in the cleaning properties of the cleaning composition after regeneration, so that it is difficult to stably obtain a cleaning composition having sufficiently cleaning properties.

Thus, there has been disclosed a cleaning composition in a clouded state, which has a relatively large water content and does not include an ester compound as an essential component (see, for example, Patent Document 2).

That is, a cleaning composition in a clouded state at room temperature (25° C.) has been disclosed, which is characterized in that the amount of addition of benzyl alcohol is adjusted to a value in the range of 5% to 94% by weight, the amount of addition of an amine compound to a value in the range of 1% to 50% by weight, and the amount of addition of water to a value in the range of 3% to 90% by weight.

[Patent Document 1] JP2005-120389A (claims)

[Patent Document 2] JP2007-224165A (claims)

SUMMARY OF THE INVENTION

However, since the cleaning composition disclosed in Patent Document 2 includes benzyl alcohol, which has a relatively high boiling point (boiling point: 205° C.), as an essential component, when the cleaning composition that has been used is regenerated by fractional distillation, there is a problem that the regeneration efficiency is likely to decrease, because an excessively large amount of energy may be needed, high-boiling point components may not be distilled out at the time of regeneration (recovery or recycle), the recovery rate of the cleaning composition may decrease, or a cleaning composition having a predetermined composition may not be obtained.

Furthermore, when the cleaning composition that has been used is regenerated by fractional distillation, there are problems that as the heating temperature is increased, the constituent components of the cleaning composition are likely to undergo decomposition or the like, a decrease occurs in the cleaning properties of the cleaning composition after regeneration, and it is difficult to stably obtain a cleaning composition having sufficient cleaning properties.

Moreover, since the cleaning composition has a high boiling point, there are also problems that the cleaning composition has very poor drying-ability, drying as a single liquid without a rinsing composition is difficult, and a process of rinsing the cleaning composition with a solvent having excellent drying-ability is required.

Thus, the inventors of the present invention conducted a thorough investigation, and as a result, the inventors have found that when a liquid concentrate for a cleaning composition including a predetermined hydrophobic organic solvent and a predetermined hydrophilic organic solvent is prepared, while the mixing proportions of these organic solvents are adjusted to predetermined ranges, and in which an organic solvent having a boiling point higher than or equal to a predetermined value is not included, or even if included, only in an amount less than or equal to a predetermined range, a cleaning composition in a clouded state which could exhibit excellent environmental safety and excellent cleaning properties, and also have excellent regeneration efficiency, may be obtained by adding afterward a predetermined amount of water thereto. Thus, the inventors have accomplished the present invention.

That is, an object of the present invention is to provide a liquid concentrate for a cleaning composition which could exhibit excellent environmental safety and excellent cleaning properties in the cleaning of flux residues, solder pastes, and the like by adding afterward a predetermined amount of water, and also have excellent regeneration efficiency, a cleaning composition obtained by using the liquid concentrate for the cleaning composition and a cleaning method.

According to an aspect of the present invention, there is provided a liquid concentrate for a cleaning composition which is used as a mixture with water and is intended to clean an object to be cleaned while the liquid concentrate for the cleaning composition is in a clouded state with a predetermined amount of water having been added thereto, the liquid concentrate for the cleaning composition including a first organic solvent and a second organic solvent as organic solvents, in which the first organic solvent is at least one compound selected from the group consisting of a hydrophobic glycol ether compound, a hydrophobic hydrocarbon compound, a hydrophobic aromatic compound, a hydrophobic ketone compound and a hydrophobic alcohol compound, which has a boiling point in the range of 140° C. to 190° C. and a solubility in water (measurement temperature: 20° C.) of 50% by weight or less; the second organic solvent is a hydrophilic amine compound having a boiling point in the range of 140° C. to 190° C. and a solubility in water (measurement temperature: 20° C.) of greater than (above) 50% by weight; the amount of incorporation of the second organic solvent is adjusted to a value in the range of 0.3 parts to 30 parts by weight relative to 100 parts by weight of the first organic solvent; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent. Thus, the problems described above could be solved.

That is, by using a predetermined hydrophobic organic solvent and a predetermined hydrophilic organic solvent, and also by adjusting the mixing proportions of these organic solvents to predetermined ranges, a cleaning composition which is a uniform solution before a predetermined amount of water is added afterward, but is in a clouded state once a predetermined amount of water has been added afterward, could be obtained.

Thereby, the cleaning properties originating from the organic solvents themselves in the cleaning composition, and the clouded state of the cleaning composition exhibit a synergistic effect, so that even if a predetermined amount of water is added afterward, excellent cleaning properties could be obtained.

Furthermore, since a relatively large amount of water is added afterward, excellent environmental safety could be obtained. Also, since organic solvents having boiling points in a predetermined range are selected to be incorporated into the liquid concentrate for a cleaning composition, and even if an organic solvent having a boiling point that is higher than or equal to a predetermined value is included, since the amount of incorporation of the organic solvent is adjusted to a value less than or equal to a predetermined range, the regeneration efficiency could be effectively enhanced, and satisfactory drying-ability could also be obtained.

Furthermore, with regard to the constitution of the liquid concentrate for the cleaning composition of the present invention, it is preferable that the solubility parameter (SP) value of the first organic solvent be adjusted to a value in the range of 6.5 to 12, while the SP value of the second organic solvent be adjusted to a value in the range of 8 to 15.

By adopting such a constitution, the cleaning properties obtainable when the liquid concentrate for the cleaning composition is prepared into a cleaning composition, could be further enhanced, and also, the liquid characteristics of the liquid concentrate for the cleaning composition in which the liquid concentrate is a uniform solution before a predetermined amount of water is added afterward, but is brought to a clouded state once a predetermined amount of water is added afterward, could be obtained more stably.

Furthermore, with regard to the constitution of the liquid concentrate for the cleaning composition of the present invention, it is preferable that the first organic solvent would be at least one compound selected from the group consisting of propylene glycol monobutyl ether, dipropylene glycol dimethyl ether, n-hexanol, n-heptanol, n-nonane, n-decane, 1-decene, isononane, isodecane, isoundecane, isododecane, cymene, and anisole.

By adopting such a constitution, when the liquid concentrate for the cleaning composition is prepared into a cleaning composition, the first organic solvent forms a more stable emulsion, and a clouded state could be obtained. Also, the cleaning properties obtainable when a cleaning composition is prepared therefrom could be further enhanced, and also, the regeneration efficiency of the cleaning composition that has been used could be further increased.

Furthermore, with regard to the constitution of the liquid concentrate for the cleaning composition of the present invention, it is preferable that the second organic solvent would be at least one compound selected from the group consisting of N,N-diethylisopropanolamine, N-ethylethanolamine, N-methylethanolamine, benzylamine, and monoisopropanolamine.

By adopting such a constitution, when the liquid concentrate for the cleaning composition is prepared into a cleaning composition, the dispersibility in water of the first organic solvent that has formed an emulsion could be further enhanced.

Furthermore, with regard to the constitution of the liquid concentrate for the cleaning composition of the present invention, it is preferable that the liquid concentrate for the cleaning composition include, as a third organic solvent, at least one compound selected from the group consisting of a hydrophilic glycol ether compound, a hydrophilic alcohol compound, a hydrophilic nitrogen-containing compound, and a hydrophilic sulfur-containing compound, which has a boiling point in the range of 140° C. to 190° C. and a solubility in water (measurement temperature: 20° C.) of greater than 50% by weight, and that the amount of incorporation of the third organic solvent would be adjusted to a value in the range of 1 part to 150 parts by weight relative to 100 parts by weight of the first organic solvent.

By adopting such a constitution, when the liquid concentrate for the cleaning composition is prepared into a cleaning composition, the dispersibility in water of the first organic solvent that has formed an emulsion could be further enhanced.

Also, with regard to the constitution of the liquid concentrate for the cleaning composition of the present invention, it is preferable that the liquid concentrate for the cleaning composition include, as a fourth organic solvent, a hydrophobic amine compound having a boiling point in the range of 140° C. to 190° C. and a solubility in water (measurement temperature: 20° C.) of 50% by weight or less, and that the amount of incorporation of the fourth organic solvent would be adjusted to a value in the range of 0.3 parts to 30 parts by weight relative to 100 parts by weight of the first organic solvent.

By adopting such a constitution, the fourth organic solvent complements the first organic solvent, and the liquid characteristics of the liquid concentrate for the cleaning composition of being brought to a clouded state when a predetermined amount of water is added afterward, could be obtained more stably.

According to an another aspect of the present invention, there is provided a cleaning composition which includes 50 parts to 1900 parts by weight of water relative to 100 parts by weight of a liquid concentrate for a cleaning composition, and is intended to clean an object to be cleaned while the cleaning composition is in a clouded state, the liquid concentrate for the cleaning composition including a first organic solvent and a second organic solvent as organic solvents, in which the first organic solvent is at least one compound selected from the group consisting of a hydrophobic glycol ether compound, a hydrophobic hydrocarbon compound, a hydrophobic aromatic compound, a hydrophobic ketone compound, and a hydrophobic alcohol compound, which has a boiling point in the range of 140° C. to 190° C. and a solubility in water (measurement temperature: 20° C.) of 50% by weight or less; the second organic solvent is a hydrophilic amine compound having a boiling point in the range of 140° C. to 190° C. and a solubility in water (measurement temperature: 20° C.) of greater than 50% by weight; the amount of incorporation of the second organic solvent is adjusted to a value in the range of 0.3 parts to 30 parts by weight relative to 100 parts by weight of the first organic solvent; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent.

That is, since the cleaning composition is a cleaning composition in a clouded state which is obtained by adding a predetermined amount of water to a predetermined liquid concentrate for the cleaning composition, the cleaning composition could exhibit excellent environmental safety and excellent cleaning properties. Also, excellent regeneration efficiency could be obtained, and satisfactory drying-ability could also be obtained.

Furthermore, according to a still another aspect of the present invention, there is provided a cleaning method including a step for mixing 100 parts by weight of a liquid concentrate for a cleaning composition with 50 parts to 1900 parts by weight of water, and a step for cleaning an object to be cleaned with the mixture in a clouded state, the liquid concentrate for the cleaning composition including a first organic solvent and a second organic solvent as organic solvents, in which the first organic solvent is at least one compound selected from the group consisting of a hydrophobic glycol ether compound, a hydrophobic hydrocarbon compound, a hydrophobic aromatic compound, a hydrophobic ketone compound, and a hydrophobic alcohol compound, which has a boiling point in the range of 140° C. to 190° C. and a solubility in water (measurement temperature: 20° C.) of 50% by weight or less; the second organic solvent is a hydrophilic amine compound having a boiling point in the range of 140° C. to 190° C. and a solubility in water (measurement temperature: 20° C.) of greater than 50% by weight; the amount of incorporation of the second organic solvent is adjusted to a value in the range of 0.3 parts to 30 parts by weight relative to 100 parts by weight of the first organic solvent; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent.

That is, since the cleaning method is a cleaning method of using a cleaning composition which is in a clouded state formed by adding a predetermined amount of water to a predetermined liquid concentrate for a cleaning composition, excellent environment safety and excellent cleaning properties could be exhibited. Furthermore, excellent regeneration efficiency could be obtained, and satisfactory drying-ability could also be obtained.

DETAILED DESCRIPTION OF EMBODIMENTS

First Embodiment

Figure 1:
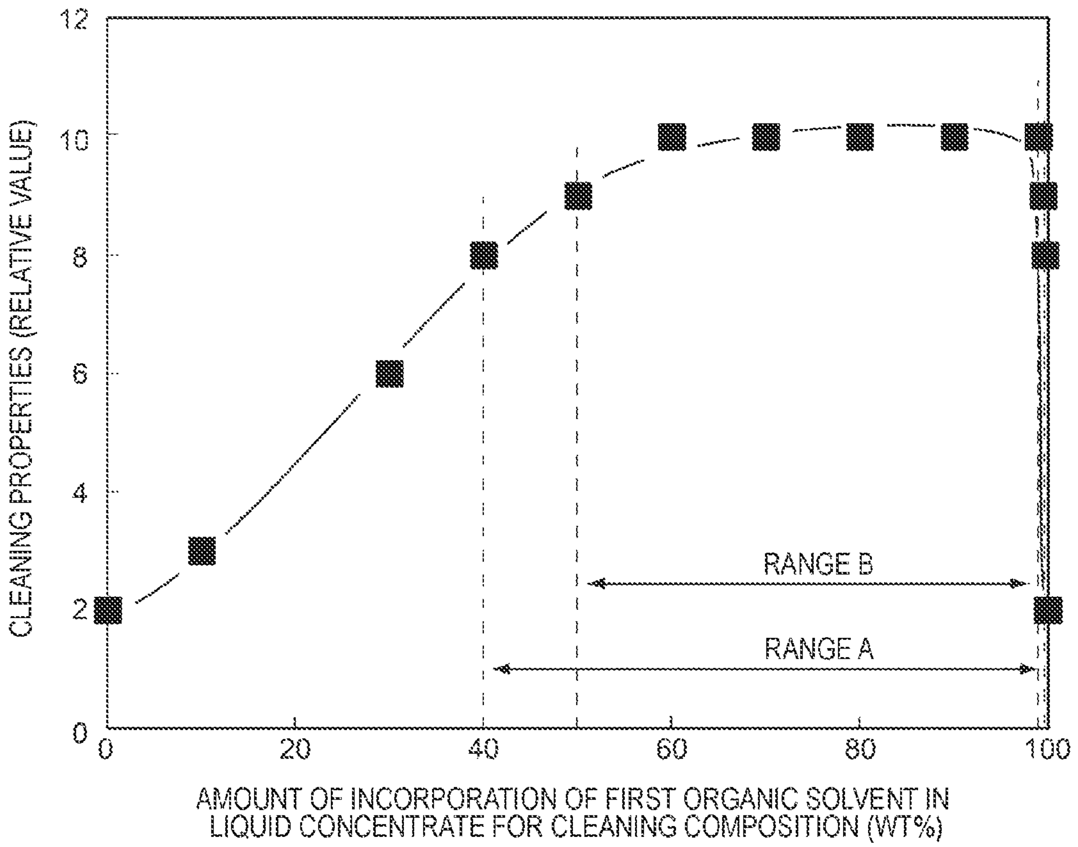
FIG. 1 is a diagram illustrating the relationship between the amount of incorporation of the first organic solvent and cleaning properties.

According to a first embodiment, there is provided a liquid concentrate for a cleaning composition which is used as a mixture with water and is also intended to clean an object to be cleaned while the liquid concentrate for the cleaning composition is in a clouded state with a predetermined amount of water having been added thereto, the liquid concentrate for the cleaning composition including a first organic solvent and a second organic solvent as organic solvents, in which the first organic solvent is at least one compound selected from the group consisting of a hydrophobic glycol ether compound, a hydrophobic hydrocarbon compound, a hydrophobic aromatic compound, a hydrophobic ketone compound, and a hydrophobic alcohol compound, which has a boiling point in the range of 140° C. to 190° C. and a solubility in water (measurement temperature: 20° C.) of 50% by weight or less; the second organic solvent is a hydrophilic amine compound having a boiling point in the range of 140° C. to 190° C. and a solubility in water (measurement temperature: 20° C.) of greater than 50% by weight; the amount of incorporation of the second organic solvent is adjusted to a value in the range of 0.3 parts to 30 parts by weight relative to 100 parts by weight of the first organic solvent; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent.

1. Liquid Characteristics

The liquid concentrate for the cleaning composition according to the first embodiment is a liquid concentrate for a cleaning composition for cleaning an object to be cleaned, by forming a cleaning composition in a clouded state when water is added thereto afterward.

That is, the liquid concentrate for the cleaning composition of the present invention is a liquid concentrate for a cleaning composition which is a uniform solution before a predetermined amount of water is added afterward, while forms a cleaning composition in a clouded state when a predetermined amount of water is added afterward, and which could exhibit excellent cleaning properties.

Such liquid characteristics may be obtained when the liquid concentrate for the cleaning composition includes a predetermined hydrophobic organic solvent as a first organic solvent and a predetermined hydrophilic organic solvent as a second organic solvent, at predetermined mixing proportions.

More specifically, the first organic solvent and the second organic solvent are such that when in a waterless state, the organic solvents become compatible with each other and form a uniform solution, but when water is incorporated, the first organic solvent does not compatibilize with water and forms an emulsion, while the second organic solvent mediates between water and the first organic solvent that is in such an emulsion state, and enhances the dispersibility of the emulsion, so as to contribute to stable constitution of a cleaning composition in a clouded state.

Thereby, the cleaning properties attributable to the first and second organic solvents themselves and the clouded state exhibit a synergistic effect, and even when a cleaning composition is formed by adding a predetermined amount of water is added afterward to the liquid concentrate for the cleaning composition, excellent cleaning properties could be obtained.

Furthermore, since the liquid concentrate for a cleaning composition of the present invention allows afterward addition of a relatively large amount of water thereto, excellent environment safety could be obtained.

More specifically, since water could be incorporated in an amount of 60% by weight or greater relative to the total amount of the cleaning composition, the liquid concentrate for a cleaning composition could be readily excluded from the range of dangerous materials in the Fire Services Act.

Also, since organic solvents having boiling points in a predetermined range are selected to be incorporated into the liquid concentrate for a cleaning composition, and even if an organic solvent having a boiling point that is higher than or equal to a predetermined value has been incorporated, since the amount of incorporation is adjusted to a value less than or equal to a predetermined range, excellent regeneration efficiency could be exhibited.

That is, when the cleaning composition that has been used is regenerated by distillation, the energy required therefor is suppressed, and the regeneration efficiency could be effectively enhanced.

Furthermore, since the heating temperature employed when the cleaning composition that has been used is distilled could be lowered, the constituent components of the cleaning composition are prevented from being decomposed, and the regeneration efficiency could be further enhanced.

Also, since organic solvents having boiling points in a predetermined range are selected to be incorporated into the liquid concentrate for a cleaning composition, and even if an organic solvent having a boiling point that is higher than or equal to a predetermined value has been incorporated, since the amount of incorporation is adjusted to a value less than or equal to a predetermined range, drying-ability as a single liquid without a rinsing composition is excellent, and it is possible to skip a process of rinsing the cleaning composition with another solvent.

Moreover, when the liquid concentrate for a cleaning composition of the present invention is used, a cleaning composition having the cleaning properties easily adjusted in accordance with the contamination state of an object to be cleaned, could be obtained as the user changes the mixing proportions of the liquid concentrate for the cleaning composition and water.

2. First Organic Solvent

The first organic solvent that constitutes the liquid concentrate for a cleaning composition of the present invention is at least one compound selected from the group consisting of a hydrophobic glycol ether compound, a hydrophobic hydrocarbon compound, a hydrophobic aromatic compound, a hydrophobic ketone compound, and a hydrophobic alcohol compound, which has a boiling point in the range of 140° C. to 190° C. and a solubility in water (measurement temperature: 20° C.) of 50% by weight or less.

The first organic solvent such as described above forms an emulsion when water is added afterward to the liquid concentrate for a cleaning composition to obtain a cleaning composition, and contributes to an effect of bringing the cleaning composition to a clouded state, together with the effect of the second organic solvent that will be described below.

Furthermore, since the first organic solvent is not likely to be subjected to a decrease in the cleaning properties under the influence of water, even when water is added afterward, the excellent cleaning properties originally possessed by the first organic solvent could be effectively exhibited.

Therefore, the excellent cleaning properties originally possessed by the first organic solvent and the clouded state exhibit a synergistic effect, so that even when a predetermined amount of water is added afterward to obtain a cleaning composition, excellent cleaning properties could be obtained.

Furthermore, since the boiling point is a value in a predetermined range, when the cleaning composition that has been used is regenerated by distillation, the regeneration efficiency could be effectively enhanced, and satisfactory drying-ability could also be obtained.

(1) Type (Kind)

It is noted that the first organic solvent is at least one compound selected from the group consisting of a hydrophobic glycol ether compound, a hydrophobic hydrocarbon compound, a hydrophobic aromatic compound, a hydrophobic ketone compound, and a hydrophobic alcohol compound.

More specifically, among the examples of the first organic solvent, examples of the hydrophobic glycol ether compound include propylene glycol monobutyl ether (boiling point: 171° C., solubility in water: 6.4% by weight, SP value: 9.0, flash point: 62° C.) and dipropylene glycol dimethyl ether (boiling point: 171° C., solubility in water: 37% by weight, SP value: 8.2, flash point: 65° C.).

Furthermore, among the examples of the first organic solvent, examples of the hydrophobic hydrocarbon compound include myrcene (boiling point: 167° C., solubility in water: 1% by weight or less, SP value: 7.7, flash point: 54° C.), menthane (boiling point: 170° C., solubility in water: 1% by weight or less, SP value: 7.2, flash point: 63° C.), n-nonane (boiling point: 150° C., solubility in water: 1% by weight or less, SP value: 7.7, flash point: 31° C.), n-decane (boiling point: 170° C., solubility in water: 1% by weight or less, SP value: 7.7, flash point: 53° C.), 1-decene (boiling point: 172° C., solubility in water: 1% by weight or less, SP value: 7.8, flash point: 46° C.), limonene (boiling point: 175° C., solubility in water: 1% by weight or less, SP value: 7.8, flash point: 48° C.), isononane (boiling point: 140° C. to 190° C., solubility in water: 50% by weight or less), isodecane (boiling point: 140° C. to 190° C., solubility in water: 50% by weight or less), isoundecane (boiling point: 140° C. to 190° C., solubility in water: 50% by weight or less), isododecane (boiling point: 140° C. to 190° C., solubility in water: 50% by weight or less), 2,2,4,6,6-pentamethylheptane (one of the isomers of isododecane) (boiling point: 177° C., solubility in water: 1% by weight or less, SP value: 7.4, flash point: 48° C.), and terpinene (boiling point: 180° C., solubility in water: 1% by weight or less, SP value: 8.0, flash point: 71° C.).

Meanwhile, with regard to isononane, isodecane, isoundecane, and isododecane, the boiling points and solubilities in water are described in a relatively large value range (boiling point: 140° C. to 190° C., solubility in water: 50% by weight or less). This is because these compounds respectively have a plural number of isomers.

Therefore, regarding isononane, isodecane, isoundecane, and isododecane, the isomers that could be used as the first organic solvent of the present invention are limited, among the plural numbers of isomers for the respective compounds, to those isomers having a boiling point in the range of 140° C. to 190° C. and a solubility in water of 50% by weight or less.

In other words, even in the case of isononane, isodecane, isoundecane, and isododecane, those isomers having a boiling point or solubility in water other than the values in the ranges described above, are not included in the candidates for the first organic solvent of the present invention.

Furthermore, regarding the hydrophobic hydrocarbon compound as the first organic solvent, it is also preferable to use a mixture of isoparaffin-based hydrocarbons having 9 to 12 carbon atoms.

That is, it is preferable to use a mixture including at least two or more kinds selected from the group consisting of isononane, isodecane, isoundecane, and isododecane mentioned above.

More specifically, it is preferable to use Isopar G (boiling point range: 167° C. to 176° C., solubility in water: 1% by weight or less, SP value: 7.3, flash point: 44° C.) manufactured by Exxon Mobil Corp., or Isopar H (boiling point range: 179° C. to 188° C., solubility in water: 1% by weight or less, SP value: 7.3, flash point: 54° C.) manufactured by Exxon Mobil Corp.

Furthermore, among the examples of the first organic solvent, examples of the hydrophobic aromatic compound include anisole (boiling point: 152° C., solubility in water: 1% by weight or less, SP value: 9.3, flash point: 52° C.), furfural (boiling point: 162° C., solubility in water: 1% by weight or less, SP value: 10.2, flash point: 62° C.), α-methylstyrene (boiling point: 164° C., solubility in water: 1% by weight or less, SP value: 8.8, flash point: 54° C.), pseudocumene (boiling point: 169° C., solubility in water: 1% by weight or less, SP value: 9.0, flash point: 50° C.), phenethol (boiling point: 170° C., solubility in water: 1% by weight or less, SP value: 9.0, flash point: 63° C.), cymene (boiling point: 177° C., solubility in water: 1% by weight or less, SP value: 8.7, flash point: 47° C.), indene (boiling point: 182° C., solubility in water: 1% by weight or less, SP value: 6.8, flash point: 78° C.), ethyl benzyl ether (boiling point: 186° C., solubility in water: 1% by weight or less, SP value: 8.9, flash point: 51° C.), p-cresyl methyl ether (boiling point: 186° C., solubility in water: 1% by weight or less, SP value: 9.1, flash point: 51° C.), thioanisole (boiling point: 188° C., solubility in water: 1% by weight or less, SP value: 8.8, flash point: 72° C.), and dimethylaniline (boiling point: 188° C., solubility in water: 1% by weight or less, SP value: 9.9, flash point: 63° C.).

Furthermore, among the examples of the first organic solvent, examples of the hydrophobic ketone compound include acetylacetone (boiling point: 140° C., solubility in water: 12.5% by weight, SP value: 11.2, flash point: 40° C.), di-n-propyl ketone (boiling point: 144° C., solubility in water: 1% by weight or less, SP value: 8.2, flash point: 49° C.), ethyl n-butyl ketone (boiling point: 147° C., solubility in water: 1% by weight or less, SP value: 8.2, flash point: 46° C.), methyl n-amyl ketone (boiling point: 151° C., solubility in water: 1% by weight or less, SP value: 8.4, flash point: 41° C.), cyclohexanone (boiling point: 156° C., solubility in water: 8.7% by weight, SP value: 9.5, flash point: 44° C.), diisobutyl ketone (boiling point: 163° C., solubility in water: 1% by weight or less, SP value: 7.8, flash point: 49° C.), methylcyclohexanone (boiling point: 170° C., solubility in water: 1% by weight or less, SP value: 9.1, flash point: 48° C.), and methyl n-hexyl ketone (boiling point: 173° C., solubility in water: 1% by weight or less, SP value: 8.3, flash point: 55° C.).

Also, among the examples of the first organic solvent, examples of the hydrophobic alcohol compound include 2-ethylbutanol (boiling point: 147° C., solubility in water: 1% by weight or less, SP value: 10.1, flash point: 58° C.), 3,5-dimethyl-1-hexyn-3-ol (boiling point: 150° C., solubility in water: 1.1% by weight, SP value: 9.8, flash point: 42° C.), 3-heptanol (boiling point: 156° C., solubility in water: 1% by weight or less, SP value: 9.7, flash point: 54° C.), n-hexanol (boiling point: 157° C., solubility in water: 1% by weight or less, SP value: 10.1, flash point: 63° C.), 2-heptanol (boiling point: 160° C., solubility in water: 1% by weight or less, SP value: 9.7, flash point: 71° C.), cyclohexanol (boiling point: 161° C., solubility in water: 4% by weight, SP value: 11.2, flash point: 68° C.), n-heptanol (boiling point: 175° C., solubility in water: 1% by weight or less, SP value: 9.8, flash point: 70° C.), 2-octanol (boiling point: 178° C., solubility in water: 1% by weight or less, SP value: 9.5, flash point: 71° C.), and 2-ethylhexanol (boiling point: 185° C., solubility in water: 1% by weight or less, SP value: 9.6, flash point: 73° C.).

Furthermore, among the examples of the first organic solvent described above, it is particularly preferable to use at least one compound selected from the group consisting of propylene glycol monobutyl ether, dipropylene glycol dimethyl ether, n-hexanol, n-heptanol, n-nonane, n-decane, 1-decene, isononane, isodecane, isoundecane, isododecane, cymene, and anisole.

This is because, if a first organic solvent of such a kind is used, when the liquid concentrate for a cleaning composition is prepared into a cleaning composition, the first organic solvent forms a more stable emulsion, and thereby a clouded state could be obtained. Also, the cleaning properties obtainable when the liquid concentrate is prepared into a cleaning composition could be further enhanced, and also, the regeneration efficiency of the cleaning composition that has been used could be further enhanced.

(2) Boiling Point

It is noted that the boiling point of the first organic solvent is defined to be a value in the range of 140° C. to 190° C.

This is because, if the boiling point has a value lower than 140° C., a large amount of the solvent is volatilized at the time of use, a large amount of liquid is consumed, and therefore, the economic efficiency becomes poor. On the other hand, if such boiling point has a value higher than 190° C., when the cleaning composition that has been used is regenerated by distillation, an excessively large amount of energy may be required, or high boiling point components are not distilled out at the time of regeneration. Also, the regeneration efficiency may become likely to decrease, as the recovery ratio of the cleaning composition decreases, or a cleaning composition having a predetermined composition may not be obtained. Furthermore, it is because since the heating temperature at which the cleaning composition that has been used is distilled increases, the constituent components of the cleaning composition are likely to be decomposed, the cleaning properties of the cleaning composition obtainable after regeneration are decreased, and it is difficult to stably obtain a cleaning composition having sufficient cleaning properties. It is also because drying-ability becomes poor, and the first organic solvent is likely to remain behind on the object to be cleaned, due to poor drying.

Therefore, it is more preferable to use a first organic solvent having a boiling point in the range of 145° C. to 185° C., and even more preferably in the range of 150° C. to 180° C.

(3) Solubility

Furthermore, it is noted that the solubility in water (measurement temperature: 20° C.) of the first organic solvent is defined to be a value of 50% by weight or less.

This is because, if the solubility has a value greater than 50% by weight, when the liquid concentrate for a cleaning composition is prepared into a cleaning composition by adding water thereto afterward, it may be difficult to obtain a clouded state. Furthermore, it is because the first organic solvent is likely to be compatibilized with water, and thereby it may be difficult for the cleaning composition to sufficiently exhibit the cleaning properties possessed by the first organic solvent.

On the other hand, if such solubility is unduly low, depending on the type of the organic solvent, when water is added afterward to prepare a cleaning composition, the composition would be in a completely separated state, and it may be difficult to maintain a clouded state.

Therefore, it is more preferable to use a first organic solvent having a solubility in water (measurement temperature: 20° C.) in the range of $1\times10^{-5}$% to 40% by weight, and even more preferably in the range of $1\times10^{-4}$% to 30% by weight.

(4) SP Value

Furthermore, it is preferable to have the SP value of the first organic solvent defined to be a value in the range of 6.5 to 12.

This is because when a first organic solvent having an SP value in the range described above is used, the cleaning properties obtainable when the liquid concentrate for a cleaning composition is prepared into a cleaning composition by adding a predetermined amount of water thereto afterward, could be further enhanced together with the SP value of the second organic solvent that will be described below.

It is also because the liquid characteristics in which the liquid concentrate for a cleaning composition is a uniform solution before a predetermined amount of water is added thereto, and once a predetermined amount of water is added afterward, the liquid concentrate is brought to a clouded state, could be more stably obtained.

That is, it is because if the SP value is a value of less than (below) 6.5, the compatibility of the first organic solvent with the second organic solvent decreases unduly, and it is difficult to constitute a uniform solution as compared with the state in which a predetermined amount of water is added afterward. On the other hand, it is because if the SP value is a value greater than 12, compatibility of the first organic solvent with water increases unduly, and when a predetermined amount of water is added afterward, it becomes difficult to obtain a clouded state.

Therefore, it is more preferable to use a first organic solvent having an SP value in the range of 7 to 11, and even more preferably in the range of 7.5 to 10.

(5) Flash Point

It is also preferable to have the flash point of the first organic solvent defined to be a value in the range of 30° C. to 100° C.

This is because if the flash point has a value lower than 30° C., the flash point of the liquid concentrate for a cleaning composition or the cleaning composition that is formed by adding water thereto afterward is likely to be lower than 40° C., and the liquid concentrate or the cleaning composition may be classified as a dangerous material in the Fire Services Act. On the other hand, it is because if the flash point has a value higher than 100° C., there may be undue limitations on the compounds that could be used as the first organic solvent.

Therefore, when the first organic solvent has a flash point, it is more preferable to use a first organic solvent having a flash point in the range of 35° C. to 85° C., and even more preferably in the range of 40° C. to 70° C.

(6) Amount of Incorporation

It is also preferable to have the amount of incorporation of the first organic solvent defined to be a value in the range of 40% to 99.7% by weight relative to the total amount of the liquid concentrate for a cleaning composition.

This is because if the amount of incorporation has a value less than (below)) 40% by weight, the cleaning properties are likely to decrease unduly, or when water is added afterward to the liquid concentrate for a cleaning composition, the cleaning composition is homogenized, and a clouded state may not be obtained. On the other hand, it is because if the amount of incorporation has a value greater than 99.7% by weight, separation from water becomes unduly vigorous, it is difficult to stably obtain a clouded state, and the cleaning properties may become likely to decrease.

Therefore, it is more preferable to select the amount of incorporation of the first organic solvent to be a value in the range of 50% to 99.5% by weight, and even more preferably in the range of 60% to 99% by weight, relative to the total amount of the liquid concentrate for a cleaning composition.

Here, FIG. 1 illustrates the relationship between the amount of incorporation of the first organic solvent and the cleaning properties of the cleaning composition.

That is, FIG. 1 illustrates a characteristic curve employing, on the horizontal axis, the amount of incorporation (wt %) of the first organic solvent in the liquid concentrate for a cleaning composition according to Example 3, and on the vertical axis, the cleaning properties evaluation results (relative value) for a cleaning composition obtained by adding afterward a predetermined amount of water to the liquid concentrate for the cleaning composition.

Here, the evaluation results (relative value) for the cleaning properties are indicated with rating points from 0 to 10, and the evaluation criteria are as follows.

Rating point 10: The flux washing time is longer than or equal to 0 minutes and shorter than 10 minutes.

Rating point 9: The flux washing time is longer than or equal to 10 minutes and shorter than 12 minutes.

Rating point 8: The flux washing time is longer than or equal to 12 minutes and shorter than 15 minutes.

Rating point 7: The flux washing time is longer than or equal to 15 minutes and shorter than 17 minutes.

Rating point 6: The flux washing time is longer than or equal to 17 minutes and shorter than 20 minutes.

Rating point 5: The flux washing time is longer than or equal to 20 minutes and shorter than 25 minutes.

Rating point 4: The flux washing time is longer than or equal to 25 minutes and shorter than 30 minutes.

Rating point 3: The flux washing time is longer than or equal to 30 minutes and shorter than 40 minutes.

Rating point 2: The flux washing time is longer than or equal to 40 minutes and shorter than 50 minutes.

Rating point 1: The flux washing time is longer than or equal to 50 minutes and shorter than 60 minutes.

Rating point 0: The flux washing time is 60 minutes or longer.

Meanwhile, the details of the evaluation method for the cleaning properties will be described in Examples.

As illustrated by the characteristic curve of FIG. 1, if the amount of incorporation of the first organic solvent in the liquid concentrate for a cleaning composition is, for example, in the range of 40% to 99.7% by weight relative to the total amount as indicated by Range A in the diagram, when the liquid concentrate for the cleaning composition is prepared into a cleaning composition containing a predetermined amount of water, satisfactory cleaning properties are obtained.

On the other hand, it is understood that if the amount of incorporation of the first organic solvent has a value less than 40% by weight or a value greater than 99.7% by weight, the evaluation results for the cleaning properties in the case where the liquid concentrate for a cleaning composition is prepared into a cleaning composition containing a predetermined amount of water becomes markedly poor.

Furthermore, it is understood that even if the difference in the incorporated components or the fluctuation of the amount of incorporation is taken into consideration, when the amount of incorporation of the first organic solvent is, for example, in the range of 50% to 99.5% by weight as indicated by Range B in the diagram, more satisfactory cleaning properties could be obtained.

Therefore, it is understood that as the amount of incorporation of the first organic solvent in the liquid concentrate for a cleaning composition is limited to a value in a predetermined range, when the liquid concentrate for the cleaning composition is prepared into a cleaning composition containing a predetermined amount of water, satisfactory cleaning properties may be obtained.

Therefore, it could be said that it is preferable to limit the amount of incorporation of the first organic solvent in the liquid concentrate for a cleaning composition of the present invention to a predetermined range, from the viewpoint of obtaining desired cleaning properties when the liquid concentrate for the cleaning composition is prepared into a cleaning composition containing a predetermined amount of water.

3. Second Organic Solvent

The second organic solvent that constitutes the liquid concentrate for a cleaning composition of the present invention is a hydrophilic amine compound having a boiling point in the range of 140° C. to 190° C. and a solubility in water (measurement temperature: 20° C.) of 50% by weight or greater.

The second organic solvent such as described above is such that when water is added afterward to the liquid concentrate for a cleaning composition to prepare a cleaning composition, the second organic solvent mediates between water and the first organic solvent that has formed an emulsion state, enhances the dispersibility of the emulsion, and as a result, the cleaning properties for the cleaning composition could be enhanced.

Furthermore, since the second organic solvent itself has excellent cleaning properties, the second organic solvent could contribute to an enhancement of the cleaning properties in the cleaning composition by itself.

Moreover, since the boiling point has a value in a predetermined range, when the cleaning composition that has been used is regenerated by distillation, the regeneration efficiency could be effectively increased.

(1) Type (Kind)

It is noted that the second organic solvent is a hydrophilic amine compound.

More specific examples thereof include N-ethylpiperazine (boiling point: 157° C., solubility in water: 100% by weight or greater, SP value: 9.7, flash point: 43° C.), N,N-diethylisopropanolamine (boiling point: 159° C., solubility in water: 100% by weight or greater, SP value: 10.3, flash point: 44° C.), N-methylethanolamine (boiling point: 160° C., solubility in water: 100% by weight or greater, SP value: 12.0, flash point: 74° C.), monoisopropanolamine (boiling point: 160° C., solubility in water: 100% by weight or greater, SP value: 12.7, flash point: 74° C.), N,N-diethylethanolamine (boiling point: 162° C., solubility in water: 100% by weight or greater, SP value: 11.0, flash point: 55° C.), N-ethylethanolamine (boiling point: 169° C., solubility in water: 100% by weight or greater, SP value: 11.4, flash point: 71° C.), N-t-butylethanolamine (boiling point: 175° C., solubility in water: 100% by weight or greater, SP value: 10.1, flash point: 88° C.), 1-amino-4-methylpiperazine (boiling point: 178° C., solubility in water: 100% by weight or greater, SP value: 11.6, flash point: 62° C.), N-aminoethylpiperazine (boiling point: 182° C., solubility in water: 100% by weight or greater, SP value: 9.9, flash point: 58° C.), benzylamine (boiling point: 185° C., solubility in water: 100% by weight or greater, SP value: 9.9, flash point: 60° C.), and N-allylpiperazine (boiling point: 185° C., solubility in water: 100% by weight or greater, SP value: 9.4, flash point: 52° C.).

Furthermore, among the second organic solvents mentioned above, it is particularly preferable to use at least one compound selected from the group consisting of N,N-diethylisopropanola mine, N-ethylethanolamine, N-methylethanolamine, benzylamine, and monoisopropanolamine.

This is because if a second organic solvent of such a kind is used, when the liquid concentrate for a cleaning composition is prepared into a cleaning composition, the dispersibility in water of the first organic solvent that has formed an emulsion could be further enhanced.

(2) Boiling Point

Furthermore, it is noted that the boiling point of the second organic solvent is defined to be a value in the range of 140° C. to 190° C.

This is because, if such boiling point has a value lower than 140° C., a large amount of the solvent is volatilized at the time of use, a large amount of liquid is consumed, and therefore, the economic efficiency becomes poor. On the other hand, if such boiling point has a value higher than 190° C., when the cleaning composition that has been used is regenerated by distillation, an excessively large amount of energy may be required, or high boiling point components are not distilled out at the time of regeneration. Also, the regeneration efficiency may become likely to decrease, as the recovery ratio of the cleaning composition decreases, or a cleaning composition having a predetermined composition may not be obtained. Furthermore, it is because since the heating temperature at which the cleaning composition that has been used is distilled increases, the constituent components of the cleaning composition are likely to be decomposed, the cleaning properties of the cleaning composition obtainable after regeneration are decreased, and it is difficult to stably obtain a cleaning composition having sufficient cleaning properties. It is also because drying-ability becomes poor, and the second organic solvent is likely to remain behind on the object to be cleaned, due to poor drying.

Therefore, it is more preferable to use a second organic solvent having a boiling point in the range of 145° C. to 185° C., and even more preferably in the range of 150° C. to 180° C.

(3) Solubility

Furthermore, it is noted that the solubility in water (measurement temperature: 20° C.) of the second organic solvent is defined to be a value of 50% by weight or higher.

This is because, if the solubility has a value of 50% by weight or less, when the liquid concentrate for a cleaning composition is prepared into a cleaning composition by adding water thereto afterward, it may be difficult for the second organic solvent to mediate between water and the first organic solvent that has formed an emulsion, and to enhance the dispersibility of the emulsion.

Therefore, it is more preferable to use a second organic solvent having a solubility in water (measurement temperature: 20° C.) in the range of 60% to ∞% by weight, and even more preferably in the range of 70% to ∞% by weight.

(4) SP Value

Furthermore, it is preferable to have the SP (Solubility Parameter) value of the second organic solvent defined to be a value in the range of 8 to 15. This is because when a second organic solvent having an SP value in the range described above is used, the cleaning properties obtainable when the liquid concentrate for the cleaning composition is prepared into a cleaning composition by adding a predetermined amount of water thereto afterward, could be further enhanced together with the SP value of the first organic solvent that will be described below.

It is also because the liquid characteristics in which the liquid concentrate for a cleaning composition is a uniform solution before a predetermined amount of water is added thereto, and once a predetermined amount of water is added afterward, the liquid concentrate is brought to a clouded state, could be more stably obtained.

That is, it is because if the SP value is a value less than 8, the compatibility of the second organic solvent with water decreases unduly, and it is difficult for the second organic solvent to mediate between water and the first organic solvent that has formed an emulsion, and to enhance the dispersibility of the emulsion. On the other hand, it is because if the SP value is a value greater than 15, the compatibility of the second organic solvent with the first organic solvent decreases unduly, and as compared to the case of adding a predetermined amount of water is added afterward, it may be difficult to constitute a uniform solution.

Therefore, it is more preferable to use a second organic solvent having an SP value in the range of 8.5 to 14, and even more preferably 9 to 13.

(5) Flash Point

It is also preferable to have the flash point of the second organic solvent defined to be a value in the range of 30° C. to 100° C.

This is because if the flash point has a value lower than 30° C., the flash point of the liquid concentrate for a cleaning composition or the cleaning composition that is formed by adding water thereto afterward is likely to be lower than 40° C., and the liquid concentrate or the cleaning composition may be classified as a dangerous material in the Fire Services Act. On the other hand, it is because if the flash point has a value higher than 100° C., there may be undue limitations on the compounds that could be used as the second organic solvent.

Therefore, when the second organic solvent has a flash point, it is more preferable to use a second organic solvent having a flash point in the range of 40° C. to 90° C., and even more preferably in the range of 50° C. to 80° C.

(6) Amount of Incorporation

Further, the amount of incorporation of the second organic solvent is defined to be a value in the range of 0.3 parts to 30 parts by weight relative to 100 parts by weight of the first organic solvent.

This is because if the amount of incorporation has a value less than 0.3 parts by weight, the absolute amount of the second organic solvent relative to the first organic solvent is insufficient, and when the liquid concentrate for a cleaning composition is prepared into a cleaning composition, it may be difficult to obtain the effect that the second organic solvent mediates between water and the first organic solvent that has formed an emulsion, and enhances the dispersibility of the emulsion. Furthermore, it is because it may be difficult to obtain the cleaning properties originating from the second organic solvent itself. On the other hand, it is because if the amount of incorporation has a value greater than 30 parts by weight, when water is added to the liquid concentrate for the cleaning composition afterward, the cleaning composition is homogenized, and it may be difficult to attain a clouded state, or the metal corrosiveness may duly increase.

Therefore, it is more preferable to select the amount of incorporation of the second organic solvent to be a value in the range of 0.5 parts to 20 parts by weight, and even more preferably in the range of 1 part to 15 parts by weight, relative to 100 parts by weight of the first organic solvent.

Figure 2:
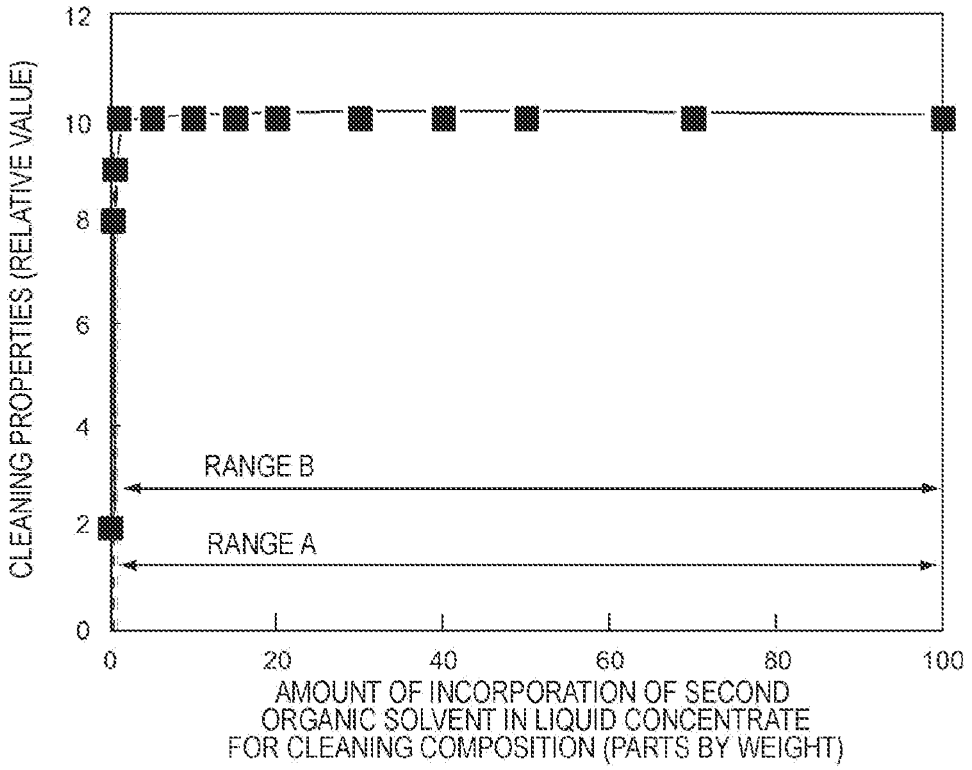
FIG. 2 is a diagram illustrating the relationship between the amount of incorporation of the second organic solvent and cleaning properties.

Here, FIG. 2 illustrates the relationship between the amount of incorporation of the second organic solvent and the cleaning properties of the cleaning composition.

That is, FIG. 2 illustrates a characteristic curve employing, on the horizontal axis, the amount of incorporation (parts by weight) of the second organic solvent in the liquid concentrate for the cleaning composition according to Example 13, and on the vertical axis, the cleaning properties evaluation results (relative value) for a cleaning composition obtained by adding afterward a predetermined amount of water to the liquid concentrate for the cleaning composition.

Meanwhile, the evaluation criteria and the like for the evaluation results for the cleaning properties are the same as in the case of FIG. 1.

As illustrated by the characteristic curve of FIG. 2, when the amount of incorporation of the second organic solvent in the liquid concentrate for the cleaning composition is, for example, in the range of 0.3 parts by weight or greater as indicated by Range A in the diagram, relative to 100 parts by weight of the first organic solvent, satisfactory cleaning properties that may be given a rating point of 8 or higher are obtained.

On the other hand, it is understood that if the amount of incorporation of the second organic solvent has a value less than 0.3 parts by weight, the evaluation results for the cleaning properties become markedly poor.

Furthermore, it is understood that even if the difference in the incorporated components or the fluctuation of the amount of incorporation is taken into consideration, when the amount of incorporation of the second organic solvent is, for example, in the range of 0.5 parts by weight or greater as indicated by Range B in the diagram, more satisfactory cleaning properties that may be given a rating point of about 10 could be obtained.

Therefore, it is understood that as the amount of incorporation of the second organic solvent in the liquid concentrate for the cleaning composition is limited to a value in a predetermined range, satisfactory cleaning properties may be obtained.

Figure 3:
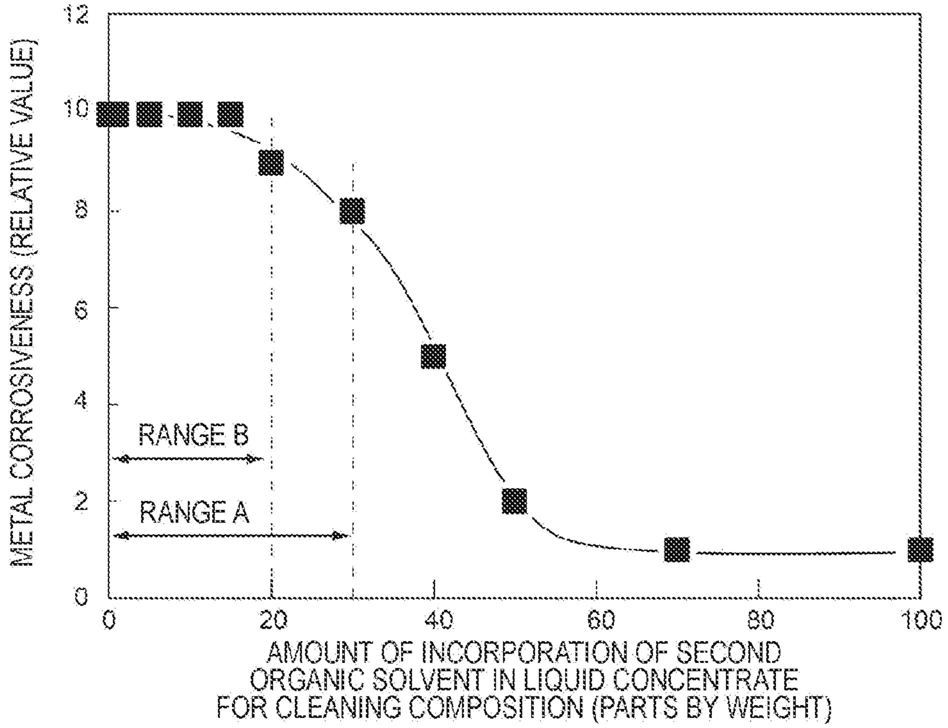
FIG. 3 is a diagram illustrating the relationship between the amount of incorporation of the second organic solvent and metal corrosiveness.

Next, FIG. 3 illustrates the relationship between the amount of incorporation of the second organic solvent and the metal corrosiveness of the cleaning composition.

That is, FIG. 3 illustrates a characteristic curve employing, on the horizontal axis, the amount of incorporation (parts by weight) of the second organic solvent in the liquid concentrate for the cleaning composition according to Example 13, and on the vertical axis, the metal corrosiveness evaluation results (relative value) for a cleaning composition obtained by adding afterward a predetermined amount of water to the liquid concentrate for the cleaning composition.

Here, the evaluation results for metal corrosiveness (relative value) are indicated with rating points from 0 to 10, and the evaluation criteria are as follows.

Rating point 10: No change in the external appearance is seen after immersion for 60 minutes.

Rating point 9: No change in the external appearance is seen after immersion for 45 minutes, but a change in the external appearance is seen after immersion for 60 minutes.

Rating point 8: No change in the external appearance is seen after immersion for 30 minutes, but a change in the external appearance is seen after immersion for 45 minutes.

Rating point 7: No change in the external appearance is seen after immersion for 25 minutes, but a change in the external appearance is seen after immersion for 30 minutes.

Rating point 6: No change in the external appearance is seen after immersion for 20 minutes, but a change in the external appearance is seen after immersion for 25 minutes.

Rating point 5: No change in the external appearance is seen after immersion for 15 minutes, but a change in the external appearance is seen after immersion for 20 minutes.

Rating point 4: No change in the external appearance is seen after immersion for 10 minutes, but a change in the external appearance is seen after immersion for 15 minutes.

Rating point 3: No change in the external appearance is seen after immersion for 5 minutes, but a change in the external appearance is seen after immersion for 10 minutes.

Rating point 2: No change in the external appearance is seen after immersion for 3 minutes, but a change in the external appearance is seen after immersion for 5 minutes.

Rating point 1: No change in the external appearance is seen after immersion for 1 minute, but a change in the external appearance is seen after immersion for 3 minutes.

Rating point 0: A change in the external appearance is seen after immersion for 1 minute.

Meanwhile, the details of the method for evaluating metal corrosiveness will be described in Examples.

As illustrated by the characteristic curve of FIG. 3, when the amount of incorporation of the second organic solvent in the liquid concentrate for the cleaning composition is, for example, in the range of 30 parts by weight or less as indicated by Range A in the diagram, relative to 100 parts by weight of the first organic solvent, satisfactory metal corrosiveness that may be given a rating point of 8 or higher is obtained.

On the other hand, it is understood that if the amount of incorporation of the second organic solvent has a value greater than 30 parts by weight, the evaluation results for metal corrosiveness become markedly poor.

Furthermore, it is understood that even if the difference in the incorporated components or the fluctuation of the amount of incorporation is taken into consideration, when the amount of incorporation of the second organic solvent is, for example, in the range of 20 parts by weight or less as indicated by Range B in the diagram, more satisfactory metal corrosiveness that may be given a rating point of about 10 could be obtained.

Therefore, it is understood that as the amount of incorporation of the second organic solvent in the liquid concentrate for the cleaning composition of the present invention is limited to a value in a predetermined range, satisfactory metal corrosiveness may be obtained.

4. Third Organic Solvent

Furthermore, on the occasion of constituting the liquid concentrate for the cleaning composition of the present invention, it is preferable that the liquid concentrate for the cleaning composition include, as a third organic solvent, at least one compound selected from the group consisting of a hydrophilic glycol ether compound, a hydrophilic alcohol compound, a hydrophilic nitrogen-containing compound and a hydrophilic sulfur-containing compound, which has a boiling point in the range of 140° C. to 190° C. and a solubility in water (measurement temperature: 20° C.) of greater than 50% by weight.

This is because, as such a third organic solvent is incorporated, when the liquid concentrate for the cleaning composition is prepared into a cleaning composition, the dispersibility in water of the first organic solvent that has formed an emulsion could be further enhanced.

That is, it is because the third organic solvent could exhibit an ancillary role for a predetermined hydrophilic amine compound as the second organic solvent.

Furthermore, as the third organic solvent is incorporated, when the liquid concentrate for the cleaning composition is prepared into a cleaning composition, the third organic solvent decreases the surface tension of the aqueous phase, and could enhance the cleaning properties for fine voids in the object to be cleaned, and drying-ability.

Meanwhile, with regard to the details of the third organic solvent and the details of the second organic solvent, although there are parts that overlap between the two in terms of definition, an organic solvent that corresponds to the parts that overlap is considered as a second organic solvent.

(1) Type

The third organic solvent is at least one compound selected from a hydrophilic glycol ether compound, a hydrophilic alcohol compound, a hydrophilic nitrogen-containing compound, and a hydrophilic sulfur-containing compound.

More specifically, among the examples of the third organic solvent, examples of the hydrophilic glycol ether compound include ethylene glycol monoisopropyl ether (boiling point: 142° C., solubility in water: 100% by weight or greater, SP value: 10.9, flash point: 46° C.), ethylene glycol monopropyl ether (boiling point: 150° C., solubility in water: 100% by weight or greater, SP value: 10.8, flash point: 57° C.), propylene glycol monopropyl ether (boiling point: 150° C., solubility in water: 100% by weight or greater, SP value: 9.6, flash point: 48° C.), ethylene glycol mono-t-butyl ether (boiling point: 153° C., solubility in water: 100% by weight or greater, SP value: 10.3, flash point: 55° C.), 3-methoxybutanol (boiling point: 161° C., solubility in water: 100% by weight or greater, SP value: 10.3, flash point: 65° C.), ethylene glycol monoisobutyl ether (boiling point: 161° C., solubility in water: 100% by weight or greater, SP value: 9.1, flash point: 57° C.), diethylene glycol dimethyl ether (boiling point: 162° C., solubility in water: 100% by weight or greater, SP value: 8.7, flash point: 56° C.), ethylene glycol monobutyl ether (boiling point: 171° C., solubility in water: 100% by weight or greater, SP value: 10.4, flash point: 63° C.), 3-methoxy-3-methyl-1-butanol (boiling point: 174° C., solubility in water: 100% by weight or greater, SP value: 10.5, flash point: 68° C.), diethylene glycol methyl ethyl ether (boiling point: 176° C., solubility in water: 100% by weight or greater, SP value: 9.3, flash point: 66° C.), dipropylene glycol monomethyl ether (boiling point: 187° C., solubility in water: 100% by weight or greater, SP value: 10.2, flash point: 76° C.), and diethylene glycol diethyl ether (boiling point: 189° C., solubility in water: 100% by weight or greater, SP value: 8.9, flash point: 70° C.).

Furthermore, among the examples of the third organic solvent, examples of the hydrophilic alcohol compound include tetrahydrofurfuryl alcohol (boiling point: 170° C., solubility in water; 100% by weight or greater, SP value: 11.9, flash point: 75° C.), and furfuryl alcohol (boiling point: 171° C., solubility in water: 100% by weight or greater, SP value: 11.9, flash point: 65° C.).

Furthermore, among the examples of the third organic solvent, examples of the hydrophilic nitrogen-containing compound include N,N-dimethylformamide (boiling point: 153° C., solubility in water: 100% by weight or greater, SP value: 11.2, flash point: 58° C.), N,N-dimethylacetamide (boiling point: 166° C., solubility in water: 100% by weight or grater, SP value: 11.1, flash point: 70° C.), and N-methylformamide (boiling point: 183° C., solubility in water: 100% by weight or greater, SP value: 13.0, flash point: 98° C.).

Furthermore, among the examples of the third organic solvent, examples of the hydrophilic sulfur-containing compound include dimethyl sulfoxide (boiling point: 189° C., solubility in water: 100% by weight or greater, SP value: 13.0, flash point: 95° C.).

Furthermore, among the third organic solvents described above, it is particularly preferable to use at least one compound selected from the group consisting of ethylene glycol monoisobutyl ether, 3-methoxy-3-methyl-1-butanol, diethylene glycol dimethyl ether, furfuryl alcohol, N-methylformamide, N,N-dimethylacetamide and dimethyl sulfoxide.

This is because when a third organic solvent of such kind is used, the third organic solvent could more effectively exhibit an ancillary role to a predetermined hydrophilic amine compound as the second organic solvent.

(2) Boiling Point

Furthermore, it is preferable to have the boiling point of the third organic solvent defined to be a value in the range of 140° C. to 190° C.

This is because, if the boiling point has a value lower than 140° C., a large amount of the solvent is volatilized at the time of use, a large amount of liquid is consumed, and therefore, the economic efficiency becomes poor. On the other hand, if such boiling point has a value higher than 190° C., when the cleaning composition that has been used is regenerated by distillation, an excessively large amount of energy may be required, or high boiling point components are not distilled out at the time of regeneration. Also, the regeneration efficiency may become likely to decrease, as the recovery ratio of the cleaning composition decreases, or a cleaning composition having a predetermined composition may not be obtained. Furthermore, it is because since the heating temperature at which the cleaning composition that has been used is distilled increases, the constituent components of the cleaning composition are likely to be decomposed, the cleaning properties of the cleaning composition obtainable after regeneration are decreased, and it is difficult to stably obtain a cleaning composition having sufficient cleaning properties. It is also because drying-ability becomes poor, and the third organic solvent is likely to remain behind on the object to be cleaned, due to poor drying.

Therefore, it is more preferable to use a third organic solvent having a boiling point in the range of 150° C. to 185° C., and even more preferably in the range of 160° C. to 180° C.

(3) Solubility

Furthermore, it is noted that the solubility in water (measurement temperature: 20° C.) of the third organic solvent is defined to be a value greater than 50% by weight.

This is because, if the solubility has a value of 50% by weight or less, it may be difficult for the third organic solvent to exhibit an ancillary role to a predetermined hydrophilic amine compound as the second organic solvent, and to contribute to an enhancement of the dispersibility in water of the first organic solvent that has formed an emulsion.

Therefore, it is more preferable to use a third organic solvent having a solubility in water (measurement temperature: 20° C.) in the range of 60% to ∞% by weight, and even more preferably in the range of 70% to ∞% by weight.

(4) SP Value

Furthermore, it is preferable to have the SP value of the third organic solvent defined to be a value in the range of 8 to 15.

This is because when a third organic solvent having an SP value in the range described above is used, the cleaning properties obtainable when the liquid concentrate for cleaning composition is prepared into a cleaning composition by adding a predetermined amount of water thereto afterward, could be further enhanced together with the SP values of the first and second organic solvents.

It is also because the liquid characteristics of the liquid concentrate for cleaning composition in which the liquid concentrate is a uniform solution before a predetermined amount of water is added thereto, and once a predetermined amount of water is added afterward, the liquid concentrate is brought to a clouded state, could be more stably obtained.

That is, it is because if the SP value is a value less than 8, the compatibility of the third organic solvent with water decreases unduly, and it may be difficult for the third organic solvent to contribute to an enhancement of the dispersibility in water of the first organic solvent that has formed an emulsion. On the other hand, it is because if the SP value is a value greater than 15, the compatibility of the third organic solvent with the first and second organic solvents decreases unduly, and it may be difficult for the third organic solvent to constitute a uniform solution before the afterward addition of a predetermined amount of water.

Therefore, it is more preferable to use a third organic solvent having an SP value in the range of 8.5 to 14, and even more preferably in the range of 9 to 13.

(5) Flash Point

Furthermore, it is preferable to have the flash point of the third organic solvent defined to be a value in the range of 30° C. to 100° C.

This is because if the flash point has a value lower than 30° C., the flash point of the liquid concentrate for cleaning composition or the cleaning composition that is formed by adding water thereto afterward is likely to be lower than 40° C., and the liquid concentrate or the cleaning composition may be classified as a dangerous material in the Fire Services Act. On the other hand, it is because if the flash point has a value higher than 100° C., there may be undue limitations on the compounds that could be used as the third organic solvent.

Therefore, when the third organic solvent has a flash point, it is more preferable to use a third organic solvent having a flash point in the range of 40° C. to 90° C., and even more preferably in the range of 50° C. to 80° C.

(6) Amount of Incorporation

It is also preferable to have the amount of incorporation of the third organic solvent defined to be a value in the range of 1 part to 150 parts by weight relative to 100 parts by weight of the first organic solvent.

This is because if the amount of incorporation has a value less than 1 part by weight, it may be difficult for the third organic solvent to exhibit an ancillary role to a predetermined hydrophobic amine compound as the second organic solvent, and to contribute to an enhancement of the dispersibility in water of the first organic solvent that has formed an emulsion. Furthermore, it is because when phase separation is induced by adding water afterward, the surface tension of the aqueous phase may unduly increase, the cleaning properties for the gaps in an object to be cleaned may decrease, or it may be difficult to obtain satisfactory liquid removability and drying-ability. On the other hand, it is because if the amount of incorporation has a value greater than 150 parts by weight, the cleaning properties obtainable when a cleaning composition is prepared may unduly decrease, or when water is added afterward to the liquid concentrate for cleaning composition, the cleaning composition is homogenized, and it may be difficult to bring the cleaning composition to a clouded state.

Therefore, it is more preferable to adjust the amount of incorporation of the third organic solvent in the range of 3 parts to 125 parts, and even more preferably in the range of 5 parts to 100 parts by weight, relative to 100 parts by weight of the first organic solvent.

Figure 4:
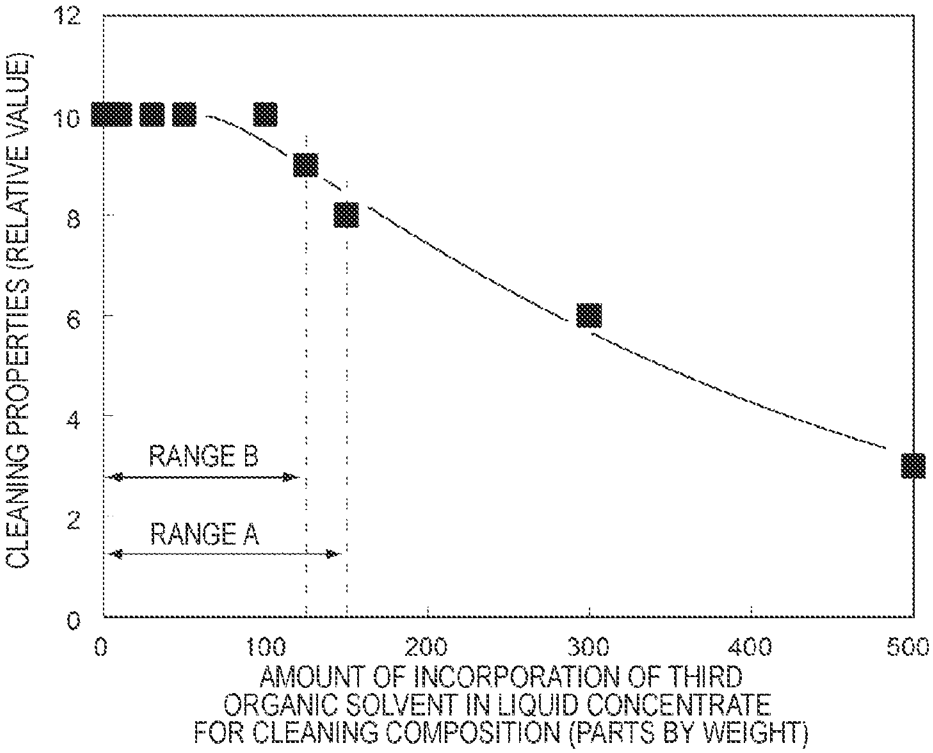
FIG. 4 is a diagram illustrating the relationship between the amount of incorporation of the third organic solvent and cleaning properties.

Here, FIG. 4 illustrates the relationship between the amount of incorporation of the third organic solvent and the cleaning properties of the cleaning composition.

That is, FIG. 4 shows a characteristic curve employing, on the horizontal axis, the amount of incorporation (parts by weight) of the third organic solvent in the liquid concentrate for cleaning composition according to Example 16, and on the vertical axis, the cleaning properties evaluation results (relative value) for a cleaning composition obtained by adding afterward a predetermined amount of water to the liquid concentrate for cleaning composition.

Meanwhile, the criteria and the like for the evaluation results for the cleaning properties are the same as in the case of FIG. 1.

As shown by the characteristic curve of FIG. 4, when the amount of incorporation of the third organic solvent in the liquid concentrate for cleaning composition is, for example, in the range of 150 parts by weight or less as indicated by Range A in the diagram, relative to 100 parts by weight of the first organic solvent, satisfactory cleaning properties that may be given a rating point of 8 or higher are obtained.

On the other hand, it is understood that if the amount of incorporation of the third organic solvent has a value exceeding 150 parts by weight, the evaluation results for the cleaning properties become markedly poor.

It is also understood that even if the difference in the incorporated components or the fluctuation of the amount of incorporation is taken into consideration, when the amount of incorporation of the third organic solvent is, for example, in the range of 125 parts by weight or less as indicated by Range B in the diagram, more satisfactory cleaning properties that may be given a rating point of about 10 could be obtained.

Therefore, it is understood that as the amount of incorporation of the third organic solvent in the liquid concentrate for cleaning composition is limited to a value in a predetermined range, satisfactory cleaning properties may be obtained.

Figure 5:
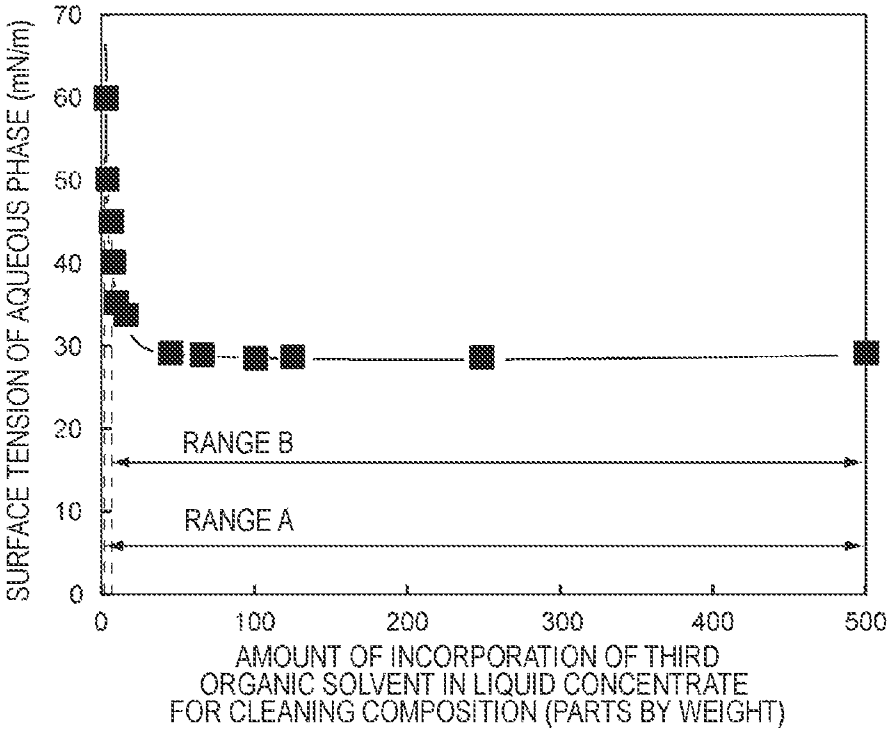
FIG. 5 is a diagram illustrating the relationship between the amount of incorporation of the third organic solvent and the surface tension of the aqueous phase.

Next, FIG. 5 illustrates the relationship between the amount of incorporation of the third organic solvent and the surface tension of the aqueous phase (lower phase) obtainable when the cleaning composition is separated into two phases.

That is, FIG. 5 shows a characteristic curve employing, on the horizontal axis, the amount of incorporation (parts by weight) of the third organic solvent in the liquid concentrate for cleaning composition according to Example 20, and on the vertical axis, the surface tension (mN/m) of the aqueous phase (lower phase) obtainable when a cleaning composition obtained by adding afterward a predetermined amount of water to the liquid concentrate for cleaning composition is separated into two phases.

As shown by the characteristic curve of FIG. 5, when the amount of incorporation of the third organic solvent in the liquid concentrate for cleaning composition is, for example, in the range of 1 part by weight or greater relative to 100 parts by weight of the first organic solvent as indicated by Range A in the diagram, a satisfactory tension of 50 mN/m or less is obtained.

On the other hand, it is understood that if the amount of incorporation of the third organic solvent is less than 1 part by weight, the surface tension of the aqueous phase acquires an unduly high value exceeding 50 mN/m.

Furthermore, it is understood that even if the difference in the incorporated components or the fluctuation of the amount of incorporation is taken into consideration, when the amount of incorporation of the second organic solvent is, for example, in the range of 3 parts by weight or greater as indicated by Range B in the diagram, a lower surface tension of about 40 mN/m could be obtained.

Therefore, as the amount of incorporation of the third organic solvent in the liquid concentrate for cleaning composition is limited to a value in a predetermined range, lower surface tension may be obtained. As a result, the cleaning properties for the gaps in the object to be cleaned could be enhanced, and also, satisfactory liquid removability and drying-ability may be obtained.

5. Fourth Organic Solvent

Furthermore, on the occasion of constituting the liquid concentrate for cleaning composition of the present invention, it is preferable for the liquid concentrate to include, as a fourth organic solvent, a hydrophobic amine compound having a boiling point in the range of 140° C. to 190° C. and a solubility in water (measurement temperature: 20° C.) of 50% by weight or less.

This is because when such a fourth organic solvent is incorporated, the fourth organic solvent complements the first organic solvent, and the liquid characteristics of the liquid concentrate for cleaning composition of being brought to a clouded state when a predetermined amount of water is added afterward to the liquid concentrate, could be obtained more stably.

(1) Type

The fourth organic solvent is a hydrophobic amine compound.

More specific examples thereof include dibutylamine (boiling point: 160° C., solubility in water: 1% by weight or less, SP value: 7.8, flash point: 43° C.), 2-ethylhexylamine (boiling point: 169° C., solubility in water: 1% by weight or less, SP value: 8.4, flash point: 60° C.), N-methylbenzylamine (boiling point: 180° C., solubility in water: 6.5% by weight, SP value: 9.5, flash point: 77° C.), and N,N-dimethylbenzylamine (boiling point: 181° C., solubility in water: 1.2, SP value: 9.8, flash point: 60° C.).

Furthermore, among the examples of the fourth organic solvent described above, it is particularly preferable to use at least one compound selected from the group consisting of dibutylamine, 2-ethylhexylamine, and N,N-dimethylbenzylamine.

This is because, if a fourth organic solvent of such a kind is used, when the liquid concentration for cleaning composition is prepared into a cleaning composition, the first organic solvent forms an emulsion more stably, and a clouded state may be obtained. Thus, the cleaning properties obtainable when a cleaning composition is obtained may be further enhanced.

(2) Boiling Point

Furthermore, it is preferable to have the boiling point of the fourth organic solvent defined to be a value in the range of 140° C. to 190° C.

This is because if the boiling point has a value lower than 140° C., a large amount of the solvent is volatilized at the time of use, a large amount of liquid is consumed, and therefore, the economic efficiency becomes poor. On the other hand, if such boiling point has a value higher than 190° C., when the cleaning composition that has been used is regenerated by distillation, an excessively large amount of energy may be required, or high boiling point components are not distilled out at the time of regeneration. Also, the regeneration efficiency may become likely to decrease, as the recovery ratio of the cleaning composition decreases, or a cleaning composition having a predetermined composition may not be obtained. Furthermore, it is because since the heating temperature at which the cleaning composition that has been used is distilled increases, the constituent components of the cleaning composition are likely to be decomposed, the cleaning properties of the cleaning composition obtainable after regeneration are decreased, and it is difficult to stably obtain a cleaning composition having sufficient cleaning properties. It is also because drying-ability becomes poor, and the first organic solvent is likely to remain behind on the object to be cleaned, due to poor drying.

Therefore, it is more preferable to use a fourth organic solvent having a boiling point in the range of 150° C. to 185° C., and even more preferably in the range of 160° C. to 180° C.

(3) Solubility

Furthermore, the solubility in water (measurement temperature: 20° C.) of the fourth organic solvent is defined to be a value of 50% by weight or less.

This is because, if the solubility has a value of greater than 50% by weight, the fourth organic solvent falls in the class of the second organic solvent, and when water is added afterward to the liquid concentrate for cleaning composition, the fourth organic solvent is taken into the aqueous phase so that it is difficult for the fourth organic solvent to exhibit an ancillary role to the oil phase (first organic solvent). On the other hand, if the solubility unduly decreases, when water is added afterward to obtain a cleaning composition, the cleaning composition may be completely separated, and it may be difficult to maintain a clouded state.

Therefore, it is more preferable to use a fourth organic solvent having a solubility in water (measurement temperature: 20° C.) in the range of $1\times10^{-5}$% to 40% by weight, and even more preferably in the range of $1\times10^{-4}$% to 30% by weight.

(4) SP Value

Furthermore, it is preferable to have the SP value of the fourth organic solvent defined to be a value in the range of 6.5 to 12.

This is because as a fourth organic solvent having an SP value in the range described above is used, when water is added afterward to the liquid concentrate for cleaning composition, the fourth organic solvent could be made so as to be taken into the oily phase.

That is, if the SP value is a value lower than 6.5, the compatibility between the second organic solvent and the third organic solvent may duly decrease, and it may be difficult to constitute the liquid concentrate for cleaning composition as a uniform solution before a predetermined amount of water is added thereto. On the other hand, it is because if the SP value is a value greater than 12, the fourth organic solvent falls in the class of the second organic solvent, and when water is added afterward to the liquid concentrate for cleaning composition, the fourth organic solvent is taken into the aqueous phase, and it may be difficult for the fourth organic solvent to exhibit an ancillary role to the oil phase (first organic solvent).

Therefore, it is more preferable to use a fourth organic solvent having an SP value in the range of 7 to 11, and even more preferably in the range of 7.5 to 10.

(5) Flash Point

Furthermore, it is preferable to have the flash point of the fourth organic solvent defined to be a value in the range of 30° C. to 100° C.

This is because if the flash point has a value lower than 30° C., the flash point of the liquid concentrate for cleaning composition or the cleaning composition that is formed by adding water thereto afterward is likely to be lower than 40° C., and the liquid concentrate or the cleaning composition may be classified as a dangerous material in the Fire Services Act. On the other hand, it is because if the flash point has a value higher than 100° C., there may be undue limitations on the compounds that could be used as the fourth organic solvent.

Therefore, in the case where the fourth organic solvent has a flash point, it is more preferable to use a fourth organic solvent having a flash point in the range of 40° C. to 90° C., and even more preferably in the range of 50° C. to 80° C.

(6) Amount of Incorporation

Furthermore, it is preferable to adjust the amount of incorporation of the fourth organic solvent to a value in the range of 0.3 parts to 30 parts by weight relative to 100 parts by weight of the first organic solvent.

This is because if the amount of incorporation of the fourth solvent has a value less than 0.3 parts by weight, the effect of addition thereof may be insufficient. On the other hand, it is because if the amount of incorporation has a value greater than 30 parts by weight, metal corrosiveness may unduly increase.

Therefore, it is more preferable to adjust the amount of incorporation of the fourth organic solvent to a value in the range of 0.5 parts to 20 parts by weight, and even more preferably in the range of 1 part to 15 parts by weight, relative to 100 parts by weight of the first organic solvent.

Figure 6:
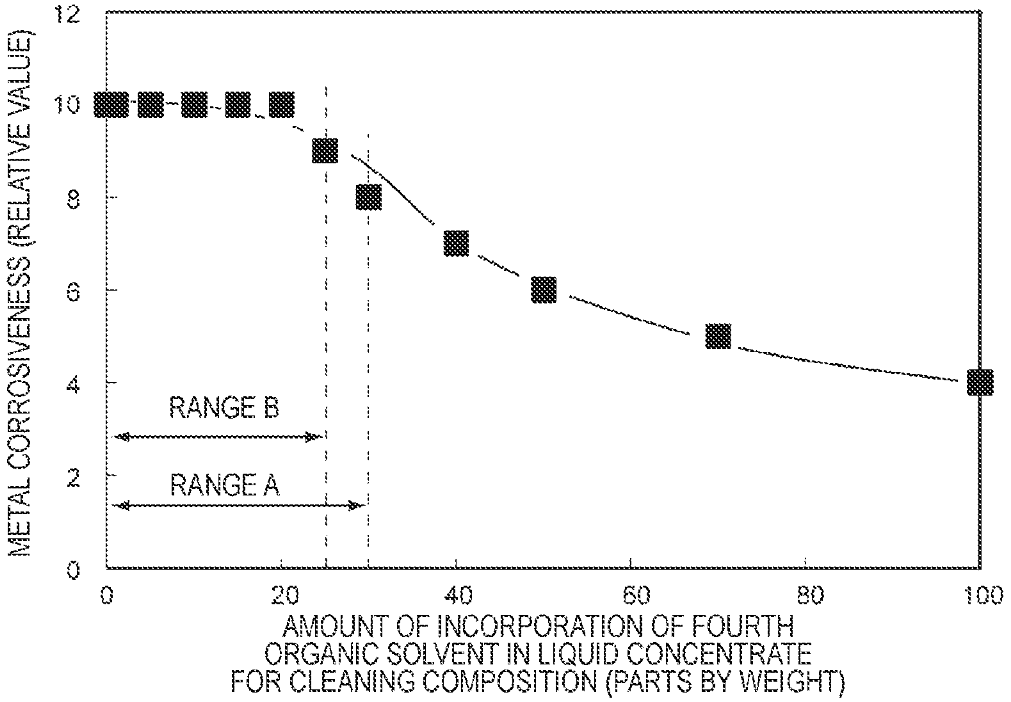
FIG. 6 is a diagram illustrating the relationship between the amount of incorporation of the fourth organic solvent and metal corrosiveness.

Here, FIG. 6 illustrates the relationship between the amount of incorporation of the fourth organic solvent and the metal corrosiveness of the cleaning composition.

That is, FIG. 6 illustrates a characteristic curve employing, on the horizontal axis, the amount of incorporation (parts by weight) of the fourth organic solvent in the liquid concentrate for cleaning composition according to Example 31, and on the vertical axis, the metal corrosiveness evaluation results (relative value) for a cleaning composition obtained by adding afterward a predetermined amount of water to the liquid concentrate for cleaning composition.

Meanwhile, the criteria and the like for the evaluation results for metal corrosiveness are the same as in the case of FIG. 3.

As shown by the characteristic curve of FIG. 6, when the amount of incorporation of the fourth organic solvent in the liquid concentrate for cleaning composition is, for example, in the range of 30 parts by weight or less as indicated by Range A in the diagram, relative to 100 parts by weight of the first organic solvent, satisfactory metal corrosiveness that may be given a rating point of 8 or higher are obtained.

On the other hand, it is understood that if the amount of incorporation of the fourth organic solvent has a value exceeding 30 parts by weight, the evaluation results for metal corrosiveness become markedly poor.

It is also understood that even if the difference in the incorporated components or the fluctuation of the amount of incorporation is taken into consideration, when the amount of incorporation of the fourth organic solvent is, for example, in the range of 25 parts by weight or less as indicated by Range B in the diagram, more satisfactory metal corrosiveness that may be given a rating point of about 10 could be obtained.

Therefore, it is understood that as the amount of incorporation of the fourth organic solvent in the liquid concentrate for cleaning composition is limited to a value in the predetermined range, satisfactory metal corrosiveness may be obtained.

6. Surfactant (1) Type

A surfactant has an action of increasing the emulsifiability in water of the first organic solvent and the like described above, and an action of increasing the affinity to an object to be cleaned, and consequently has an effect of enhancing the cleaning properties. Therefore, a surfactant may be added to the liquid concentrate for cleaning composition.

Here, suitable examples of the surfactant include nonionic surfactants such as polyoxyethylene alkyl ethers, polyoxyethylene alkyl phenyl ethers, polyoxyethylene polypropylene alkyl ethers, polyoxyethylene sorbitan fatty acid esters, polyoxyethylene glycol fatty acid esters, polyoxyethylene alkylamines, polyoxyethylene benzyl alcohol, polyglycerin fatty acid esters, which may be used singly or in combination of two or more kinds.

(2) Amount of Incorporation

It is preferable that the liquid concentrate for cleaning composition of the present invention do not include a surfactant; however, any surfactant which exhibits an effect of enhancing the cleaning properties, such as an effect of enhancing the emulsifiability of water even if added in a small amount and contributing to an enhancement of the affinity for an object to be cleaned, may be incorporated to the extent that drying-ability and the electrical properties toward the object to be cleaned are not unduly affected.

Even in this case, it is preferable to adjust the amount of incorporation of the surfactant to a value in the range of 0% to 3% by weight (provided that 0% by weight is excluded) relative to the total amount of the liquid concentrate for cleaning composition.

This is because, if the amount of incorporation of the surfactant is a value greater than 3% by weight, a large amount of the surfactant remains on the object to be cleaned, a rinsing process is essentially needed, the electrical characteristics of the object to be cleaned may be deteriorated, or even if water is added afterward, the cleaning composition is homogenized so that the cleaning properties may deteriorate.

Therefore, it is more preferable to adjust the amount of incorporation of the surfactant to a value in the range of 0.01% to 2% by weight, and even more preferable to a value in the range of 0.1% to 1% by weight, relative to the total amount of the liquid concentrate for cleaning composition.

7. Organic Solvent Having Boiling Point of Higher than 190° C.

It is preferable that the liquid concentrate for cleaning composition of the present invention substantially do not include an organic solvent having a boiling point of higher than 190° C.

This is because, when a cleaning composition that has been used is regenerated by distillation, an excessively large amount of energy may be required, or high boiling point components are not distilled out at the time of regeneration. Also, the regeneration efficiency may become likely to decrease, as the recovery ratio of the cleaning composition decreases, or a cleaning composition having a predetermined composition may not be obtained. Furthermore, it is because since the heating temperature at which the cleaning composition that has been used is distilled increases, the constituent components of the cleaning composition are likely to be decomposed, the cleaning properties of the cleaning composition obtainable after regeneration are decreased, and it is difficult to stably obtain a cleaning composition having sufficient cleaning properties. It is also because drying-ability becomes poor, and the first organic solvent is likely to remain behind on the object to be cleaned, due to poor drying.

However, for example, it is acceptable to incorporate an organic solvent which contributes to an enhancement of the cleaning properties of the cleaning composition even if added in a small amount, such as benzyl alcohol or N-methylpyrrolidone, to the extent that the regeneration efficiency of the cleaning composition and drying-ability are not unduly affected.

Therefore, it is necessary to adjust the amount of incorporation of the organic solvent having a boiling point of higher than 190° C., to a value in the range of 0 parts by weight, or 0 parts to 15 parts by weight (provided that 0 parts by weight is excluded), relative to 100 parts by weight of the first organic solvent, and it is more preferable to adjust the amount of incorporation to a value in the range of 0.01 parts to 12 parts by weight, and even more preferably to a value in the range of 0.1 parts to 10 parts by weight.

Furthermore, in the case of preparing a cleaning composition in a clouded state obtained by adding afterward a predetermined amount of water to the liquid concentrate for cleaning composition, it is preferable to adjust the amount of incorporation of the organic solvent having a boiling point of higher than 190° C. to a value of 0% to less than 5% by weight, more preferably to a value in the range of 0.001% to 4% by weight, and even more preferably to a value in the range of 0.01% to 3% by weight.

8. Ester Compound

Furthermore, it is preferable that the liquid concentrate for cleaning composition of the present invention do not substantially include an ester compound, from the viewpoint of increasing the regeneration efficiency of the cleaning composition.

That is, it is because when the liquid concentrate for cleaning composition includes an ester compound, if it is intended to regenerate by distillation a cleaning composition that has been used, the ester compound undergoes hydrolysis at the time of regeneration by distillation, there is a possibility that the cleaning properties of the distillate obtainable by regeneration may deteriorate, and it is likely to be difficult to obtain sufficient cleaning properties.

However, to the extent that a decrease in the cleaning properties after the regeneration by distillation of the cleaning composition is not unduly affected, for example, an ester compound such as ethylene glycol monobutyl ether acetate may also be used for the purpose of further enhancing the cleaning properties.

Therefore, it is preferable to adjust the amount of incorporation of the ester compound to 0 parts by weight, or a value in the range of 0 parts to 25 parts by weight (provided that 0 parts by weight is excluded) relative to 100 parts by weight of the first organic solvent, more preferably to a value in the range of 1 part to 12 parts by weight, and even more preferably to a value in the range of 2 parts to 6 parts by weight.

Second Embodiment

According to a second embodiment, there is provided a cleaning composition which includes 50 parts to 1900 parts by weight of water relative to 100 parts by weight of a liquid concentrate for cleaning composition, and is intended to clean an object to be cleaned while the liquid concentrate for cleaning composition is in a clouded state, the liquid concentrate for cleaning composition including a first organic solvent and a second organic solvent as organic solvents, in which the first organic solvent is at least one compound selected from the group consisting of a hydrophobic glycol ether compound, a hydrophobic hydrocarbon compound, a hydrophobic aromatic compound, a hydrophobic ketone compound and a hydrophobic alcohol compound, which has a boiling point in the range of 140° C. to 190° C. and a solubility in water (measurement temperature: 20° C.) of 50% by weight or less; the second organic solvent is a hydrophilic amine compound having a boiling point in the range of 140° C. to 190° C. and a solubility in water (measurement temperature: 20° C.) of greater than 50% by weight; the amount of incorporation of the second organic solvent is adjusted to a value in the range of 0.3 parts to 30 parts by weight relative to 100 parts by weight of the first organic solvent; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent.

1. Liquid Concentrate for Cleaning Composition

In the second embodiment, since the liquid concentrate for cleaning composition described in the first embodiment is used directly, further explanation thereof will not be given here.

2. Water

The cleaning composition of the present invention is used after a predetermined amount of water is added to and mixed with a liquid concentrate for cleaning composition, in order to bring the cleaning composition to a clouded state and to obtain excellent cleaning power.

That is, when a relatively large amount of water is added to a liquid concentrate for cleaning composition, the first organic solvent forms an emulsion, and also, the second organic solvent mediates between water and the first organic solvent that has formed an emulsion. Thus, the dispersibility of the emulsion is enhanced, and thereby a cleaning composition in a clouded state could be stably obtained.

Thereby, the cleaning properties attributable to the first and second organic solvents themselves, and the clouded state of the cleaning composition exhibit a synergistic effect, and even if a cleaning composition is prepared by adding afterward a predetermined amount of water to the liquid concentrate for cleaning composition, excellent cleaning properties could be obtained.

Furthermore, since the cleaning composition of the present invention includes a relatively large amount of water, excellent environmental safety could be obtained.

More specifically, since it is possible for the cleaning composition to include 60% by weight or more of water relative to the total amount of the cleaning composition, the cleaning composition could be readily excluded from the range of dangerous materials in the Fire Services Act.

Also, since the boiling point of the organic solvents included are in a predetermined range, excellent regeneration efficiency could be exhibited.

Furthermore, when the liquid concentrate for cleaning composition of the present invention is used, there could be obtained a cleaning composition having cleaning properties that are easily adjustable with the contamination state or the like of the object to be cleaned, as the user changes the mixing proportions of the liquid concentrate for cleaning composition and water.

Furthermore, the amount of incorporation of water is adjusted to a value in the range of 50 parts to 1900 parts by weight relative to 100 parts by weight of the liquid concentrate for cleaning composition.

This is because if the amount of incorporation has a value less than 50 parts by weight, not only the cleaning properties deteriorate, but also the cleaning composition is homogenized, so that it may be difficult to bring the cleaning composition to a clouded state.

On the other hand, it is because if the amount of incorporation of water has a value exceeding 1900 parts by weight, the cleaning properties may be markedly deteriorated.

Therefore, it is more preferable to adjust the amount of incorporation of water to a value in the range of 150 parts to 900 parts by weight, and even more preferably to a value in the range of 175 parts to 600 parts by weight, relative to 100 parts by weight of the liquid concentrate for cleaning composition.

Here, the relationship between the amount of incorporation of water and the cleaning properties of the cleaning composition will be described by using FIG. 7.

Figure 7:
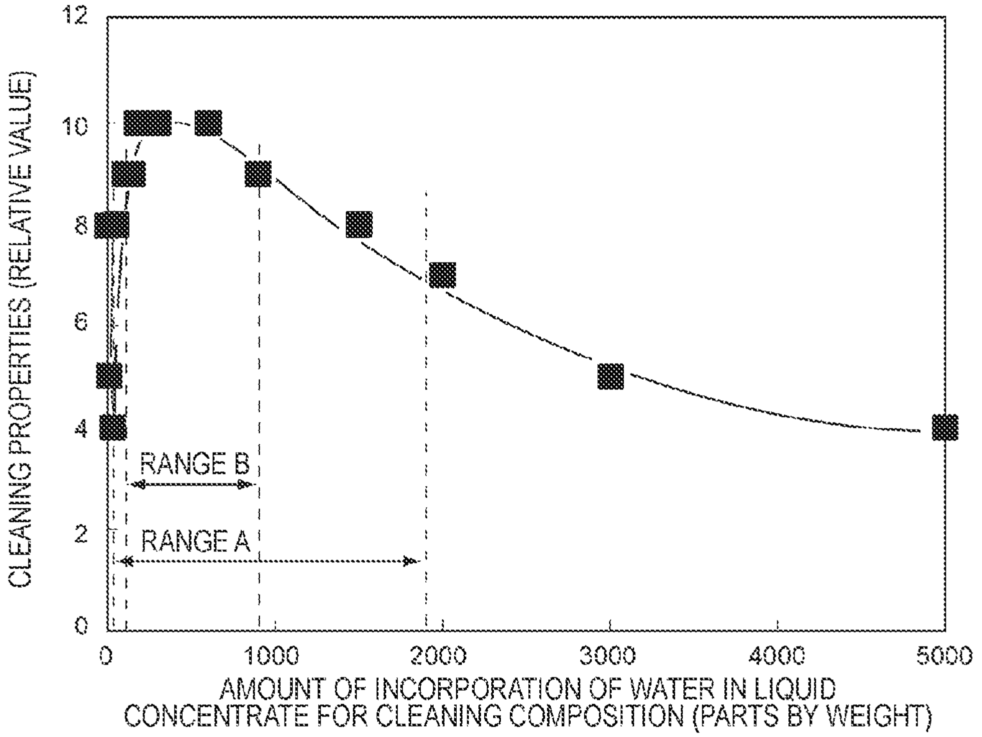
FIG. 7 is a diagram illustrating the relationship between the amount of incorporation of water and cleaning properties.

That is, FIG. 7 shows a characteristic curve employing, on the horizontal axis, the amount of incorporation (parts by weight) of water relative to 100 parts by weight of the liquid concentrate for cleaning composition, and on the vertical axis, the cleaning properties evaluation results (relative value) for a cleaning composition constituted from the liquid concentrate for cleaning composition.

Meanwhile, the criteria and the like for the evaluation results for the cleaning properties are the same as in the case of FIG. 1.

As shown by the characteristic curve of FIG. 7, when the amount of incorporation of water relative to 100 parts by weight of the liquid concentrate for cleaning composition is, for example, in the range of 50 parts to 1900 parts by weight as indicated by Range A in the diagram, satisfactory cleaning properties that may be given a rating point of 8 or higher are obtained.

Furthermore, for example, in FIG. 7, when the amount of incorporation of water is in the range of 150 parts to 900 parts by weight as indicated by Range B, satisfactory cleaning properties that may be given a rating point of 10 are obtained.

Therefore, it is understood that when the amount of incorporation of water relative to 100 parts by weight of the liquid concentrate for cleaning composition is limited to a value in a predetermined range, satisfactory cleaning properties are obtained for the cleaning composition obtainable from the liquid concentrate for cleaning composition.

Meanwhile, the characteristic curve shown in FIG. 7 indicates that even in the case where the amount of incorporation is 0 parts by weight, or a small amount, relatively satisfactory cleaning properties are obtained; however, in this case, not only excellent environmental safety could not be obtained, but the flash point of the cleaning composition is lowered.

3. Characteristics (1) Flash Point and Combustion Point

It is preferable that the cleaning composition do not have a flash point, or that even in the case where the cleaning composition has a flash point, the cleaning composition have the flash point at a temperature of 40° C. or higher, while having a combustion point at a temperature of 60° C. or higher.

This is because, if the flash point of the cleaning composition is 40° C. or higher, and the combustion point is 60° C. or higher, the cleaning composition is not classified as a dangerous material in the Fire Services Act.

However, if the flash point and the combustion point of the cleaning composition are excessively high, the type or the amount of incorporation of the first and second organic solvents that could be used may be unduly limited.

Therefore, even in the case where the cleaning composition has a flash point, it is more preferable to adjust the temperature to a value in the range of 45° C. to 200° C., and even more preferable to a value in the range of 50° C. to 100° C.

Furthermore, it is more preferable to adjust the combustion point of the cleaning composition to a value in the range of 70° C. to 250° C., and even more preferable to a value in the range of 80° C. to 150° C.

Meanwhile, the flash point of the cleaning composition could be measured according to JIS K 2265-1 and 4 (method for determining the flash point), as described in Example 1.

(2) Volatile Organic Compounds

Furthermore, it is preferable to adjust the amount of incorporation of volatile organic compounds (VOC) in the cleaning composition to 50% by weight or less.

This is because, if the amount of incorporation of volatile organic compounds in the cleaning composition is greater than 50% by weight, environmental problems may occur, particular treatment apparatuses may be needed, or it may be difficult to handle the cleaning composition as a water-based cleaning composition.

However, if the amount of incorporation of volatile organic compounds in the cleaning composition is made excessively small, the type or the amount of incorporation of hydrocarbon compounds or nitrogen-containing compounds that could be used may be unduly limited.

Therefore, it is more preferable to adjust the amount of incorporation of volatile organic compounds in the cleaning composition to a value in the range of 0.5% to 45% by weight, and even more preferably to a value in the range of 10% to 40% by weight.

Meanwhile, the amount of incorporation of volatile organic compounds (VOC) in the cleaning composition could be measured by using a gas chromatographic analysis method.

(3) pH Value

Furthermore, it is preferable the adjust the pH values of aqueous solutions obtained by respectively diluting the aqueous phase and oil phase separated from the cleaning composition 100 times by using distilled water, both to a value of 6.5 or greater.

This is because, if the pH values are smaller than 6.5, the cleaning effect for flux may be markedly decreased.

However, if the relevant pH values of the cleaning composition are excessively large, the cleaning composition may infiltrate into the substrate and the like of electronic components, which are objects to be cleaned.

Therefore, it is more preferable to adjust the pH value of the cleaning composition to a value in the range of 7 to 12.5, and even more preferably to a value in the range of 9 to 12.

Meanwhile, the pH of the cleaning composition could be measured by using a pH meter, as described in Example 1.

(4) Amine Value

Furthermore, it is preferable to adjust the amine value of the cleaning composition to a value of 1 mg KOH/g or greater.

This is because, if the amine value is a value of less than 1 mg KOH/g, the cleaning effect for flux may be markedly deteriorated.

However, if the amine value of the cleaning composition is excessively large, the cleaning composition may infiltrate the substrate and the like of electronic components, which are objects to be cleaned.

Therefore, it is more preferable to adjust the amine value of the cleaning composition to a value in the range of 5 mg KOH/g to 250 mg KOH/g, and even more preferable to a value in the range of 10 mg KOH/g to 200 mg KOH/g.

Meanwhile, the amine value of the cleaning composition could be measured according to a neutralization titration method.

(5) Electrical Conductivity

It is also preferable to adjust the electrical conductivity (room temperature) of the cleaning composition to a value in the range of 5 μS/cm to 700 μS/cm.

This is because, if the electrical conductivity has a value less than 5 μS/cm, the cleaning effect for flux may markedly decrease. On the other hand, it is because, if the electrical conductivity is greater than 700 μS/cm, the cleaning composition may infiltrate electronic components, substrates and the like, which are objects to be cleaned.

Therefore, it is more preferable to adjust the electrical conductivity of the cleaning composition to a value in the range of 10 μS/cm to 600 μS/cm, and even more preferable to a value in the range of 20 μS/cm to 500 μS/cm.

Meanwhile, the electrical conductivity of the cleaning composition could be measured by using an electrical conductivity meter, as described in Example 1.

(6) Light Transmittance

It is also preferable to adjust the light transmittance (visible light/based on 750 nm), which serves as a criterion of the clouded state of the cleaning composition, to a value of 80% or less.

This is because, if the light transmittance has a value greater than 80%, the cleaning composition becomes close to a uniform solution, phase separation occurs to an excessive state, a clouded state may not be maintained, or the cleaning effect for flux and the like may be markedly decreased.

On the other hand, it is because, if the light transmittance of the cleaning composition is excessively small, phase separation may occur insufficiently, it may be difficult to control the cleaning properties, or the cleaning effect for flux and the like may be decreased on the contrary.

Therefore, it is more preferable to adjust the light transmittance of the cleaning composition to a value in the range of 0.5% to 60%, and even more preferable to a value in the range of 3% to 40%.

Meanwhile, the light transmittance of the cleaning composition to visible light could be measured by using a spectrophotometer, as described in Example 1.

(7) Surface Tension

Furthermore, it is preferable to adjust the surface tension (measurement temperature: 25° C.) of the aqueous phase (lower phase) obtainable when the cleaning composition separates into two phases, to a value in the range of 25 mN/m to 65 mN/m.

This is because, if the surface tension has a value less than 25 mN/m, the cleaning properties for the gaps in the object to be cleaned, liquid removability and drying-ability are improved, but the type of the organic solvents that could be used, and the amount of incorporation of water may be unduly limited. On the other hand, it is because, if the surface tension has a value greater than 65 mN/m, the cleaning properties for the gaps in the object to be cleaned may deteriorate, or it may be difficult to obtain satisfactory liquid removability and drying-ability.

Therefore, it is more preferable to adjust the surface tension of the aqueous phase (lower phase) obtainable when the cleaning composition separates into two phases, to a value in the range of 27 mN/m to 60 mN/m, and even more preferably to a value in the range of 29 mN/m to 55 mN/m.

Third Embodiment

According to a third embodiment, there is provided a cleaning method including a step for mixing 100 parts by weight of a liquid concentrate for cleaning composition with 50 parts to 1900 parts by weight of water, and a step for cleaning an object to be cleaned with the mixture in a clouded state, the liquid concentrate for cleaning composition including a first organic solvent and a second organic solvent as organic solvents, in which the first organic solvent is at least one compound selected from the group consisting of a hydrophobic glycol ether compound, a hydrophobic hydrocarbon compound, a hydrophobic aromatic compound, a hydrophobic ketone compound and a hydrophobic alcohol compound, which has a boiling point in the range of 140° C. to 190° C. and a solubility in water (measurement temperature: 20° C.) of 50% by weight or less; the second organic solvent is a hydrophilic amine compound having a boiling point in the range of 140° C. to 190° C. and a solubility in water (measurement temperature: 20° C.) of greater than 50% by weight;

the amount of incorporation of the second organic solvent is adjusted to a value in the range of 0.3 parts to 30 parts by weight relative to 100 parts by weight of the first organic solvent; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent.

1. Mixing Step

The mixing step is a process for mixing a predetermined amount of water with a liquid concentrate for cleaning composition, and preparing a cleaning composition.

More specifically, in the mixing step, 100 parts by weight of a liquid concentrate for cleaning composition is mixed with 50 parts to 1900 parts by weight of water.

Meanwhile, on the occasion of carrying out the mixing step, it is preferable to use a known mixer or a known stirring apparatus.

2. Cleaning Step (1) Mode of Cleaning

On the occasion of carrying out a cleaning method using a cleaning composition, the cleaning method is not particularly limited, and for example, various techniques such as an immersion method, a shaking method, an ultrasonic vibration method, a shower cleaning method, and a jet-in-liquid method could be employed.

Furthermore, it is also preferable to clean fluxes with a cleaning composition impregnated or attached to a brush, a cleaning roller or the like.

Meanwhile, on the occasion of carrying out the cleaning method using a cleaning composition, more specifically, it is preferable to use a cleaning apparatus that will be described below.

(2) Cleaning Conditions

Furthermore, on the occasion of carrying out the cleaning method using a cleaning composition, it is preferable to perform cleaning under the conditions of, for example, 30° C. to 80° C. and 10 seconds to 60 minutes.

This is because, if a predetermined cleaning effect is obtained under such conditions, thermal deterioration or oxidative deterioration of the cleaning composition itself could be effectively prevented.

Meanwhile, as one of the cleaning conditions for making the cleaning composition to exhibit excellent cleaning properties in a clouded state, it is preferable to retain the cleaning composition in a stirred state.

More specifically, it is preferable to retain the cleaning composition in a stirred state at a speed of rotation in the range of 30 rpm to 1000 rpm, by using a propeller stirring apparatus, a magnetic stirrer or the like.

3. Rinsing Step

The cleaning composition of the present invention is constituted of a cleaning composition that is obtained by adding afterward a predetermined amount of water to a liquid concentrate for cleaning composition; however, since the cleaning composition has excellent drying-ability, the rinsing step may be basically omitted.

However, for the cleaning of electronic components, substrates and the like, as residual cleaning composition remains behind, electrical corrosion may occur in the electronic components, substrates and the like. Therefore, it is also preferable to further provide a step of performing a rinsing treatment, and to treat the cleaned electronic components, substrates and the like by rinsing.

In this case, it is preferable to use an alcohol-based solvent as a rinsing liquid.

This is because, as compared to water, faster drying could be achieved, and at the same time, amine compounds could also be sufficiently removed.

Furthermore, more specifically, it is preferable to use, as the alcohol-based solvent, one kind or two or more kinds of alcohols such as methyl alcohol, ethyl alcohol, propyl alcohol, isopropyl alcohol, butyl alcohol, isobutyl alcohol, t-butyl alcohol, s-butyl alcohol, amyl alcohol, and 1-methoxy-2-propanol.

Furthermore, with regard to these alcohols, it is preferable to use an alcohol-based solvent to which a predetermined amount of water has been added, and more specifically, it is preferable to use an alcohol-based solvent to which water has been added in an amount of 40% by weight to 70% by weight relative to the total amount.

Meanwhile, it is more preferable to set the rinsing conditions in the ranges of 5° C. to 40° C. and 1 second to 30 minutes, and to carry out the rinsing treatment in two stages. This is because surfactants and the residues of amine compounds could be further reduced.

However, in the case of removing the flux that is adhering to a solder treatment apparatus or the like, since the problem of deterioration of the electrical characteristics of electronic components, substrates and the like caused by residual surfactants and the like is negligible, such a rinsing step may be omitted or simplified.

4. Cleaning Apparatus

Figure 8A:
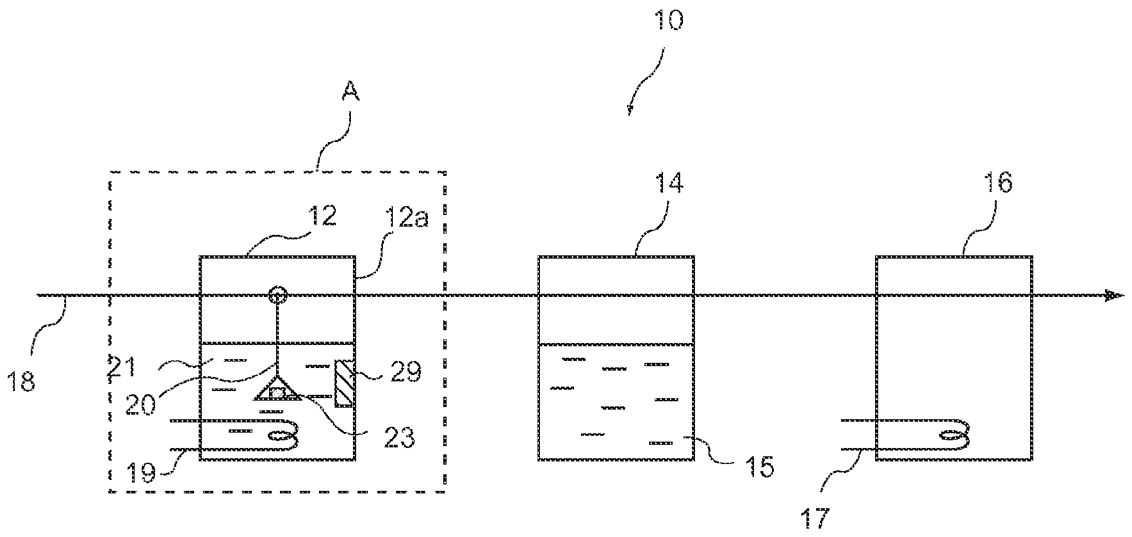
FIGS. 8A and 8B are diagrams illustrating an example of a cleaning apparatus.

A flux cleaning apparatus 10 that is used on the occasion of carrying out the cleaning method using a cleaning composition preferably includes, as shown in FIG. 8A, for example, a cleaning tank 12 equipped with an ultrasonic vibrator 29 for ultrasonic cleaning, a rinsing tank 14, and a drying tank 16.

More specifically, the cleaning tank 12 is composed of a casing 12*a*, an accommodation unit 20 for an object to be cleaned 23, an ultrasonic vibrator 29, a stirring apparatus for a cleaning liquid (not depicted in the diagram), and a heater 19 equipped with an automatic temperature regulator, and it is preferable to clean the object to be cleaned 23 efficiency by subjecting the cleaning liquid 21 that is being stirred and circulated, to ultrasonic vibration with the ultrasonic vibrator 29.

Figure 8B:
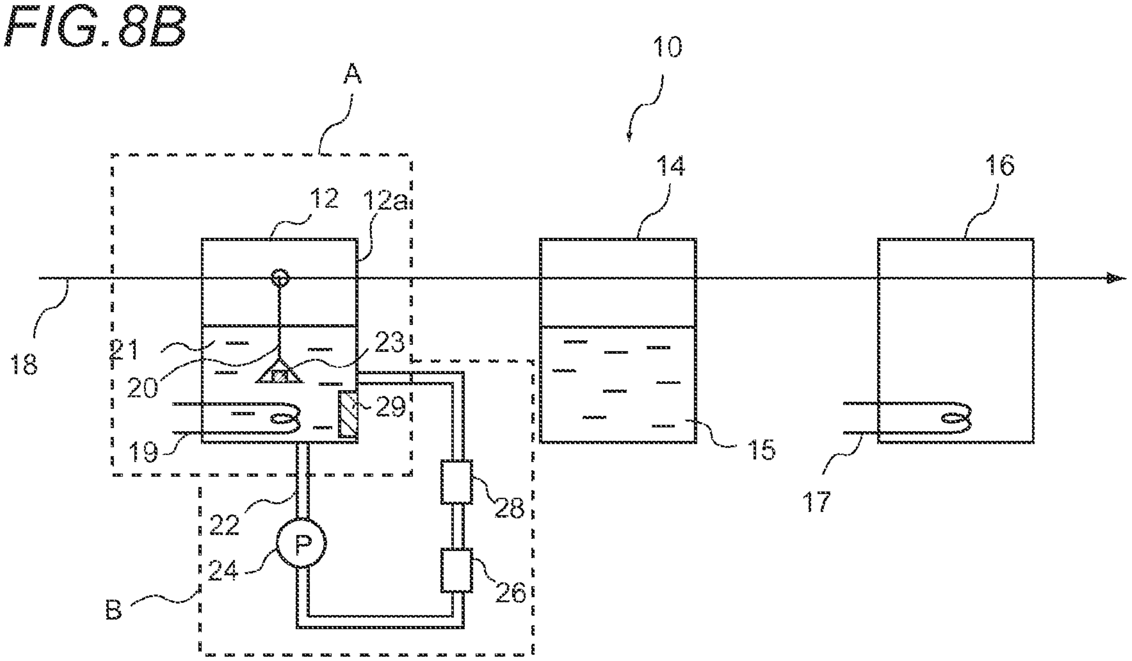

Furthermore, as shown in FIG. 8B, the cleaning tank 12 is also preferably composed of a casing 12*a*, an accommodation unit 20 for an object to be cleaned 23, an ultrasonic vibrator 29, a stirring apparatus for a cleaning liquid (not depicted in the diagram), a heater 19 equipped with an automatic temperature regulator, and a circulation channel 22 for circulating the cleaning liquid 21. That is, the cleaning liquid 21 that has been partially contaminated could be circulated by a pump 24, and the cleaning liquid 21 could be regenerated at a filter 28 that is provided in the circulation channel 22 in the middle of the circulation course, or at an accommodation unit for salt-forming compound 26.

Subsequently, in the rinsing tank 14, it is preferable to further remove fluxes and the like from the object to be cleaned 23 as well as to remove the cleaning liquid 21, and in the drying tank 16, it is preferable to completely remove a rinsing liquid 15 or the like through evaporation.

That is, by using such a cleaning apparatus 10, a solder-treated electronic component or substrate could be cleaned by using the cleaning composition of the present invention, and the fluxes adhering thereto could be efficiently removed.

5. Object to be Cleaned

On the occasion of carrying out the cleaning method of using a cleaning composition, there are no particular limitations on the type of the object to be cleaned to which the cleaning composition is applied; however, a solder-treated electronic component or substrate, as well as a component or the like that has not been solder-treated but has been affected by flux could also be suitably used. Therefore, specific examples thereof include printed circuit boards, ceramic wiring boards, semiconductor elements (including semiconductor components such as a ball grid array (BGA), a chip scale package (CSP), a pin grid array (PGA), a land grid array (LGA) and the like), semiconductor element mounted boards, bump-attached TAB (tape automated bonding) tapes, bumpless TAB tapes, semiconductor mounted TAB tapes, lead frames, condensers, and resistors.

With regard to these objects to be cleaned, the type of the flux used is not particularly limited, but preferred examples of the flux include a conventional solder flux, a low-VOC flux, a lead-free solder flux, a high melting point solder flux, and a washless solder flux. That is, it is because these solder fluxes usually contain rosin as a main component, and in many cases, at least one compound of organic acid salts, glycidyl ether compounds, oxy acids, carboxylic acids (including dicarboxylic acids), anilides and thermosetting resins (for example, epoxy resins and thermosetting acrylic resins) is added to the rosin. Therefore, when the cleaning composition of the present invention is used, excellent cleaning properties against conventional solder fluxes as well as these solder fluxes could be obtained.

Meanwhile, there are also no particular limitations on the type of solder to which fluxes are added, such as conventional solder, high melting point solder, lead-free solder, and washless solder. However, representative examples of the solder include a Sn—Ag solder, a Sn—Ag—Cu solder, a Sn—Cu solder, a Sn—Zn solder, a Sn—Bi solder, and a Pb—Sn solder.

EXAMPLES

Hereinafter, the present invention will be described in detail by way of Examples. However, it is needless to say that the present invention is not intended to be limited by the following descriptions.

Example 1

1. Preparation of Liquid Concentrate for Cleaning Composition

In a vessel, 100 parts by weight of 1-decene as a first organic solvent and 3.3 parts by weight of N-ethylethanolamine (MEM) as a second organic solvent were accommodated, and the mixture was sufficiently stirred to be in a uniform state by using a mixer as a stirring apparatus. Thus, a liquid concentrate for cleaning composition of Example 1 was obtained.

Meanwhile, Table 1A presents the mixing composition of the liquid concentrate for cleaning composition of Example 1, and in the case where the title of a constituent component is not indicated, the abbreviation thereof that has been described above in parentheses will be used to indicate the constituent component.

2. Preparation and Evaluation of Cleaning Composition (1) Preparation of Cleaning Composition In a vessel, 100 parts by weight of the liquid concentrate for cleaning composition thus obtained and 233.3 parts by weight of water were accommodated, and the mixture was sufficiently stirred by using a mixer as a stirring apparatus. Thus, a cleaning composition was obtained. However, when the cleaning composition was left to stand for about 10 minutes, it was confirmed that the cleaning composition separated into two phases.

(2)-1 Flash Point The flash points of the liquid concentrate for cleaning composition and the cleaning composition thus obtained were measured according to JIS K2265-1: 2007 (a method for measuring the flash point (tag sealing method)) and JIS K2265-4: 2007 (a method for measuring the flash point (Cleveland open-cup method)). The results thus obtained are presented in Table 2.

(2)-2 pH Value

The cleaning composition thus obtained was left to stand to separate the cleaning composition into an aqueous phase and an oil phase, and then the phases were respectively diluted 100 times by using distilled water. The pH values of the diluted aqueous solutions were measured by using a pH meter, M-8 (manufactured by Horiba, Ltd.), under the conditions of a measurement temperature of 25° C. The results thus obtained are presented in Table 2.

(2)-3 Light Transmittance 200 g of the cleaning composition thus obtained was accommodated in a beaker having a capacity of 300 ml. Subsequently, a magnetic stirrer placed inside the beaker was rotated at a speed of about 700 rpm, and thereby the cleaning composition was brought to a clouded state. The cleaning composition in that state was rapidly transferred to a cell for spectrophotometer, the cleaning composition in the cell was left to stand for 5 minutes, and then the light transmittance at that time point was measured under the following conditions. The results thus obtained are presented in Table 2.

Analytic apparatus: spectrophotometer (manufactured by Hitachi, Ltd.)

Light for analysis: visible light (wavelength: 750 nm)

Measurement temperature: room temperature (25° C.)

(2)-4 Electrical Conductivity 200 g of the cleaning composition thus obtained was accommodated in a beaker having a capacity of 300 ml. Subsequently, a magnetic stirrer was rotated therein, and thereby the cleaning composition was brought to a clouded state. While the state was maintained, the electrical conductivity of the cleaning composition thus obtained was measured by using a conductivity meter, CEH-12 (manufactured by COS Co., Ltd.) under the conditions of room temperature (25° C.). The results thus obtained are presented in Table 2.

(2)-5 Evaluation of Cleaning Properties (i) Initial (Early Stage)

A commercially available solder paste, Eco Solder M705-GRN360-K2-V (manufactured by Senju Metal Industry Co., Ltd.), was applied by printing on a JIS2 type comb-like board via a metal mask.

Subsequently, the comb-like board on which the commercial solder paste had been applied by printing was mounted on a hot plate with a cover that had been maintained at a temperature of 240° C., and the commercial solder paste was caused to reflow to obtain a test piece.

On the other hand, 200 g of the cleaning composition thus obtained was accommodated in a beaker having a capacity of 300 ml, and then the temperature of the cleaning composition was maintained at 50° C.

Subsequently, plural test pieces were accommodated in the beaker containing the cleaning composition, and in that state, while the cleaning composition was brought to a clouded state by rotating a magnetic stirrer therein, a cleaning test for the solder paste was carried out by varying the cleaning time.

That is, after each of the predetermined cleaning times, rotation of the magnetic stirrer was stopped, and several test pieces were removed from the cleaning composition and were dried for 10 minutes by using a circulation oven maintained at 100° C.

Finally, the dried test pieces were taken out from the circulation oven, and their surfaces were observed by using a stereoscopic microscope (magnification ratio: 40). Thus, the time period in which the solder paste could be completely cleaned (cleaning time) was measured, and at the same time, a cleaning properties evaluation was carried out based on the results according to the following criteria. The results thus obtained are presented in Table 2.

⊚ (Very Good): The cleaning time was less than 10 minutes.

○ (Good): The cleaning time was more than or equal to 10 minutes and less than 15 minutes.

Δ (Fair): The cleaning time was more than or equal to 15 minutes and less than 30 minutes.

x (Bad): The cleaning time was 30 minutes or more.

(ii) After Regeneration

On the other hand, 5000 g of the cleaning composition thus obtained was subjected to regeneration by distillation by using a reduced-pressure distillation regeneration apparatus that was produced at home by taking the gas-liquid equilibrium into consideration, under the conditions of a pressure reduction of −0.08 MPa and 100° C., until distillation stopped.

Thereafter, the cleaning properties of the cleaning composition obtained after the regeneration by distillation were evaluated by the same method as that used for the initial cleaning properties as described above. The results thus obtained are presented in Table 2.

(2)-6 Evaluation of Recovery Ratio

Furthermore, the recovery ratio of the liquid concentrate for cleaning composition obtainable when the evaluation for cleaning properties after regeneration was carried out, was determined, and the recovery ratio was evaluated as an evaluation for the regeneration efficiency of the cleaning composition according to the following criteria. The results thus obtained are presented in Table 2.

⊚ (Very Good): The recovery ratio value was greater than 90% by weight, and less than or equal to 100% by weight.

○ (Good): The recovery ratio value was greater than 70% by weight, and less than or equal to 90% by weight.

Δ (Fair): The recovery ratio value was greater than 50% by weight, and less than or equal to 70% by weight.

x (Bad): The recovery ratio value was less than or equal to 50% by weight.

(2)-7 Evaluation of Drying-Ability 200 g of the cleaning composition thus obtained was accommodated in a beaker having a capacity of 300 ml, and then the temperature of the cleaning composition was maintained at 50° C.

Subsequently, a glass epoxy substrate was accommodated in the beaker containing 200 g of the cleaning composition, and in that state, while the cleaning composition was brought to a clouded state by rotating a magnetic stirrer in the beaker, a cleaning test was carried out for 30 minutes.

Subsequently, rotation of the magnetic stirrer was stopped, and the glass epoxy substrate was removed from the cleaning composition and was dried for a predetermined time by using a circulation oven maintained at 100° C.

Thereafter, the dried glass epoxy substrate was taken out from the circulation oven, and the surface was observed by visual inspection. Thus, an evaluation of the drying-ability of the cleaning composition was carried out according to the following criteria. The results thus obtained are presented in Table 2.

⊚ (Very Good): The cleaning composition could be dried within 5 minutes.

○ (Good): The cleaning composition could be dried within 10 minutes.

Δ (Fair): After the cleaning composition was dried for 10 minutes, there was a slight amount of liquid residue.

x (Bad): After the cleaning composition was dried for 10 minutes, there was a large amount of liquid residue.

(2)-8 Evaluation of Metal Corrosion 200 g of the cleaning composition thus obtained was accommodated in a beaker having a capacity of 300 ml, and then the temperature of the cleaning composition was maintained at 50° C.

Subsequently, a copper plate and an aluminum plate were accommodated in the beaker containing 200 g of the cleaning composition, and in that state, while the cleaning composition was brought to a clouded state by rotating a magnetic stirrer inside the beaker, a corrosion test was carried out for a predetermined time.

Subsequently, rotation of the magnetic stirrer was stopped, and the copper plate and the aluminum plate were removed from the cleaning composition and were dried for a predetermined time by using a circulation oven maintained at 100° C.

Thereafter, the dried copper plate and the aluminum plate were taken out from a circulation oven, and the surfaces were observed by visual inspection. Thus, an evaluation of the metal corrosiveness of the cleaning composition was carried out according to the following criteria. The results thus obtained are presented in Table 2.

⊚ (Very Good): In the copper plate and the aluminum plate, no change in the external appearance was seen after immersion for 60 minutes.

○ (Good): In the copper plate and the aluminum plate, no change in the external appearance was seen after immersion for 30 minutes, but a change in the external appearance was observed after immersion for 60 minutes.

Δ (Fair): In the copper plate and the aluminum plate, no change in the external appearance was seen after immersion for 15 minutes, but a change in the external appearance was observed after immersion for 30 minutes.

x (Bad): In the copper plate and the aluminum plate, a change in the external appearance was observed after immersion for 15 minutes.

(2)-9 Evaluation of Foul Odor 200 g of the cleaning composition thus obtained was accommodated in a beaker having a capacity of 300 ml, and then the temperature of the cleaning composition was maintained at 50° C.

While the cleaning composition was brought to a clouded state by rotating a magnetic stirrer in the beaker, a sensory evaluation was carried out by a panel of 10 experts for the presence of any foul odor of the respective specimens. An evaluation of the foul odor of the cleaning composition was carried out based on a comprehensive evaluation made by the 10 experts according to the following criteria. The results thus obtained are presented in Table 2.

⊚ (Very Good): There was less odor, and there was no problem in terms of operation.

○ (Good): There was a slightly irritating odor, but there was no problem in terms of operation.

Δ (Fair): There was a fairly irritating odor, and there was a problem in terms of operation.

x (Bad): There was a strong odor, and there was a conspicuous problem in terms of operation.

Examples 2 to 15

In Examples 2 to 15, the effect of changing the type or the mixing proportion of the first organic solvent or the second organic solvent, was evaluated.

That is, liquid concentrates for cleaning composition and cleaning compositions were prepared in the same manner as in Example 1, except that the composition of the liquid concentrate for cleaning composition was changed as indicated in Table 1A, Table 1B, Table 3A and Table 3B, and evaluations thereof were conducted. The results thus obtained are presented in Table 2 and Table 4.

Meanwhile, the organic solvents in the liquid concentrates for cleaning composition described in Table 1A, Table 1B, Table 3A, Table 3B, Table 5A, Table 5B, Table 7A, Table 7B, Table 9A, Table 9B, Table 11A, Table 11B, Table 13A, Table 13B, Table 15A and Table 15B are indicated by the abbreviations described below.

Figure 9A:
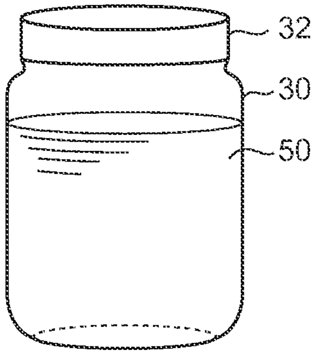
FIGS. 9A to 9D are diagrams illustrating the state of the cleaning composition in Example 2 and Comparative Example 6.
Figure 9B:
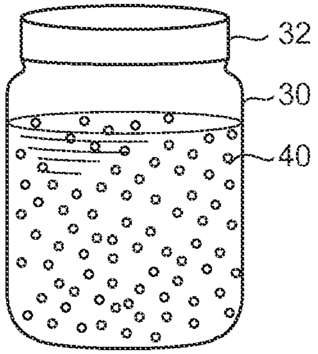
Figure 9C:
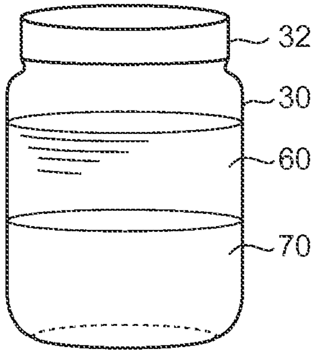

Furthermore, with regard to Example 2, diagrams as photographic substitutes of the liquid concentrate for cleaning composition prior to dilution with water, the cleaning composition at the time of the measurement of light transmittance, which had been stirred after dilution with water, and the cleaning composition after standing for 5 minutes after the stirring, are presented in FIG. 9A to FIG. 9C, respectively.

That is, in FIG. 9A, it is understood that the liquid concentrate for cleaning composition 50 of Example 2 that was accommodated in a glass vessel 30 is in a uniform state without phase separation.

Furthermore, in FIG. 9B, it is understood that the cleaning composition 40 of Example 2 that was accommodated in a glass vessel 30 was in a clouded state as a result of stirring.

Moreover, in FIG. 9C, it is understood that, as indicated in FIG. 9B, the cleaning composition 40 of Example 2 which was in a clouded state underwent phase separation into an aqueous phase 70 in the lower phase and an oil phase 60 in the upper phase, through the standing.

Figure 10A:
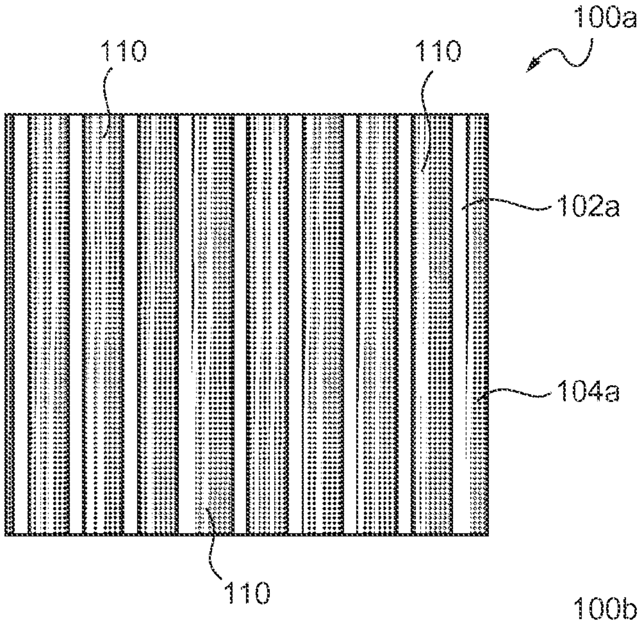
FIGS. 10A to 10C are diagrams illustrating the cleaning properties of the cleaning composition after regeneration in Example 3 and Comparative Example 3.
Figure 10B:
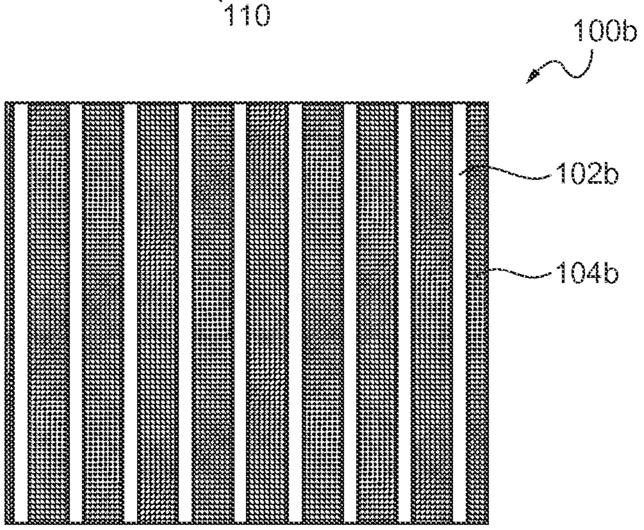

Furthermore, in Example 3, diagrams as photographic substitutes (magnification ratio: 40) of the test pieces obtained in Example 3 by cleaning the test pieces for 10 minutes with the cleaning composition before cleaning and after regeneration, are presented in FIG. 10A and FIG. 10B, respectively.

That is, in FIG. 10A, it is understood that a solder flux was adhering to the entire surface of a comb-like board 100*a* before cleaning, which was composed of a metal electrode 102*a* and an insulating substrate 104*a*, and due to the solder flux, the insulating substrate 104*a* in particular exhibited a gloss 110 over the entire area.

On the other hand, in FIG. 10B, the solder flux of a comb-like board 100*b* had been effectively cleaned by cleaning with the cleaning composition of Example 3, and a clean insulating substrate 104*b* without any gloss or unevenness could be recognized.

Furthermore, the reason for using such diagrams as photographic substitutes in FIG. 9 and FIG. 10 is that when photographs are directly used as diagrams, the image quality of the photographs shown in pamphlets and publications may be poor, and the images may become unclear.

(Hydrophobic Glycol Ether Compound)
- Propylene glycol monobutyl ether: BFG
- Dipropylene glycol dimethyl ether: DMFDG (Hydrophobic Hydrocarbon Compound)
- n-decane: decane
- 1-Decene: decene
- 2,2,4,6,6-Pentamethylheptane: isododecane
- Cymene: cymene
- Isoparaffin-based hydrocarbons having 9 to 12 carbon atoms: Isopar G (Hydrophobic Aromatic Compound)
- Anisole: anisole (Hydrophobic Ketone Compound)
- Methyl n-amyl ketone: MAK (Hydrophobic Alcohol Compound)
- n-hexanol: hexanol
- n-heptanol: heptanol (Hydrophilic Amine Compound)
- N,N-diethylisopropanolamine: 2FA
- N-ethylethanolamine: MEM
- N-methylethanolamine: MMA
- Benzylamine: benzylamine
- Monoisopropanolamine: MIPA (Organic Solvent Having Boiling Point Higher than 190° C.)
- Benzyl alcohol: benzyl alcohol
- N-methylpyrrolidone: NMP (Hydrophilic Glycol Ether Compound)
- Ethylene glycol monoisobutyl ether: iBG
- 3-Methoxy-3-methyl-1-butanol: MMB
- Diethylene glycol dimethyl ether: DMDG (Hydrophilic Alcohol Compound)
- Furfuryl alcohol: FFAL (Hydrophilic Nitrogen-Containing Compound)
- N-methylformamide: NMHA
- N,N-dimethylacetamide: DMAC (Hydrophobic Amine Compound)
- Dibutylamine: DBA
- 2-Ethylhexylamine: 2EHA
- N,N-dimethylbenzylamine: DMBZA (Glycol Ester Compound)
- Ethylene glycol monobutyl ether acetate: BGAc
- 3-Methoxy-3-methyl-1-butyl acetate: MMBAc
- Propylene glycol monomethyl ether acetate: PMA

TABLE 1A

| | | | | Example 1 | Example 2 | Example 3 | | Example 4 | | Example 5 | |
|---|---|---|---|---|---|---|---|---|---|---|---|
| Cleaning composition | Liquid concentrate for cleaning composition | First organic solvent*[1] | Compound name | Decene | BFG | BFG | MAK | BFG | MHK | Decene | Isododecane |
| | | | Boiling point (° C.) | 172 | 171 | 171 | 151 | 171 | 173 | 172 | 177 |
| | | | Flash point (° C.) | 46 | 62 | 62 | 41 | 62 | 55 | 46 | 48 |
| | | | SP value | 7.8 | 9.0 | 9.0 | 8.4 | 9.0 | 8.3 | 7.8 | 7.4 |
| | | | Solubility in water (wt %) | 1> | 6.4 | 6.4 | 1> | 6.4 | 1> | 1> | 1> |
| | | | Amount of incorporation (parts by weight) | 100.0 (29.0) | 100.0 (37.5) | 86.2 (25.0) | 13.8 (4.0) | 94.7 (18.0) | 5.3 (1.0) | 50.0 (15.0) | 50.0 (15.0) |
| | | Second organic solvent*[2] | Compound name | MEM | MEM | MEM | | 2FA | | MEM | |
| | | | Boiling point (° C.) | 161 | 161 | 161 | | 159 | | 161 | |
| | | | Flash point (° C.) | 71 | 71 | 71 | | 44 | | 71 | |
| | | | SP value | 11.4 | 11.4 | 11.4 | | 10.3 | | 11.4 | |
| | | | Solubility in water (wt %) | 100< | 100< | 100< | | 100< | | 100< | |
| | | | Amount of incorporation (parts by weight) | 3.3*[5] (1.0)*[6] | 6.3 (2.5) | 3.3 | (1.0) | 5.0 | (1.0) | 1.6 | (0.5) |
| | | Organic solvent having boiling point of 190° C. or higher | Compound name | — | — | — | | — | | — | |
| | | | Boiling point (° C.) | — | — | — | | — | | — | |
| | | | Flash point (° C.) | — | — | — | | — | | — | |
| | | | SP value | — | — | — | | — | | — | |
| | | | Solubility in water (wt %) | — | — | — | | — | | — | |
| | | | Amount of incorporation (parts by weight) | — — | — — | — | — | — | — | — | — |
| | | Third organic solvent*[3] | Compound name | — | — | — | | — | | — | |
| | | | Boiling point (° C.) | — | — | — | | — | | — | |
| | | | Flash point (° C.) | — | — | — | | — | | — | |
| | | | SP value | — | — | — | | — | | — | |
| | | | Solubility in water (wt %) | — | — | — | | — | | — | |
| | | | Amount of incorporation (parts by weight) | — — | — — | — | — | — | — | — | — |
| | | Fourth organic solvent*[4] | Compound name | — | — | — | | — | | — | |
| | | | Boiling point (° C.) | — | — | — | | — | | — | |
| | | | Flash point (° C.) | — | — | — | | — | | — | |
| | | | SP value | — | — | — | | — | | — | |
| | | | Solubility in water (wt %) | — | — | — | | — | | — | |
| | | | Amount of incorporation (parts by weight) | — — | — — | — | — | — | — | — | — |
| | | Glycol ester compound | Compound name | — | — | — | | — | | — | |
| | | | Boiling point (° C.) | — | — | — | | — | | — | |
| | | | Flash point (° C.) | — | — | — | | — | | — | |
| | | | SP value | — | — | — | | — | | — | |

TABLE 1A-continued

| | Example 1 | | Example 2 | | Example 3 | | Example 4 | | Example 5 | |
|---|---|---|---|---|---|---|---|---|---|---|
| Solubility in water (wt %) | — | | — | | — | | — | | — | |
| Amount of incorporation (parts by weight) | — | — | — | — | — | — | — | — | — | — |
| Water | 233.3*[7] | (70.0)*[8] | 150.0 | (60.0) | 233.3 | (70.0) | 400.0 | (80.0) | 227.9 | (69.5) |

*[1]The first organic solvent represents a hydrophobic glycol ether compound, a hydrophobic hydrocarbon compound, a hydrophobic aromatic compound, a hydrophobic ketone compound, or a hydrophobic alcohol compound.

*[2]The second organic solvent represents a hydrophilic amine compound.

*[3]The third organic solvent represents a hydrophilic glycol ether compound, a hydrophilic alcohol compound, a hydrophilic nitrogen-containing compound, or a hydrophilic sulfur-containing compound.

*[4]The fourth organic solvent represents a hydrophobic amine compound.

*[5]The amount of incorporation (parts by weight) of each component in the liquid concentrate for cleaning composition represents the value relative to 100 parts by weight of the first organic solvent.

*[6] The value indicated in parentheses in the column for the amount of incorporation of the various components in the liquid concentrate for cleaning composition represents the proportion by weight (wt %) of each component relative to the total amount of the cleaning composition.

*[7]The amount of incorporation (parts by weight) of water in the cleaning composition represents the value relative to 100 parts by weight of the liquid concentrate for cleaning composition.

*[8] The value indicated in parentheses in the column for the amount of incorporation of water in the cleaning composition represents the proportion by weight (wt %) of water relative to the total amount of the cleaning composition.

TABLE 1B

| | | | | Example 6 | | Example 7 | | Example 8 | | Example 9 | |
|---|---|---|---|---|---|---|---|---|---|---|---|
| Cleaning composition | Liquid concentrate for cleaning composition | First organic solvent | Compound name | Anisole | DMFDG | Decane | BFG | Anisole | Cymene | Decene | Cymene |
| | | | Boiling point (° C.) | 152 | 171 | 170 | 171 | 152 | 177 | 172 | 177 |
| | | | Flash point (° C.) | 52 | 65 | 53 | 62 | 52 | 47 | 46 | 47 |
| | | | SP value | 9.3 | 8.2 | 7.7 | 9.0 | 9.3 | 8.7 | 7.8 | 8.7 |
| | | | Solubility in water (wt %) | 1> | 37 | 1> | 6.4 | 1> | 1> | 1> | 1> |
| | | | Amount of incorporation (parts by weight) | 70.0 (14.0) | 30.0 (6.0) | 20.0 (6.0) | 80.0 (24.0) | 50.0 (14.5) | 50.0 (14.5) | 50.0 (14.5) | 50.0 (14.5) |
| | | Second organic solvent | Compound name | MEM | | MMA | | 2FA | | MIPA | |
| | | | Boiling point (° C.) | 161 | | 160 | | 159 | | 160 | |
| | | | Flash point (° C.) | 71 | | 74 | | 44 | | 74 | |
| | | | SP value | 11.4 | | 12 | | 10.3 | | 12.7 | |
| | | | Solubility in water (wt %) | 100< | | 100< | | 100< | | 100< | |
| | | | Amount of incorporation (parts by weight) | 2.4 | (0.5) | 6.3 | (2.0) | 3.3 | (1.0) | 3.3 | (1.0) |
| | | Organic solvent having boiling point of 190° C. or higher | Compound name | — | | — | | — | | — | |
| | | | Boiling point (° C.) | — | | — | | — | | — | |
| | | | Flash point (° C.) | — | | — | | — | | — | |
| | | | SP value | — | | — | | — | | — | |
| | | | Solubility in water (wt %) | — | | — | | — | | — | |
| | | | Amount of incorporation (parts by weight) | — | — | — | — | — | — | — | — |
| | | Third organic solvent | Compound name | — | | — | | — | | — | |
| | | | Boiling point (° C.) | — | | — | | — | | — | |
| | | | Flash point (° C.) | — | | — | | — | | — | |
| | | | SP value | — | | — | | — | | — | |
| | | | Solubility in water (wt %) | — | | — | | — | | — | |
| | | | Amount of incorporation (parts by weight) | — | | — | — | — | — | — | — |
| | | Fourth organic solvent | Compound name | — | | — | | — | | — | |
| | | | Boiling point (° C.) | — | | — | | — | | — | |
| | | | Flash point (° C.) | — | | — | | — | | — | |
| | | | SP value | — | | — | | — | | — | |
| | | | Solubility in water (wt %) | — | | — | | — | | — | |
| | | | Amount of incorporation (parts by weight) | — | — | — | — | — | — | — | — |
| | | Glycol ester compound | Compound name | — | | — | | — | | — | |
| | | | Boiling point (° C.) | — | | — | | — | | — | |
| | | | Flash point (° C.) | — | | — | | — | | — | |
| | | | SP value | — | | — | | — | | — | |
| | | | Solubility in water (wt %) | — | | — | | — | | — | |
| | | | Amount of incorporation (parts by weight) | — | — | — | — | — | — | — | — |
| | | Water | | 387.8 | (79.5) | 212.5 | (68.0) | 233.3 | (70.0) | 233.3 | (70.0) |

TABLE 2

| | | | Example 1 | Example 2 | Example 3 | Example 4 | Example 5 | Example 6 | Example 7 | Example 8 | Example 9 |
|---|---|---|---|---|---|---|---|---|---|---|---|
| Evaluation | Flux cleaning properties (@50° C.) | Early stage | ○ | ○ | ⊙ | ○ | ⊙ | ⊙ | ⊙ | ⊙ | ⊙ |
| | | After regeneration by distillation | ○ | ○ | ⊙ | ○ | ⊙ | ⊙ | ⊙ | ⊙ | ⊙ |
| | Dryability | | ⊙ | ⊙ | ⊙ | ⊙ | ⊙ | ⊙ | ⊙ | ⊙ | ⊙ |
| | Recovery ratio | | ⊙ | ⊙ | ⊙ | ⊙ | ⊙ | ⊙ | ⊙ | ⊙ | ⊙ |
| | Metal corrosiveness | | ⊙ | ○ | ⊙ | ⊙ | ⊙ | ⊙ | ○ | ⊙ | ⊙ |
| | Foul odor | | ○ | ⊙ | ○ | ⊙ | ⊙ | ○ | ⊙ | ○ | ○ |
| | Transmittance (%) | | 40 | 25 | 20 | 15 | 40 | 25 | 20 | 40 | 40 |
| | Electrical conductivity (µS/cm) | | 267 | 354 | 304 | 220 | 140 | 170 | 301 | 203 | 213 |
| | pH(−) | Oil phase | 8.2 | 10.7 | 10.2 | 9.0 | 8.0 | 8.2 | 10.1 | 9.2 | 8.3 |
| | | Aqueous phase | 11.0 | 12.0 | 11.2 | 9.8 | 10.5 | 10.3 | 12.0 | 10.0 | 10.2 |
| | Flash point (° C.) | Liquid concentrate for cleaning composition | 46 | 63 | 58 | 62 | 47 | 54 | 54 | 48 | 46 |
| | | Cleaning composition | 68 | 92 | 90 | 93 | 68 | 69 | 74 | 64 | 63 |

TABLE 3A

| | | | | Example 10 | | Example 11 | | Example 12 | |
|---|---|---|---|---|---|---|---|---|---|
| Cleaning com-position | Liquid concentrate for cleaning composition | First organic solvent | Compound name | Decane | | BFG | | Decane | BFG |
| | | | Boiling point (° C.) | 172 | | 171 | | 172 | 171 |
| | | | Flash point (° C.) | 46 | | 62 | | 46 | 62 |
| | | | SP value | 7.8 | | 9.0 | | 7.8 | 9.0 |
| | | | Solubility in water (wt %) | 1> | | 6.4 | | 1> | 6.4 |
| | | | Amount of incorporation (parts by weight) | 100.0 | (38.0) | 100.0 | (29.0) | 40.0 (12.0) | 60.0 (18.0) |
| | | Second organic solvent | Compound name | MEM | MMA | MEM | 2FA | MEM | Benzylamine |
| | | | Boiling point (° C.) | 161 | 160 | 161 | 159 | 161 | 185 |
| | | | Flash point (° C.) | 71 | 74 | 71 | 44 | 71 | 60 |
| | | | SP value | 11.4 | 12 | 11.4 | 10.3 | 11.4 | 9.9 |
| | | | Solubility in water (wt %) | 100< | 100< | 100< | 100< | 100< | 100< |
| | | | Amount of incorporation (parts by weight) | 2.6 (1.0) | 2.6 (1.0) | 1.7 (0.5) | 1.7 (0.5) | 3.2 (1.0) | 3.2 (1.0) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Fourth organic solvent | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Glycol ester com-pound | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |

TABLE 3A-continued

| | Example 10 | | Example 11 | | Example 12 | |
|---|---|---|---|---|---|---|
| Amount of incorporation (parts by weight) | — | — | — | — | — | — |
| Water | 150.0 | (60.0) | 233.3 | (70.0) | 212.5 | (68.0) |

TABLE 3B

| | | | | Example 13 | | | Example 14 | | | Example 15 | | |
|---|---|---|---|---|---|---|---|---|---|---|---|---|
| Cleaning composition | Liquid concentrate for cleaning composition | First organic solvent | Compound name | Decane | Hexanol | MAK | Decane | Heptanol | MAK | BFG | Heptanol | MHK |
| | | | Boiling point (° C.) | 172 | 157 | 151 | 172 | 175 | 151 | 171 | 175 | 173 |
| | | | Flash point (° C.) | 46 | 63 | 41 | 46 | 70 | 41 | 62 | 70 | 55 |
| | | | SP value | 7.8 | 10.1 | 8.4 | 7.8 | 9.8 | 8.4 | 9.0 | 9.8 | 8.3 |
| | | | Solubility in water (wt %) | 1> | 1> | 1> | 1> | 1> | 1> | 6.4 | 1> | 1> |
| | | | Amount of incorporation (parts by weight) | 66.4 (19.8) | 16.8 (5.0) | 16.8 (5.0) | 66.4 (19.8) | 16.8 (5.0) | 16.8 (5.0) | 66.4 (19.8) | 16.8 (5.0) | 16.8 (5.0) |
| | | Second organic solvent | Compound name | | MEM | | | MEM | | | MMA | |
| | | | Boiling point (° C.) | | 161 | | | 161 | | | 160 | |
| | | | Flash point (° C.) | | 71 | | | 71 | | | 74 | |
| | | | SP value | | 11.4 | | | 11.4 | | | 12 | |
| | | | Solubility in water (wt %) | | 100< | | | 100< | | | 100< | |
| | | | Amount of incorporation (parts by weight) | 0.7 | | (0.2) | 0.7 | | (0.2) | 0.7 | | (0.2) |
| | | Organic solvent having boiling point of 190° C. or higher | Compound name | | — | | | — | | | — | |
| | | | Boiling point (° C.) | | — | | | — | | | — | |
| | | | Flash point (° C.) | | — | | | — | | | — | |
| | | | SP value | | — | | | — | | | — | |
| | | | Solubility in water (wt %) | | — | | | — | | | — | |
| | | | Amount of incorporation (parts by weight) | — | | — | — | | — | — | | — |
| | | Third organic solvent | Compound name | | — | | | — | | | — | |
| | | | Boiling point (° C.) | | — | | | — | | | — | |
| | | | Flash point (° C.) | | — | | | — | | | — | |
| | | | SP value | | — | | | — | | | — | |
| | | | Solubility in water (wt %) | | — | | | — | | | — | |
| | | | Amount of incorporation (parts by weight) | — | | — | — | | — | — | | — |
| | | Fourth organic solvent | Compound name | | — | | | — | | | — | |
| | | | Boiling point (° C.) | | — | | | — | | | — | |
| | | | Flash point (° C.) | | — | | | — | | | — | |
| | | | SP value | | — | | | — | | | — | |
| | | | Solubility in water (wt %) | | — | | | — | | | — | |
| | | | Amount of incorporation (parts by weight) | — | | — | — | | — | — | | — |
| | | Glycol ester compound | Compound name | | — | | | — | | | — | |
| | | | Boiling point (° C.) | | — | | | — | | | — | |
| | | | Flash point (° C.) | | — | | | — | | | — | |
| | | | SP value | | — | | | — | | | — | |
| | | | Solubility in water (wt %) | | — | | | — | | | — | |
| | | | Amount of incorporation (parts by weight) | — | | — | — | | — | — | | — |
| | | Water | | 233.3 | | (70.0) | 233.3 | | (70.0) | 233.3 | | (70.0) |

TABLE 4

| | | | Example 10 | Example 11 | Example 12 | Example 13 | Example 14 | Example 15 |
|---|---|---|---|---|---|---|---|---|
| Evaluation | Flux cleaning properties (@50° C.) | Early stage | ○ | ○ | ⊙ | ⊙ | ⊙ | ⊙ |
| | | After regeneration by distillation | ○ | ○ | ⊙ | ⊙ | ⊙ | ⊙ |
| | Dryability | | ⊙ | ⊙ | ⊙ | ⊙ | ⊙ | ⊙ |
| | Recovery ratio | | ⊙ | ⊙ | ⊙ | ⊙ | ⊙ | ⊙ |
| | Metal corrosiveness | | ○ | ⊙ | ○ | ⊙ | ⊙ | ⊙ |
| | Foul odor | | ○ | ⊙ | ⊙ | ○ | ○ | ⊙ |
| | Transmittance (%) | | 35 | 25 | 25 | 30 | 30 | 25 |
| | Electrical conductivity (μS/cm) | | 323 | 252 | 398 | 153 | 150 | 142 |
| | pH(−) | Oil phase | 10.2 | 9.5 | 9.3 | 8.2 | 8.3 | 8.8 |
| | | Aqueous phase | 11.5 | 11.4 | 11.7 | 9.7 | 9.7 | 9.5 |
| | Flash point (° C.) | Liquid concentrate for cleaning composition | 46 | 63 | 50 | 48 | 49 | 65 |
| | | Cleaning composition | 68 | 94 | 70 | 63 | 64 | 90 |

Examples 16 to 27

In Examples 16 to 27, the effect of adding a third organic solvent to a combination of a first organic solvent(s) and a second organic solvent(s) was evaluated.

That is, liquid concentrates for cleaning composition and cleaning compositions were prepared in the same manner as in Example 1, except that the composition of the respective liquid concentrates for cleaning composition was changed as indicated in Table 5A, Table 5B, Table 7A and Table 7B, and the liquid concentrates and the cleaning compositions were evaluated. The results thus obtained are presented in Table 6 and Table 8.

TABLE 5A

| | | | | Example 16 | | Example 17 | | Example 18 | |
|---|---|---|---|---|---|---|---|---|---|
| Cleaning composition | Liquid concentrate for cleaning composition | First organic solvent | Compound name | BFG | | BFG | | MAK | |
| | | | Boiling point (° C.) | 171 | | 171 | | 151 | |
| | | | Flash point (° C.) | 62 | | 62 | | 41 | |
| | | | SP value | 9.0 | | 9.0 | | 8.4 | |
| | | | Solubility in water (wt %) | 6.4 | | 6.4 | | 1> | |
| | | | Amount of incorporation (parts by weight) | 100.0 | (18.9) | 100.0 | (9.4) | 100.0 | (15.0) |
| | | Second organic solvent | Compound name | MEM | | MEM | | MIPA | |
| | | | Boiling point (° C.) | 161 | | 161 | | 160 | |
| | | | Flash point (° C.) | 71 | | 71 | | 74 | |
| | | | SP value | 11.4 | | 11.4 | | 12.7 | |
| | | | Solubility in water wt %) | 100< | | 100< | | 100< | |
| | | | Amount of incorporation (parts by weight) | 10.0 | (2.1) | 4.1 | (0.4) | 6.3 | (1.0) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | iBG | | iBG | | MMB | |
| | | | Boiling point (° C.) | 161 | | 161 | | 174 | |
| | | | Flash point (° C.) | 57 | | 57 | | 68 | |
| | | | SP value | 9.1 | | 9.1 | | 10.5 | |
| | | | Solubility in water (wt %) | 100< | | 100< | | 100< | |
| | | | Amount of incorporation (parts by weight) | 32.3 | (9.0) | 35.6 | (5.2) | 37.5 | (9.0) |
| | | Fourth organic solvent | Compound name | — | | — | | — | |
| | | | Boiling point (° C.) | — | | — | | — | |
| | | | Flash point (° C.) | — | | — | | — | |
| | | | SP value | — | | — | | — | |

TABLE 5A-continued

| | | Example 16 | | Example 17 | | Example 18 | |
|---|---|---|---|---|---|---|---|
| | Solubility in water (wt %) | — | | — | | — | |
| | Amount of incorporation (parts by weight) | — | — | — | — | — | — |
| Glycol ester compound | Compound name | — | | — | | — | |
| | Boiling point (° C.) | — | | — | | — | |
| | Flash point (° C.) | — | | — | | — | |
| | SP value | — | | — | | — | |
| | Solubility in water (wt %) | — | | — | | — | |
| | Amount of incorporation (parts by weight) | — | — | — | — | — | — |
| Water | | 233.3 | (70.0) | 566.7 | (85.0) | 300.0 | (75.0) |

TABLE 5B

| | | | | Example 19 | | Example 20 | | Example 21 | |
|---|---|---|---|---|---|---|---|---|---|
| Cleaning composition | Liquid concentrate for cleaning composition | First organic solvent | Compound name | Isododecane | | Decane | | BFG | |
| | | | Boiling point (° C.) | 177 | | 172 | | 171 | |
| | | | Flash point (° C.) | 48 | | 46 | | 62 | |
| | | | SP value | 7.4 | | 7.8 | | 9.0 | |
| | | | Solubility in water (wt %) | 1> | | 1> | | 6.4 | |
| | | | Amount of incorporation (parts by weight) | 100.0 | (25.0) | 100.0 | (23.0) | 100.0 | (25.0) |
| | | Second organic solvent | Compound name | 2FA | | MEM | | MIPA | |
| | | | Boiling point (° C.) | 159 | | 161 | | 160 | |
| | | | Flash point (° C.) | 44 | | 71 | | 74 | |
| | | | SP value | 10.3 | | 11.4 | | 12.7 | |
| | | | Solubility in water wt %) | 100< | | 100< | | 100< | |
| | | | Amount of incorporation (parts by weight) | 2.0 | (0.5) | 8.0 | (2.0) | 2.0 | (0.5) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | DMDG | | iBG | | FFAL | |
| | | | Boiling point (° C.) | 162 | | 161 | | 171 | |
| | | | Flash point (° C.) | 56 | | 57 | | 65 | |
| | | | SP value | 8.7 | | 9.1 | | 11.9 | |
| | | | Solubility in water (wt %) | 100< | | 100< | | 100< | |
| | | | Amount of incorporation (parts by weight) | 15.3 | (4.5) | 17.9 | (5.0) | 27.5 | (9.5) |
| | | Fourth organic solvent | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Glycol ester compound | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |

TABLE 5B-continued

| | | Example 19 | | Example 20 | | Example 21 | |
|---|---|---|---|---|---|---|---|
| | Amount of incorporation (parts by weight) | — | — | — | — | — | — |
| | Water | 233.3 | (70.0) | 233.3 | (70.0) | 185.7 | (65.0) |

TABLE 6

| | | | Example 16 | Example 17 | Example 18 | Example 19 | Example 20 | Example 21 |
|---|---|---|---|---|---|---|---|---|
| Evaluation | Flux cleaning properties (@50° C.) | Early stage | ⊙ | ⊙ | ⊙ | ○ | ⊙ | ⊙ |
| | | After regeneration by distillation | ⊙ | ⊙ | ⊙ | ○ | ⊙ | ⊙ |
| | Dryability | | ⊙ | ⊙ | ⊙ | ⊙ | ⊙ | ⊙ |
| | Recovery ratio | | ⊙ | ⊙ | ⊙ | ⊙ | ⊙ | ⊙ |
| | Metal corrosiveness | | ○ | ⊙ | ⊙ | ⊙ | ○ | ⊙ |
| | Foul odor | | ⊙ | ⊙ | ○ | ⊙ | ⊙ | ⊙ |
| | Transmittance (%) | | 5 | 5 | 30 | 10 | 10 | 10 |
| | Electrical conductivity (μS/cm) | | 362 | 350 | 287 | 183 | 376 | 130 |
| | pH(−) | Oil phase | 10.7 | 10.2 | 9.6 | 9.2 | 10.8 | 9.7 |
| | | Aqueous phase | 11.6 | 11.2 | 10.8 | 10.2 | 11.5 | 10.3 |
| | Flash point (° C.) | Liquid concentrate for cleaning composition | 62 | 64 | 48 | 51 | 49 | 62 |
| | | Cleaning composition | 95 | 96 | 60 | 61 | 63 | 94 |

TABLE 7A

| | | | | Example 22 | | Example 23 | | Example 24 | |
|---|---|---|---|---|---|---|---|---|---|
| Cleaning composition | Liquid concentrate for cleaning composition | First organic solvent | Compound name | BFG | | Decene | BFG | Decene | Cymene |
| | | | Boiling point (° C.) | 171 | | 172 | 171 | 172 | 177 |
| | | | Flash point (° C.) | 62 | | 46 | 62 | 46 | 47 |
| | | | SP value | 9.0 | | 7.8 | 9.0 | 7.8 | 8.7 |
| | | | Solubility in water (wt %) | 6.4 | | 1> | 6.4 | 1> | 1> |
| | | | Amount of incorporation (parts by weight) | 100.0 (25.0) | | 75.0 (15.0) | 25.0 (5.0) | 50.0 (14.5) | 50.0 (14.5) |
| | | Second organic solvent | Compound name | MEM | | MEM | | MMA | |
| | | | Boiling point (° C.) | 161 | | 161 | | 160 | |
| | | | Flash point (° C.) | 71 | | 71 | | 74 | |
| | | | SP value | 11.4 | | 11.4 | | 12 | |
| | | | Solubility in water (wt %) | 100< | | 100< | | 100< | |
| | | | Amount of incorporation (parts by weight) | 3.8 | (1.0) | 1.0 | (0.2) | 1.7 | (0.5) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | iBG | NMHA | iBG | | DMDG | |
| | | | Boiling point (° C.) | 161 | 183 | 161 | | 162 | |
| | | | Flash point (° C.) | 57 | 98 | 57 | | 56 | |
| | | | SP value | 9.1 | 13 | 9.1 | | 8.7 | |
| | | | Solubility in water (wt %) | 100< | 100< | 100< | | 100< | |
| | | | Amount of incorporation (parts by weight) | 7.4 (2.0) | 7.4 (2.0) | 25.4 | (6.8) | 24.7 | (9.5) |
| | | Fourth organic solvent | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Glycol ester compound | Compound name | — | | — | | — | |
| | | | Boiling point (° C.) | — | | — | | — | |
| | | | Flash point (° C.) | — | | — | | — | |

TABLE 7A-continued

| | Example 22 | | Example 23 | | Example 24 | |
|---|---|---|---|---|---|---|
| SP value | — | | — | | — | |
| Solubility in water (wt %) | — | | — | | — | |
| Amount of incorporation (parts by weight) | — | — | — | — | — | — |
| Water | 233.3 | (70.0) | 270.4 | (73.0) | 156.4 | (61.0) |

TABLE 7B

| | | | | Example 25 | | Example 26 | | Example 27 | |
|---|---|---|---|---|---|---|---|---|---|
| Cleaning composition | Liquid concentrate for cleaning composition | First organic solvent | Compound name | BFG | | Decene | | Decene | MAK |
| | | | Boiling point (° C.) | 171 | | 172 | | 172 | 151 |
| | | | Flash point (° C.) | 62 | | 46 | | 46 | 41 |
| | | | SP value | 9.0 | | 7.8 | | 7.8 | 8.4 |
| | | | Solubility in water (wt %) | 6.4 | | 1> | | 1> | 1> |
| | | | Amount of incorporation (parts by weight) | 100.0 | (19.0) | 100.0 | (25.0) | 83.1 (24.5) | 16.9 (5.0) |
| | | Second organic solvent | Compound name | MEM | Benzylamine | MEM | 2FA | MEM | |
| | | | Boiling point (° C.) | 161 | 185 | 161 | 159 | 161 | |
| | | | Flash point (° C.) | 71 | 60 | 71 | 44 | 71 | |
| | | | SP value | 11.4 | 9.9 | 11.4 | 10.3 | 11.4 | |
| | | | Solubility in water (wt %) | 100< | 100< | 100< | 100< | 100< | |
| | | | Amount of incorporation (parts by weight) | 1.0 (0.2) | 1.0 (0.2) | 1.6 (0.4) | 1.2 (0.3) | 1.7 | (0.5) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | iBG | | MMB | | DMAC | |
| | | | Boiling point (° C.) | 161 | | 174 | | 166 | |
| | | | Flash point (° C.) | 57 | | 68 | | 70 | |
| | | | SP value | 9.1 | | 10.5 | | 11.1 | |
| | | | Solubility in water (wt %) | 100< | | 100< | | 100< | |
| | | | Amount of incorporation (parts by weight) | 22.8 | (5.6) | 36.4 | (14.3) | 14.5 | (5.0) |
| | | Fourth organic solvent | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Glycol ester compound | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Water | | 300.0 | (75.0) | 150.0 | (60.0) | 185.7 | (65.0) |

TABLE 8

| | | | Example 22 | Example 23 | Example 24 | Example 25 | Example 26 | Example 27 |
|---|---|---|---|---|---|---|---|---|
| Evaluation | Flux cleaning properties (@50° C.) | Early stage | ⊙ | ⊙ | ⊙ | ⊙ | ○ | ⊙ |
| | | After regeneration by distillation | ⊙ | ⊙ | ⊙ | ⊙ | ○ | ⊙ |
| | Dryability | | ⊙ | ⊙ | ⊙ | ⊙ | ⊙ | ⊙ |
| | Recovery ratio | | ⊙ | ⊙ | ⊙ | ⊙ | ⊙ | ⊙ |
| | Metal corrosiveness | | ⊙ | ⊙ | ⊙ | ⊙ | ⊙ | ⊙ |
| | Foul odor | | ⊙ | ⊙ | ○ | ⊙ | ⊙ | ○ |
| | Transmittance (%) | | 10 | 5 | 10 | 5 | 10 | 15 |
| | Electrical conductivity (μS/cm) | | 215 | 123 | 167 | 157 | 162 | 243 |
| | pH(—) | Oil phase | 9.4 | 8.3 | 8.3 | 10.1 | 10.2 | 8.3 |
| | | Aqueous phase | 10.7 | 8.9 | 9.8 | 10.5 | 10.7 | 9.5 |

TABLE 8-continued

| | | Example 22 | Example 23 | Example 24 | Example 25 | Example 26 | Example 27 |
|---|---|---|---|---|---|---|---|
| Flash point (° C.) | Liquid concentrate for cleaning composition | 65 | 51 | 46 | 64 | 48 | 52 |
| | Cleaning composition | 98 | 70 | 64 | 94 | 66 | 65 |

Examples 28 to 33

In Examples 28 to 33, the effect of adding a fourth organic solvent to a combination of a first organic solvent(s) and a second organic solvent(s) was evaluated.

That is, liquid concentrates for cleaning composition and cleaning compositions were prepared in the same manner as in Example 1, except that the composition of the respective liquid concentrates for cleaning composition and the respective cleaning compositions was changed as indicated in Table 9A and Table 9B, and the liquid concentrates and the cleaning compositions were evaluated. The results thus obtained are presented in Table 10.

TABLE 9A

| | | | | Example 28 | Example 29 | Example 30 |
|---|---|---|---|---|---|---|
| Cleaning composition | Liquid concentrate for cleaning composition | First organic solvent | Compound name | BFG | BFG | Decene |
| | | | Boiling point (° C.) | 171 | 171 | 172 |
| | | | Flash point (° C.) | 62 | 62 | 46 |
| | | | SP value | 9.0 | 9.0 | 7.8 |
| | | | Solubility in water (wt %) | 6.4 | 6.4 | 1> |
| | | | Amount of incorporation (parts by weight) | 100.0 (18.0) | 100.0 (25.0) | 100.0 (35.0) |
| | | Second organic solvent | Compound name | MEM | MMA | MEM |
| | | | Boiling point (° C.) | 161 | 160 | 161 |
| | | | Flash point (° C.) | 71 | 74 | 71 |
| | | | SP value | 11.4 | 12 | 11.4 |
| | | | Solubility in water (wt %) | 100< | 100< | 100< |
| | | | Amount of incorporation (parts by weight) | 2.7 (0.5) | 2.0 (0.5) | 4.1 (1.5) |
| | | Organic solvent having boiling point of 90° C. or higher | Compound name | — | — | — |
| | | | Boiling point (° C.) | — | — | — |
| | | | Flash point (° C.) | — | — | — |
| | | | SP value | — | — | — |
| | | | Solubility in water (wt %) | — | — | — |
| | | | Amount of incorporation (parts by weight) | — — | — — | — — |
| | | Third organic solvent | Compound name | — | — | — |
| | | | Boiling point (° C.) | — | — | — |
| | | | Flash point (° C.) | — | — | — |
| | | | SP value | — | — | — |
| | | | Solubility in water (wt %) | — | — | — |
| | | | Amount of incorporation (parts by weight) | — — | — — | — — |
| | | Fourth organic solvent | Compound name | DMBZA | DBA | 2EHA |
| | | | Boiling point (° C.) | 181 | 160 | 169 |
| | | | Flash point (° C.) | 60 | 43 | 60 |
| | | | SP value | 9.8 | 7.8 | 8.4 |
| | | | Solubility in water (wt %) | 1.2 | 1> | 1> |
| | | | Amount of incorporation (parts by weight) | 1.6 (0.3) | 2.0 (0.5) | 2.8 (1.0) |
| | | Glycol ester compound | Compound name | — | — | — |
| | | | Boiling point (° C.) | — | — | — |
| | | | Flash point (° C.) | — | — | — |
| | | | SP value | — | — | — |
| | | | Solubility in water (wt %) | — | — | — |
| | | | Amount of incorporation (parts by weight) | — — | — — | — — |
| | | Water | | 431.9 (81.2) | 284.6 (74.0) | 166.7 (62.5) |

TABLE 9B

| | | | | Example 31 | | Example 32 | | Example 33 | |
|---|---|---|---|---|---|---|---|---|---|
| Cleaning composition | Liquid concentrate for cleaning composition | First organic solvent | Compound name | BFG | MAK | Decene | MAK | BFG | |
| | | | Boiling point (° C.) | 171 | 151 | 172 | 151 | 171 | |
| | | | Flash point (° C.) | 62 | 41 | 46 | 41 | 62 | |
| | | | SP value | 9.0 | 8.4 | 7.8 | 8.4 | 9.0 | |
| | | | Solubility in water (wt %) | 6.4 | 1> | 1> | 1> | 6.4 | |
| | | | Amount of incorporation (parts by weight) | 89.8 (26.5) | 10.2 (3.0) | 77.3 (17.0) | 22.7 (5.0) | 100.0 | (18.0) |
| | | Second organic solvent | Compound name | MEM | | MMA | | MIPA | |
| | | | Boiling point (° C.) | 161 | | 160 | | 160 | |
| | | | Flash point (° C.) | 71 | | 74 | | 74 | |
| | | | SP value | 11.4 | | 12 | | 12.7 | |
| | | | Solubility in water (wt %) | 100< | | 100< | | 100< | |
| | | Amount of incorporation (parts by weight) | | 1.0 | (0.3) | 8.3 | (2.0) | 5.3 | (1.0) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | — | | — | | iBG | |
| | | | Boiling point (° C.) | — | | — | | 161 | |
| | | | Flash point (° C.) | — | | — | | 57 | |
| | | | SP value | — | | — | | 9.1 | |
| | | | Solubility in water (wt %) | — | | — | | 100< | |
| | | | Amount of incorporation (parts by weight) | — | — | — | — | 35.7 | (10.0) |
| | | Fourth organic solvent | Compound name | DBA | | 2EHA | | DMBZA | |
| | | | Boiling point (° C.) | 160 | | 169 | | 181 | |
| | | | Flash point (° C.) | 43 | | 60 | | 60 | |
| | | | SP value | 7.8 | | 8.4 | | 9.8 | |
| | | | Solubility in water (wt %) | 1> | | 1> | | 1.2 | |
| | | | Amount of incorporation (parts by weight) | 0.7 | (0.2) | 4.3 | (1.0) | 5.3 | (1.0) |
| | | Glycol ester compound | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Water | | 233.3 | (70.0) | 300.0 | (75.0) | 233.3 | (70.0) |

TABLE 10

| | | | Example 28 | Example 29 | Example 30 | Example 31 | Example 32 | Example 33 |
|---|---|---|---|---|---|---|---|---|
| Evaluation | Flux cleaning properties (@50° C.) | Early stage | ○ | ○ | ⊙ | ⊙ | ⊙ | ⊙ |
| | | After regeneration by distillation | ○ | ○ | ⊙ | ⊙ | ⊙ | ⊙ |
| | Dryability | | ⊙ | ⊙ | ⊙ | ⊙ | ⊙ | ⊙ |
| | Recovery ratio | | ⊙ | ⊙ | ⊙ | ⊙ | ⊙ | ⊙ |
| | Metal corrosiveness | | ⊙ | ⊙ | ○ | ⊙ | ○ | ○ |
| | Foul odor | | ⊙ | ⊙ | ○ | ⊙ | ○ | ⊙ |
| | Transmittance (%) | | 5 | 25 | 30 | 15 | 35 | 5 |
| | Electrical conductivity (μS/cm) | | 253 | 303 | 630 | 176 | 683 | 210 |
| | pH (—) | Oil phase | 9.4 | 9.4 | 10.6 | 9.2 | 10.7 | 10.3 |
| | | Aqueous phase | 10.5 | 10.1 | 11.8 | 9.8 | 11.5 | 11.2 |

TABLE 10-continued

| | | Example 28 | Example 29 | Example 30 | Example 31 | Example 32 | Example 33 |
|---|---|---|---|---|---|---|---|
| Flash point (° C.) | Liquid concentrate for cleaning composition | 62 | 62 | 48 | 62 | 46 | 62 |
| | Cleaning composition | 96 | 94 | 64 | 94 | 62 | 98 |

Examples 34 to 38

In Examples 34 to 38, the effect of adding an organic solvent having a boiling point of 190° C. or higher at a proportion that was less than or equal to a predetermined value, to a combination of a first organic solvent(s) to a fourth organic solvent(s), was evaluated.

That is, liquid concentrates for cleaning composition and cleaning compositions were prepared in the same manner as in Example 1, except that the composition of the respective liquid concentrates for cleaning composition was changed as indicated in Table 11A and Table 11B, and the liquid concentrates and the cleaning compositions were evaluated. The results thus obtained are presented in Table 12.

TABLE 11A

| | | | | Example 34 | | Example 35 | | Example 36 | |
|---|---|---|---|---|---|---|---|---|---|
| Cleaning composition | Liquid concentrate for cleaning composition | First organic solvent | Compound name | BFG | | Decene | | BFG | |
| | | | Boiling point (° C.) | 171 | | 172 | | 171 | |
| | | | Flash point (° C.) | 62 | | 46 | | 62 | |
| | | | SP value | 9.0 | | 7.8 | | 9.0 | |
| | | | Solubility in water (wt %) | 6.4 | | 1> | | 6.4 | |
| | | | Amount of incorporation (parts by weight) | 100.0 | (33.0) | 100.0 | (19.0) | 100.0 | (25.5) |
| | | Second organic solvent | Compound name | MEM | | MIPA | | MEM | |
| | | | Boiling point (° C.) | 161 | | 160 | | 161 | |
| | | | Flash point (° C.) | 71 | | 74 | | 71 | |
| | | | SP value | 11.4 | | 12.7 | | 11.4 | |
| | | | Solubility in water (wt %) | 100< | | 100< | | 100< | |
| | | | Amount of incorporation (parts by weight) | 2.9 | (1.0) | 9.5 | (2.0) | 1.9 | (0.5) |
| | | Organic solvent having boiling point of 190° C. or higher | Compound name | Benzyl alcohol | | NMP | | Benzyl alcohol | |
| | | | Boiling point (° C.) | 205 | | 204 | | 205 | |
| | | | Flash point (° C.) | 93 | | 91 | | 93 | |
| | | | SP value | 11.6 | | 11.2 | | 11.6 | |
| | | | Solubility in water (wt %) | 4 | | 100< | | 4 | |
| | | | Amount of incorporation (parts by weight) | 10.8 | (4.0) | 11.6 | (2.5) | 13.6 | (4.0) |
| | | Third organic solvent | Compound name | — | | — | | iBG | |
| | | | Boiling point (° C.) | — | | — | | 161 | |
| | | | Flash point (° C.) | — | | — | | 57 | |
| | | | SP value | — | | — | | 9.1 | |
| | | | Solubility in water (wt %) | — | | — | | 100< | |
| | | | Amount of incorporation (parts by weight) | — | — | — | — | 16.4 | (5.0) |
| | | Fourth organic solvent | Compound name | — | | — | | 2EHA | |
| | | | Boiling point (° C.) | — | | — | | 169 | |
| | | | Flash point (° C.) | — | | — | | 60 | |
| | | | SP value | — | | — | | 8.4 | |
| | | | Solubility in water (wt %) | — | | — | | 1> | |
| | | | Amount of incorporation (parts by weight) | — | — | — | — | 3.8 | (1.0) |
| | | Glycol ester compound | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |

TABLE 11A-continued

| | | Example 34 | | Example 35 | | Example 36 | |
|---|---|---|---|---|---|---|---|
| | Amount of incorporation (parts by weight) | — | — | — | — | — | — |
| Water | | 163.2 | (62.0) | 325.5 | (76.5) | 177.8 | (64.0) |

TABLE 11B

| | | | | Example 37 | | Example 38 | |
|---|---|---|---|---|---|---|---|
| Cleaning composition | Liquid concentrate for cleaning composition | First organic solvent | Compound name | Decene | | Isopar G | Decane |
| | | | Boiling point (° C.) | 172 | | 167-176 | 170 |
| | | | Flash point (° C.) | 46 | | 44 | 46 |
| | | | SP value | 7.8 | | 7.3 | 7.8 |
| | | | Solubility in water (wt %) | 1> | | 1> | 1> |
| | | | Amount of incorporation (parts by weight) | 100.0 | (24.8) | 75.0 (18.0) | 25.0 (6.0) |
| | | Second organic solvent | Compound name | MEM | | MEM | |
| | | | Boiling point (° C.) | 161 | | 161 | |
| | | | Flash point (° C.) | 71 | | 71 | |
| | | | SP value | 11.4 | | 11.4 | |
| | | | Solubility in water (wt %) | 100< | | 100< | |
| | | | Amount of incorporation (parts by weight) | 0.8 | (0.2) | 4.0 | (1.0) |
| | | Organic solvent having boiling point of 190° C. or higher | Compound name | NMP | | Benzyl alcohol | |
| | | | Boiling point (° C.) | 204 | | 205 | |
| | | | Flash point (° C.) | 91 | | 93 | |
| | | | SP value | 11.2 | | 11.6 | |
| | | | Solubility in water (wt %) | 100< | | 4 | |
| | | | Amount of incorporation (parts by weight) | 7.5 | (2.0) | 11.1 | (3.0) |
| | | Third organic solvent | Compound name | MMB | | MMB | |
| | | | Boiling point (° C.) | 174 | | 174 | |
| | | | Flash point (° C.) | 68 | | 68 | |
| | | | SP value | 10.5 | | 10.5 | |
| | | | Solubility in water (wt %) | 100< | | 100< | |
| | | | Amount of incorporation (parts by weight) | 7.5 | (2.0) | 20.0 | (6.0) |
| | | Fourth organic solvent | Compound name | DBA | | — | |
| | | | Boiling point (° C.) | 160 | | — | |
| | | | Flash point (° C.) | 43 | | — | |
| | | | SP value | 7.8 | | — | |
| | | | Solubility in water (wt %) | 1> | | — | |
| | | | Amount of incorporation (parts by weight) | 3.9 | (1.0) | — | — |
| | | Glycol ester compound | Compound name | — | | — | |
| | | | Boiling point (° C.) | — | | — | |
| | | | Flash point (° C.) | — | | — | |
| | | | SP value | — | | — | |
| | | | Solubility in water (wt %) | — | | — | |
| | | | Amount of incorporation (parts by weight) | — | — | — | — |
| | | Water | | 233.3 | (70.0) | 227.6 | (66.0) |

TABLE 12

| | | | Example 34 | Example 35 | Example 36 | Example 37 | Example 38 |
|---|---|---|---|---|---|---|---|
| Evaluation | Flux cleaning properties (@50° C.) | Early stage | ⊙ | ⊙ | ⊙ | ⊙ | ⊙ |
| | | After regeneration by distillation | ⊙ | ⊙ | ⊙ | ⊙ | ⊙ |

TABLE 12-continued

| | | Example 34 | Example 35 | Example 36 | Example 37 | Example 38 |
|---|---|---|---|---|---|---|
| Dryability | | ○ | ○ | ○ | ○ | ○ |
| Recovery ratio | | ⊙ | ⊙ | ⊙ | ⊙ | ⊙ |
| Metal corrosiveness | | ⊙ | ⊙ | ⊙ | ⊙ | ⊙ |
| Foul odor | | ⊙ | ○ | ⊙ | ○ | ⊙ |
| Transmittance (%) | | 10 | 25 | 5 | 20 | 5 |
| Electrical conductivity (μS/cm) | | 372 | 392 | 215 | 342 | 393 |
| pH (—) | Oil phase | 10.4 | 9.6 | 10.6 | 9.8 | 10.3 |
| | Aqueous phase | 10.5 | 11.2 | 10.7 | 10.2 | 10.4 |
| Flash point (° C.) | Liquid concentrate for cleaning composition | 63 | 49 | 66 | 48 | 46 |
| | Cleaning composition | 94 | 68 | 96 | 67 | 68 |

Comparative Examples 1 to 13

In Comparative Examples 1 to 13, the effects in the case of adjusting the amount of addition of the second organic solvent to a value out of the predetermined range, in the case of adjusting the amount of addition of water to a value out of the predetermined range, in the case of adding the organic solvent having a boiling point of higher than 190° C. in excess, and in the case of adding an ester compound, were evaluated.

That is, liquid concentrates for cleaning composition and cleaning compositions were prepared in the same manner as in Example 1, except that the composition of the respective liquid concentrates for cleaning composition was changed as indicated in Table 13A, Table 13B, Table 15A and Table 15B, and the liquid concentrates and the cleaning compositions were evaluated. The results thus obtained are presented in Table 14 and Table 16.

Figure 10C:
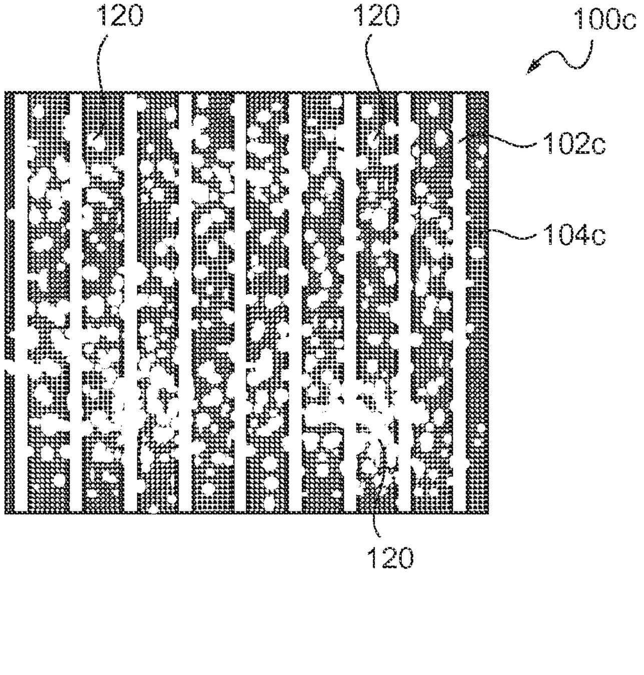

Meanwhile, in Comparative Example 3, a photograph (magnification ratio: 40) of a test piece obtained after cleaning for 10 minutes with the cleaning composition after regeneration, is presented in FIG. 10C.

That is, in FIG. 10C, it is understood that even though the test piece was cleaned with the cleaning composition of Comparative Example 3, solder fluxes that could not be sufficiently cleaned were remaining on the comb-like board 100*c*, and particularly on the insulating substrate 104*c*, a conspicuous amount of white flux residue 120 was remaining.

Figure 9D:
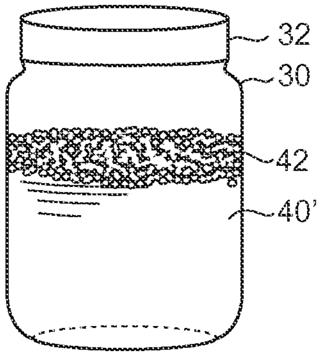

Furthermore, in Comparative Example 6, the cleaning composition used at the time of measurement of the light transmittance, which was obtained by diluting with water and then stirring, is presented in FIG. 9D.

That is, in FIG. 9D, it is understood that the cleaning composition 40' of Comparative Example 6 that was accommodated in a glass vessel 30 was not brought to a clouded state even under stirring, and remained in a uniform state. Meanwhile, foam 42 that was generated by stirring could be recognized at the top surface of the cleaning composition 40'.

TABLE 13A

| | | | | Comparative Example 1 | Comparative Example 2 | Comparative Example 3 | | Comparative Example 4 |
|---|---|---|---|---|---|---|---|---|
| Cleaning composition | Liquid concentrate for cleaning composition | First organic solvent | Compound name | Decene | BFG | Decene | Isododecane | BFG |
| | | | Boiling point (° C.) | 172 | 171 | 172 | 177 | 171 |
| | | | Flash point (° C.) | 46 | 62 | 46 | 48 | 62 |
| | | | SP value | 7.8 | 9.0 | 7.8 | 7.4 | 9.0 |
| | | | Solubility in water (wt %) | 1> | 6.4 | 1> | 1> | 6.4 |
| | | | Amount of incorporation (parts by weight) | 100.0 (25.0) | 100.0 (10.0) | 50.0 (15.0) | 50.0 (15.0) | 100.0 (19.0) |
| | | Second organic solvent | Compound name | MEM | MEM | — | | — |
| | | | Boiling point (° C.) | 161 | 161 | — | | — |
| | | | Flash point (° C.) | 71 | 71 | — | | — |
| | | | SP value | 11.4 | 11.4 | — | | — |
| | | | Solubility in water (wt %) | 100< | 100< | — | | — |
| | | | Amount of incorporation (parts by weight) | 37.5 (15.0) | 60.0 (15.0) | — | — | — — |
| | | Organic solvent having boiling point of 190° C. or higher | Compound name | — | — | — | | — |
| | | | Boiling point (° C.) | — | — | — | | — |
| | | | Flash point (° C.) | — | — | — | | — |
| | | | SP value | — | — | — | | — |
| | | | Solubility in water (wt %) | — | — | — | | — |
| | | | Amount of incorporation (parts by weight) | — — | — — | — | — | — — |
| | | Third organic solvent | Compound name | — | — | — | | iBG |
| | | | Boiling point (° C.) | — | — | — | | 161 |
| | | | Flash point (° C.) | — | — | — | | 57 |
| | | | SP value | — | — | — | | 9.1 |
| | | | Solubility in water (wt %) | — | — | — | | 100< |
| | | | Amount of incorporation (parts by weight) | — — | — — | — | — | 32.1 (9.0) |
| | | Fourth organic | Compound name | — | — | — | | — |
| | | | Boiling point (° C.) | — | — | — | | — |

TABLE 13A-continued

| | | Comparative Example 1 | | Comparative Example 2 | | Comparative Example 3 | | Comparative Example 4 | |
|---|---|---|---|---|---|---|---|---|---|
| solvent | Flash point (° C.) | — | | — | | — | | — | |
| | SP value | — | | — | | — | | — | |
| | Solubility in water (wt %) | — | | — | | — | | — | |
| | Amount of incorporation (parts by weight) | — | — | — | — | — | — | — | — |
| Glycol ester compound | Compound name | — | | — | | — | | — | |
| | Boiling point (° C.) | — | | — | | — | | — | |
| | Flash point (° C.) | — | | — | | — | | — | |
| | SP value | — | | — | | — | | — | |
| | Solubility in water (wt %) | — | | — | | — | | — | |
| | Amount of incorporation (parts by weight) | — | — | — | — | — | — | — | — |
| Water | | 150.0 | (60.0) | 300.0 | (75.0) | 233.3 | (70.0) | 257.1 | (72.0) |

TABLE 13B

| | | | | Comparative Example 5 | | Comparative Example 6 | | Comparative Example 7 | |
|---|---|---|---|---|---|---|---|---|---|
| Cleaning composition | Liquid concentrate for cleaning composition | First organic solvent | Compound name | Anisole | | BFG | | BFG | |
| | | | Boiling point (° C.) | 152 | | 171 | | 171 | |
| | | | Flash point (° C.) | 52 | | 62 | | 62 | |
| | | | SP value | 9.3 | | 9.0 | | 9.0 | |
| | | | Solubility in water (wt %) | 1> | | 6.4 | | 6.4 | |
| | | | Amount of incorporation (parts by weight) | 100.0 | (28.0) | 100.0 | (3.0) | 100.00 | (39.97) |
| | | Second organic solvent | Compound name | — | | MEM | | MEM | |
| | | | Boiling point (° C.) | — | | 161 | | 161 | |
| | | | Flash point (° C.) | — | | 71 | | 71 | |
| | | | SP value | — | | 11.4 | | 11.4 | |
| | | | Solubility in water (wt %) | — | | 100< | | 100< | |
| | | | Amount of incorporation (parts by weight) | — | — | 33.3 | (1.5) | 0.08 | (0.03) |
| | | Organic solvent having boiling point of 190° C. or higher | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Third organic solvent | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |
| | | | Amount of incorporation (parts by weight) | — | — | — | — | — | — |
| | | Fourth organic solvent | Compound name | DMBZA | | — | | — | |
| | | | Boiling point (° C.) | 181 | | — | | — | |
| | | | Flash point (° C.) | 60 | | — | | — | |
| | | | SP value | 9.8 | | — | | — | |
| | | | Solubility in water (wt %) | 1.2 | | — | | — | |
| | | | Amount of incorporation (parts by weight) | 6.7 | (2.0) | — | — | — | — |
| | | Glycol ester compound | Compound name | — | | — | | — | |
| | | | Boiling point (° C.) | — | | — | | — | |
| | | | Flash point (° C.) | — | | — | | — | |
| | | | SP value | — | | — | | — | |
| | | | Solubility in water (wt %) | — | | — | | — | |

TABLE 13B-continued

| | Comparative Example 5 | | Comparative Example 6 | | Comparative Example 7 | |
|---|---|---|---|---|---|---|
| Amount of incorporation (parts by weight) | — | — | — | — | — | — |
| Water | 233.3 | (70.0) | 2122.2 | (95.5) | 150.0 | (60.0) |

TABLE 14

| | | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|
| Evaluation | Flux cleaning properties (@50° C.) | Early stage | ○ | ⊙ | X | X | Δ | X | X |
| | | After regeneration by distillation | ○ | ⊙ | X | X | Δ | X | X |
| | Dryability | | ○ | ○ | ⊙ | ⊙ | ⊙ | Δ | ⊙ |
| | Recovery ratio | | ⊙ | ⊙ | ⊙ | ⊙ | ⊙ | ⊙ | ⊙ |
| | Metal corrosiveness | | X | X | ⊙ | ⊙ | ⊙ | X | ⊙ |
| | Foul odor | | ○ | ○ | ○ | ⊙ | Δ | ⊙ | ⊙ |
| | Transmittance (%) | | 25 | 15 | 45 | 10 | 15 | 100 | 25 |
| | Electrical conductivity (μS/cm) | | 667 | 689 | 3.1 | 6.2 | 6.3 | 856 | 10.2 |
| | pH(—) | Oil phase | 9.5 | 10.7 | 8.1 | 8.2 | 10.0 | 11.5 | 8.5 |
| | | Aqueous phase | 12.7 | 12.8 | 8.5 | 8.3 | 9.8 | | 9.0 |
| | Flash point (° C.) | Liquid concentrate for cleaning composition | 50 | 64 | 46 | 64 | 52 | 64 | 62 |
| | | Cleaning composition | 66 | 98 | 62 | 94 | 53 | None | 90 |

TABLE 15A

| | | | | Comparative Example 8 | | Comparative Example 9 | | Comparative Example 10 | |
|---|---|---|---|---|---|---|---|---|---|
| Cleaning composition | Liquid concentrate for cleaning composition | First organic solvent | Compound name | BFG | | BFG | | Decene | |
| | | | Boiling point (° C.) | 171 | | 171 | | 172 | |
| | | | Flash point (° C.) | 62 | | 62 | | 46 | |
| | | | SP value | 9.0 | | 9.0 | | 7.8 | |
| | | | Solubility in water (wt %) | 6.4 | | 6.4 | | 1> | |
| | | | Amount of incorporation (parts by weight) | 100.0 | (24.0) | 100.0 | (4.0) | 100.0 | (14.0) |
| | | Second organic solvent | Compound name | MEM | | MEM | | MIPA | |
| | | | Boiling point (° C.) | 161 | | 161 | | 160 | |
| | | | Flash point (° C.) | 71 | | 71 | | 74 | |
| | | | SP value | 11.4 | | 11.4 | | 12.7 | |
| | | | Solubility in water (wt %) | 100< | | 100< | | 100< | |
| | | | Amount of incorporation (parts by weight) | 17.2 | (5.0) | 20.0 | (1.0) | 6.7 | (1.0) |
| | | Organic solvent having boiling point of 190° C. or higher | Compound name | — | | — | | Benzyl alcohol | |
| | | | Boiling point (° C.) | — | | — | | 205 | |
| | | | Flash point (° C.) | — | | — | | 93 | |
| | | | SP value | — | | — | | 11.6 | |
| | | | Solubility in water (wt %) | — | | — | | 4 | |
| | | | Amount of incorporation (parts by weight) | — | — | — | — | 51.7 | (15.0) |
| | | Third organic solvent | Compound name | MMB | | iBG | MMB | — | |
| | | | Boiling point (° C.) | 174 | | 161 | 174 | — | |
| | | | Flash point (° C.) | 68 | | 57 | 68 | — | |
| | | | SP value | 10.5 | | 9.1 | 10.5 | — | |
| | | | Solubility in water (wt %) | 100< | | 100< | 100< | — | |

TABLE 15A-continued

| | | Comparative Example 8 | | Comparative Example 9 | | | | Comparative Example 10 | |
|---|---|---|---|---|---|---|---|---|---|
| | Amount of incorporation (parts by weight) | 65.2 | (45.0) | 78.9 | (15.0) | 75.0 | (12.0) | — | — |
| Fourth organic solvent | Compound name | — | | — | | | | — | |
| | Boiling point (° C.) | — | | — | | | | — | |
| | Flash point (° C.) | — | | — | | | | — | |
| | SP value | — | | — | | | | — | |
| | Solubility in water (wt %) | — | | — | | | | — | |
| | Amount of incorporation (parts by weight) | — | — | — | | — | | — | — |
| Glycol ester compound | Compound name | — | | — | | | | — | |
| | Boiling point (° C.) | — | | — | | | | — | |
| | Flash point (° C.) | — | | — | | | | — | |
| | SP value | — | | — | | | | — | |
| | Solubility in water (wt %) | — | | — | | | | — | |
| | Amount of incorporation (parts by weight) | — | — | — | | — | | — | — |
| Water | | 35.1 | (26.0) | 212.5 | | | (68.0) | 233.3 | (70.0) |

TABLE 15B

| | | | | Comparative Example 11 | | | | Comparative Example 12 | | Comparative Example 13 | |
|---|---|---|---|---|---|---|---|---|---|---|---|
| Cleaning composition | Liquid concentrate for cleaning composition | First organic solvent | Compound name | Decane | | | | Decane | | Anisole | |
| | | | Boiling point (° C.) | 170 | | | | 172 | | 152 | |
| | | | Flash point (° C.) | 53 | | | | 46 | | 52 | |
| | | | SP value | 7.7 | | | | 7.8 | | 9.3 | |
| | | | Solubility in water (wt %) | 1> | | | | 1> | | 1> | |
| | | | Amount of incorporation (parts by weight) | 100.0 | | | (9.0) | 100.0 | (14.0) | 100.0 | (12.0) |
| | | Second organic solvent | Compound name | MIPA | | Benzylamine | | Benzylamine | | Benzylamine | |
| | | | Boiling point (° C.) | 160 | | 185 | | 185 | | 185 | |
| | | | Flash point (° C.) | 74 | | 60 | | 60 | | 60 | |
| | | | SP value | 12.7 | | 9.9 | | 9.9 | | 9.9 | |
| | | | Solubility in water (wt %) | 100< | | 100< | | 100< | | 100< | |
| | | | Amount of incorporation (parts by weight) | 52.6 | (10.0) | 10.0 | (1.0) | 6.7 | (1.0) | 36.8 | (7.0) |
| | | Organic solvent having boiling point of 190° C. or higher | Compound name | — | | | | Benzyl alcohol | | — | |
| | | | Boiling point (° C.) | — | | | | 205 | | — | |
| | | | Flash point (° C.) | — | | | | 93 | | — | |
| | | | SP value | — | | | | 11.6 | | — | |
| | | | Solubility in water (wt %) | — | | | | 4 | | — | |
| | | | Amount of incorporation (parts by weight) | — | | — | | 26.3 | (5.0) | — | — |
| | | Third organic solvent | Compound name | — | | | | — | — | — | |
| | | | Boiling point (° C.) | — | | | | — | — | — | |
| | | | Flash point (° C.) | — | | | | — | — | — | |
| | | | SP value | — | | | | — | — | — | |
| | | | Solubility in water (wt %) | — | | | | — | — | — | |
| | | | Amount of incorporation (parts by weight) | — | | — | | — | — | — | — |
| | | Fourth organic solvent | Compound name | — | | | | — | | — | |
| | | | Boiling point (° C.) | — | | | | — | | — | |
| | | | Flash point (° C.) | — | | | | — | | — | |
| | | | SP value | — | | | | — | | — | |
| | | | Solubility in water (wt %) | — | | | | — | | — | |
| | | | Amount of incorporation (parts by weight) | — | | — | | — | — | — | — |

TABLE 15B-continued

| | | Comparative Example 11 | | Comparative Example 12 | | Comparative Example 13 | |
|---|---|---|---|---|---|---|---|
| Glycol ester compound | Compound name | BGAc | | MMBAc | | PMA | |
| | Boiling point (° C.) | 192 | | 188 | | 146 | |
| | Flash point (° C.) | 88 | | 73 | | 47 | |
| | SP value | 9 | | 9.2 | | 9.2 | |
| | Solubility in water (wt %) | 1.1 | | 6.8 | | 19.8 | |
| | Amount of incorporation (parts by weight) | 52.6 | (10.0) | 58.8 | (20.0) | 45.5 | (10.0) |
| Water | | 233.3 | (70.0) | 150.0 | (60.0) | 244.8 | (71.0) |

TABLE 16

| | | | Comparative Example 8 | Comparative Example 9 | Comparative Example 10 | Comparative Example 11 | Comparative Example 12 | Comparative Example 13 |
|---|---|---|---|---|---|---|---|---|
| Evaluation | Flux cleaning properties (@50° C.) | Early stage | Δ | Δ | ⊙ | ○ | ○ | Δ |
| | | After regeneration by distillation | Δ | Δ | ○ | X | X | X |
| | Dryability | | ⊙ | ⊙ | X | ○ | Δ | ⊙ |
| | Recovery ratio | | ⊙ | ⊙ | X | Δ | X | ⊙ |
| | Metal corrosiveness | | Δ | X | ⊙ | X | ⊙ | X |
| | Foul odor | | ⊙ | ⊙ | ○ | ○ | ○ | Δ |
| | Transmittance (%) | | 100 | 100 | 45 | 20 | 15 | 35 |
| | Electrical conductivity (μS/cm) | | 6.57 | 2710 | 311 | 209 | 244 | 232 |
| | pH(—) | Oil phase | 12.3 | 11.5 | 9.8 | 10.7 | 9.0 | 10.9 |
| | | Aqueous phase | | | 10.8 | 12.5 | 9.4 | 12.4 |
| | Flash point (° C.) | Liquid concentrate for cleaning composition | 66 | 62 | 52 | 54 | 50 | 49 |
| | | Cleaning composition | None | None | 64 | 58 | 60 | 57 |

When the liquid concentrate for cleaning composition of the present invention is used, since a predetermined hydrophobic organic solvent and a predetermined hydrophilic organic solvent are used, and also, the mixing proportions of these organic solvents are adjusted to predetermined ranges, a cleaning composition in a clouded state, which could exhibit excellent safety and excellent cleaning by adding afterward a predetermined amount of water, and also has excellent regeneration efficiency, may be obtained.

Therefore, when the liquid concentrate for cleaning composition of the present invention, the cleaning composition obtainable by using the liquid concentrate for cleaning composition, and the cleaning method are used, excellent environmental safety could be obtained, and excellent cleaning properties could be exhibited, in the cleaning of flux residues or solder pastes. Furthermore, excellent regeneration efficiency could also be obtained.

Therefore, a soldering process could be carried out with high accuracy at low cost on electronic components where high reliability is required, or on the substrates and the like of high frequency circuit boards, and a cleaning composition after cleaning could be subjected to a regeneration treatment simply and easily with high economic efficiency, while taking into consideration of environmental problems.

What is claimed is:

1. A cleaning method comprising:

a step for mixing 100 parts by weight of a liquid concentrate for cleaning composition with 50 parts to 1900 parts by weight of water, to form the cleaning composition; and a step for cleaning a solder flux adhering to an object to be cleaned in a clouded state, by applying said cleaning composition to said object, wherein the object to be cleaned is an object having a solder flux adhering thereto, the solder flux being cleaned from the object;

wherein the liquid concentrate for cleaning composition includes, as organic solvents, at least a first organic solvent and a second organic solvent;

the first organic solvent is at least one compound selected from the group consisting of a hydrophobic glycol ether compound, a hydrophobic hydrocarbon compound, a hydrophobic aromatic compound, a hydrophobic ketone compound and a hydrophobic alcohol compound, which has a boiling point in the range of 140° C. to 190° C. and a solubility in water (measurement temperature: 20° C.) of 50% by weight or less, the first organic solvent being included in the cleaning composition in an amount of greater than 0, and up to and including 38% by weight, relative to the total amount of the cleaning composition;

the second organic solvent is a hydrophilic amine compound having a boiling point in the range of 140° C. to 190° C. and a solubility in water (measurement temperature: 20° C.) of greater than 50% by weight;

the amount of incorporation of the second organic solvent is adjusted to a value in the range of 0.3 parts to 30 parts by weight relative to 100 parts by weight of the first organic solvent;

in case further comprising a third organic solvent, the third organic solvent is at least one compound selected from the group consisting of a hydrophilic glycol ether compound, a hydrophilic alcohol compound, a hydrophilic nitrogen-containing compound and a hydrophilic sulfur-containing compound, which has a boiling point in the range of 140° C. to 190° C. and a solubility in water (measurement temperature: 20° C.) of 50% by weight or greater, the amount of incorporation of the third organic solvent is adjusted to a value in the range of 150 parts by weight or less relative to 100 parts by weight of the first organic solvent;

in case further comprising a surfactant, the surfactant is a nonionic surfactant, wherein an amount of incorporation of the nonionic surfactant is adjusted to a value in the range of 0% to 3% by weight (provided that 0% by weight is excluded) relative to the total amount of the liquid concentrate for cleaning composition; and the amount of incorporation of an organic solvent which has a boiling point of higher than 190° C. is adjusted to a value of 0 parts by weight, or a value in the range of 0 parts to 15 parts by weight (provided that 0 parts by weight is excluded), relative to 100 parts by weight of the first organic solvent, wherein the cleaning composition is in a clouded state.

2. The cleaning method according to claim 1, wherein the first organic solvent forms an emulsion in the water, and the first and second organic solvents, in an waterless state, form a solution.

3. The cleaning method according to claim 1, which consists of the first and second organic solvents and optionally the third organic solvent and the nonionic surfactant.

4. The cleaning method according to claim 1, wherein said object to which the solder flux adheres is an electronic component.

5. The cleaning method according to claim 1, wherein the first organic solvent of the cleaning composition is selected to be an organic solvent having an SP value in the range of 6.5 to 12, and also, the second organic solvent is selected to be an organic solvent having an SP value in the range of 8 to 15.

6. The cleaning method according to claim 1, wherein the first organic solvent of the cleaning composition is at least one compound selected from the group consisting of propylene glycol monobutyl ether, dipropylene glycol dimethyl ether, n-hexanol, n-heptanol, n-nonane, n-decane, 1-decene, isononane, isodecane, isoundecane, isododecane, cymene and anisole.

7. The cleaning method according to claim 6, wherein the second organic solvent is at least one compound selected from the group consisting of N,N-diethylisopropanolamine, N-ethylethanolamine, N-methylethanolamine, benzylamine, and monoisopropanolamine.

8. The cleaning method according to claim 1, wherein the second organic solvent of the cleaning composition is at least one compound selected from the group consisting of N,N-diethylisopropanolamine, N-ethylethanolamine, N-methylethanolamine, benzylamine, and monoisopropanolamine.

9. The cleaning method according to claim 1, wherein the cleaning composition further comprises, as a fourth organic solvent, a hydrophobic amine compound having a boiling point in the range of 140° C. to 190° C. and a solubility in water (measurement temperature: 20° C.) of 50% by weight or less, the amount of incorporation of the fourth organic solvent being adjusted to a value in the range of 0.3 parts to 30 parts by weight relative to 100 parts by weight of the first organic solvent.

10. The cleaning method according to claim 9, which consists of the first, second and fourth organic solvents and optionally the third organic solvent and the nonionic surfactant.

* * * * *